US012392839B2

United States Patent
Narita et al.

(10) Patent No.: US 12,392,839 B2
(45) Date of Patent: Aug. 19, 2025

(54) DIRECT CURRENT SPECTROSCOPY (DCS) TECHNIQUE FOR IN-OPERANDO CELL DIAGNOSTICS AND ANISOTROPIC RESISTANCE MONITORING

(71) Applicant: California Institute of Technology, Pasadena, CA (US)

(72) Inventors: Kai Narita, Pasadena, CA (US); Julia R. Greer, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 697 days.

(21) Appl. No.: 17/718,705

(22) Filed: Apr. 12, 2022

(65) Prior Publication Data

US 2022/0336933 A1    Oct. 20, 2022

Related U.S. Application Data

(60) Provisional application No. 63/173,863, filed on Apr. 12, 2021.

(51) Int. Cl.
   *G01R 31/392* (2019.01)
   *G01R 31/385* (2019.01)
(52) U.S. Cl.
   CPC ......... *G01R 31/392* (2019.01); *G01R 31/385* (2019.01)
(58) Field of Classification Search
   CPC ... G01R 31/392; G01R 31/385; G01R 31/389
   See application file for complete search history.

(56) References Cited

U.S. PATENT DOCUMENTS 5,680,031 A * 10/1997 Pavlovic ............. H02J 7/00711
                                                  320/152
8,346,495 B2    1/2013 Gering
(Continued)

FOREIGN PATENT DOCUMENTS

WO    WO 2015014764    2/2015
WO    WO 2021023346    2/2021

OTHER PUBLICATIONS

Eddahech et al., Behavior and state-of-health monitoring of Li-ion batteries using impedance spectroscopy and recurrent neural networks, 2012, Electrical Power and Energy Systems, 42, 487-494 (Year: 2012).*

(Continued)

*Primary Examiner* — Catherine T. Rastovski
*Assistant Examiner* — Emma Alexander
(74) *Attorney, Agent, or Firm* — Leydig, Voit & Mayer, Ltd.

(57) ABSTRACT

A method of interrogating an electrochemical cell includes: applying a positive direct current to the electrochemical cell for a first time period, wherein the positive direct current is characterized by a first magnitude; applying a negative direct current to the electrochemical cell for a second time period, wherein the negative direct current is characterized by a second magnitude; wherein the first and second time periods have a combined duration of less than 2 seconds; wherein the second magnitude is equal to or within 50% of the first magnitude; recording cell resistance data of the electrochemical cell during each time period; and analyzing the cell resistance data to determine at least one of: (i) state of charge of the electrochemical cell; (ii) state of health of the electrochemical cell; and (iii) the resistance anisotropy of the cell.

25 Claims, 36 Drawing Sheets

(56) References Cited

U.S. PATENT DOCUMENTS

| | | |
|---|---|---|
| 8,521,497 B2 | 8/2013 | Gering |
| 9,419,313 B2 | 8/2016 | Paik et al. |
| 9,599,584 B2 | 3/2017 | Yazami et al. |
| 10,036,779 B2 | 7/2018 | Sazhin et al. |
| 10,910,858 B2 | 2/2021 | Taylor et al. |
| 2019/0165432 A1* | 5/2019 | Park .................... G01R 31/387 |

OTHER PUBLICATIONS

Ovejas et al., State of charge dependency of the overvoltage generated in Li-ion cells, 2019, Journal of Power Sources, 418, 176-185 (Year: 2019).*

Barai et al., A study of the influence of measurement timescale on internal resistance characterization methodologies for lithium-ion cells, 2018, Scientific Reports, 1-13 (Year: 2018).*

Pinson et al., Theory of SEI Formation in Rechargeable Batteries: Capacity Fade, Accelerated Aging and Lifetime Prediction, , 2013 , Journal of the Electrochemical Society 160, A243-A250 (Year: 2013).*

Horowitz, Paul; Hill, Winfield, The Art of Electronics (3rd edition),2015 Cambridge University Press, ISBN 0521809266. p. 40-55. (Year: 2015).*

Alvin et al. (Apr. 2020) "Revealing the intercalation mechanisms of lithium, sodium, and potassium in hard carbon," Adv. Energy Mater. 10, 2000283, doi:10.1002/aenm.202000283.

An et al. (2016) "The state of understanding of the lithium-ion-battery graphite solid electrolyte interphase (SEI) and its relationship to formation cycling," Carbon 105, 52-76, doi:10.1016/j.carbon.2016.04.008.

Andre et al. (2013) "Comparative study of a structured neural network and an extended Kalman filter for state of health determination of lithium-ion batteries in hybrid electric vehicles," Engineering Applications of Artificial Intelligence 26, 951-961.

Atalay et al. (Oct. 2020) "Theory of battery ageing in a lithium-ion battery: Capacity fade, nonlinear ageing and lifetime prediction," J. Power Sources, 478, 229026, doi:10.1016/j.jpowsour.2020.229026.

Attia et al. (2019) "Electrochemical kinetics of SEI growth on Carbon Black: Part I. Experiments," J. Electrochem. Soc. 166, E97-E106, doi:10.1149/2.0231904jes.

Attia et al. (May 2020) "Revisiting the $t^{0.5}$ dependence of SEI growth," J. Electrochem. Soc., 167, 090535, doi:10.1149/1945-7111/ab8ce4.

Bao et al. (Jul. 2021) "Lithium-Ion Battery Real-Time Diagnosis with Direct Current Impedance Spectroscopy," Energies 14(15), 4396. https://doi.org/10.3390/en14154396.

Barai et al. (2018) "A study of the influence of measurement timescale on internal resistance characterisation methodologies for lithium-ion cells," Scientific Reports 8:21, doi: 10.1038/s41598-017-18424-5.

Bayya et al. (2017) "Battery State Estimation using AC analysis," Energy Procedia 117, 739-744.

Bonora et al. (1996) "Electrochemical impedance spectroscopy as a tool for investigating underpaint corrosion," Electrochim. Acta 41, 1073-1082, doi:10.1016/0013-4686(95)00440-8.

Chattopadhyay et al. (2012) "In situ X-ray study of the solid electrolyte interphase (SEI) formation on graphene as a model Li-ion battery anode," Chem. Mater. 24, 3038-3043, doi:10.1021/cm301584r.

Christopherson (2015) "Battery Test Manual for Electric Vehicles," Idaho National Laboratory, Revision 3, document No. INL/EXT-15-34184.

Colclasure et al. (2011) "Modeling detailed chemistry and transport for solid-electrolyte-interface (SEI) films in Li-ion batteries," Electrochim. Acta 58, 33-43, doi:10.1016/j.electacta.2011.08.067.

Coleman et al. (2007) "State-of-Charge Determination From EMF Voltage Estimation: Using Impedance, Terminal Voltage, and Current for Lead-Acid and Lithium-Ion Batteries," IEEE Trans. Ind. Electron. 54 (2007) 2550-2557.

Dahn et al. (1995) "Mechanisms for lithium insertion in carbonaceous materials," Science 270, 590-593, doi:10.1126/science.270.5236.590.

Danner et al. (2016) "Thick electrodes for Li-ion batteries: A model based analysis," J. Power Sources 334, 191-201, doi:10.1016/j.jpowsour.2016.09.143.

Das et al. (2019) "Electrochemical kinetics of SEI growth on carbon black: Part II. Modeling," J. Electrochem. Soc. 166, E107-E118, doi:10.1149/2.0241904jes.

Du Pasquier et al. (1998) Erratum: "Differential scanning calorimetry study of the reactivity of carbon anodes in plastic Li-ion batteries" J. Electrochem. Soc. 145, 1413-1413, doi:10.1149/1.1838474.

Eddahech et al. (2012) "Behavior and state-of-health monitoring of Li-ion batteries using impedance spectroscopy and recurrent neural networks," International Journal of Electrical Power and Energy Systems, 42, 487-494.

Edge et al. (Mar. 2021) "Lithium ion battery degradation: What you need to know," Phys. Chem. Chem. Phys. 23, 8200, doi:10.1039/D1CP00359C.

Fly et al. (Jun. 2020) "Rate dependency of incremental capacity analysis (dQ/dV) as a diagnostic tool for lithium-ion batteries," J. Energy Storage 29, 101329, doi:10.1016/j.est.2020.101329.

Guan et al. (2015) "Simulation and experiment on solid electrolyte interphase (SEI) morphology evolution and lithium-ion diffusion," J. Electrochem. Soc. 162, A1798-A1808, doi:10.1149/2.0521509jes.

Guo et al. (2011) "Cyclability study of silicon-carbon composite anodes for lithium-ion batteries using electrochemical impedance spectroscopy," Electrochim. Acta 56, 3981-3987, doi:10.1016/j.electacta.2011.02.014.

Guo et al. (May 2020) "Li2O Solid electrolyte interphase: Probing transport properties at the chemical potential of lithium," Chem. Mater. 32, 5525-5533, doi:10.1021/acs.chemmater.0c00333.

Harris et al. (2018) "Molecular probes reveal chemical selectivity of the solid-electrolyte interphase," J. Phys. Chem. C, 122, 20632-20641, doi:10.1021/acs.jpcc.8b06564.

Hasa et al. (Aug. 2020) "Electrochemical reactivity and passivation of silicon thin-film electrodes in organic carbonate electrolytes," ACS Appl. Mater. Interfaces 12, 40879-40890, doi:10.1021/acsami.0c09384.

He et al. (Jan. 2020) "The intrinsic behavior of lithium fluoride in solid electrolyte interphases on lithium," Proc. Natl. Acad. Sci. 117, 73-79, doi:10.1073/pnas.1911017116.

Heiskanen et al. (2019) "Generation and evolution of the solid electrolyte interphase of lithium-ion batteries," Joule 3, 2322-2333, doi:10.1016/j.joule.2019.08.018.

Horstmann et al. (2019) "Review on multi-scale models of solid-electrolyte interphase formation," Curr. Opin. Electrochem. 13, 61-69, doi:10.1016/j.coelec.2018.10.013.

Huang et al. (2019) "Evolution of the solid-electrolyte interphase on carbonaceous anodes visualized by atomic-resolution cryogenic electron microscopy," Nano Lett. 19, 5140-5148, doi:10.1021/acs.nanolett.9b01515.

Jüttner (1990) "Electrochemical impedance spectroscopy (EIS) of corrosion processes on inhomogeneous surfaces," Electrochim. Acta 35, 1501-1508, doi:10.1016/0013-4686(90)80004-8.

Keil et al. (2017) "Calendar aging of NCA lithium-ion batteries investigated by differential voltage analysis and Coulomb tracking," J. Electrochem. Soc. 164, A6066-A6074, doi:10.1149/2.0091701jes.

Kindermann et al. (2017) "A SEI modeling approach distinguishing between capacity and power fade," J. Electrochem. Soc. 164, E287-E294, doi:10.1149/2.0321712jes.

Lin et al. (2013) "Estimation of Battery State of Health Using Probabilistic Neural Network," IEEE Transactions on Industrial Informatics, 9:2, 679-685.

Liu et al. (2014) "A thermal-electrochemical model that gives spatial-dependent growth of solid electrolyte interphase in a Li-ion battery," J. Power Sources 268, 482-490, doi:10.1016/j.jpowsour.2014.06.050.

Lu et al. (2014) "Chemistry, impedance, and morphology evolution in solid electrolyte interphase films during formation in lithium ion batteries," J. Phys. Chem. C 118, 896-903, doi:10.1021/jp4111019.

(56) References Cited

OTHER PUBLICATIONS

Naoi et al. (2005) "Disordered carbon anode for lithium-ion battery: I. An interfacial reversible redox action and anomalous topology changes," J. Electrochem. Soc. 152, A1047, doi:10.1149/1.1896531.
Narita (May 2021) "3D Architected Battery Electrodes for Exploring Battery Kinetics from Nano to Millimeter," Thesis (Ph.D.), California Institute of Technology, 154 pp. doi:10.7907/dr3b-2d27.
Narita et al. (Feb. 2021) "3D Architected Carbon Electrodes for Energy Storage," Adv. Energy Mater. 11, 2002637, doi:10.1002/aenm.202002637.
Ng et al. (2009) "Enhanced coulomb counting method for estimating state-of-charge and state-of-health of lithium-ion batteries," Applied Energy 86, 1506-1511.
Ng et al. (2009) "An enhanced coulomb counting method for estimating state-of-charge and state-of-health of lead-acid batteries," INTELEC 2009—31st International Telecommunications Energy Conference, pp. 1-5.
Noël et al. (2016) "Hybrid organic/inorganic materials depth profiling using low energy cesium ions," J. Am. Soc. Mass Spectrom. 27, 908-916, doi:10.1007/s13361-016-1353-9.
Ogihara et al. (2006) "Disordered carbon negative electrode for electrochemical capacitors and high-rate batteries," Electrochim. Acta 52, 1713-1720, doi:10.1016/j.electacta.2006.01.082.
Oswald et al. (2017) "Peak position differences observed during XPS sputter depth profiling of the SEI on lithiated and delithiated carbon-based anode material for Li-ion batteries," Appl. Surf. Sci. 401, 408-413, doi:10.1016/j.apsusc.2016.12.223.
Ovejas et al. (2019) "State of charge dependency of the overvoltage generated in commercial Li-ion cells," J. Power Sources 418, 176-185, doi:10.1016/j.jpowsour.2019.02.046.
Peled et al. (2017) "Review—SEI: Past, present and future," J. Electrochem. Soc. 164, A1703-A1719, doi:10.1149/2.1441707jes.
Piller et al. (2001) "Methods for state-of-charge determination and their applications," J. Power Sources 96, 113-120.
Pinson et al. (2013) "Theory of SEI formation in rechargeable batteries: Capacity fade, accelerated aging and lifetime prediction," J. Electrochem. Soc. 160, A243. doi:10.1149/2.044302jes.
Placke et al. (2015) "Assessment of surface heterogeneity: A route to correlate and quantify the 1st cycle irreversible capacity caused by SEI formation to the various surfaces of graphite anodes for lithium ion cells," Zeitschrift fur Phys. Chemie 229, 1451-1469, doi:10.1515/zpch-2015-0584.
Remmlinger et al. (2011) "State-of-health monitoring of lithium-ion batteries in electric vehicles by on-board internal resistance estimation," J. Power Sources 196, 5357-5363.
Safari et al. (2011) "Aging of a commercial graphite/LiFePO4 cell," J. Electrochem. Soc. 158, A1123, doi:10.1149/1.3614529.
Saleh et al. (2012) "Diagnosing Degradation within PEM Fuel Cell Catalyst Layers Using Electrochemical Impedance Spectroscopy," J. Electrochem. Soc. 159, B546-B553, doi:10.1149/2.098205jes.
Shi et al. (2012) "Direct calculation of Li-ion transport in the solid electrolyte interphase," J. Am. Chem. Soc. 134, 15476-15487, doi:10.1021/ja305366r.
Single et al. (2017) "Revealing SEI morphology: In-depth analysis of a modeling approach," J. Electrochem. Soc. 164, E3132-E3145, doi:10.1149/2.0121711jes.
Smith et al. (2011) "A high precision coulometry study of the SEI growth in Li/graphite cells," J. Electrochem. Soc. 158, A447, doi:10.1149/1.3557892.
Snihir et al. (2006) "Battery open-circuit voltage estimation by a method of statistical analysis," J. Power Sources 159:2, 1484-1487.
Spotnitz et al. (2003) "Abuse behavior of high-power, lithium-ion cells," J. Power Sources 113, 81-100, doi:10.1016/S0378-7753(02)00488-3.
Steinhauer et al. (2017) "Investigation of the solid electrolyte interphase formation at graphite anodes in lithium-ion batteries with electrochemical impedance spectroscopy," Electrochim. Acta 228, 652-658, doi:10.1016/j.electacta.2017.01.128.
Tan et al. (Mar. 2021) "A Growing appreciation for the role of LiF in the solid electrolyte interphase," Adv. Energy Mater. 11, 2100046. doi:10.1002/aenm.202100046.
Van Heuveln (1994) "Analysis of Nonexponential Transient Response Due to a Constant-Phase Element," J. Electrochem. Soc. 141, 3423-3428, doi:10.1149/1.2059348.
Vetter et al. (2005) "Ageing mechanisms in lithium-ion batteries," J. Power Sources 147, 269-281, doi:10.1016/j.jpowsour.2005.01.006.
Waldmann et al. (2014) "Temperature dependent ageing mechanisms in Lithium-ion batteries—A Post-Mortem study," J. Power Sources 262, 129-135, doi:10.1016/j.jpowsour.2014.03.112.
Wang et al. (2018) "Review on modeling of the anode solid electrolyte interphase (SEI) for lithium-ion batteries," npj Comput. Mater. 4, Article No. 15. doi:10.1038/s41524-018-0064-0.
Xu et al. (2015) "Electrode side reactions, capacity loss and mechanical degradation in lithium-ion batteries," J. Electrochem. Soc. 162, A2026-A2035, doi:10.1149/2.0291510jes.
Zhang et al. (2001) "Understanding solid electrolyte interface film formation on graphite electrodes," Electrochem. Solid-State Lett. 4, 206-209, doi:10.1149/1.1414946.
Zhang et al. (2014) "A study of gadolinia-doped ceria electrolyte by electrochemical impedance spectroscopy," J. Power Sources 247, 947-960, doi:10.1016/j.jpowsour.2013.09.036.

\* cited by examiner

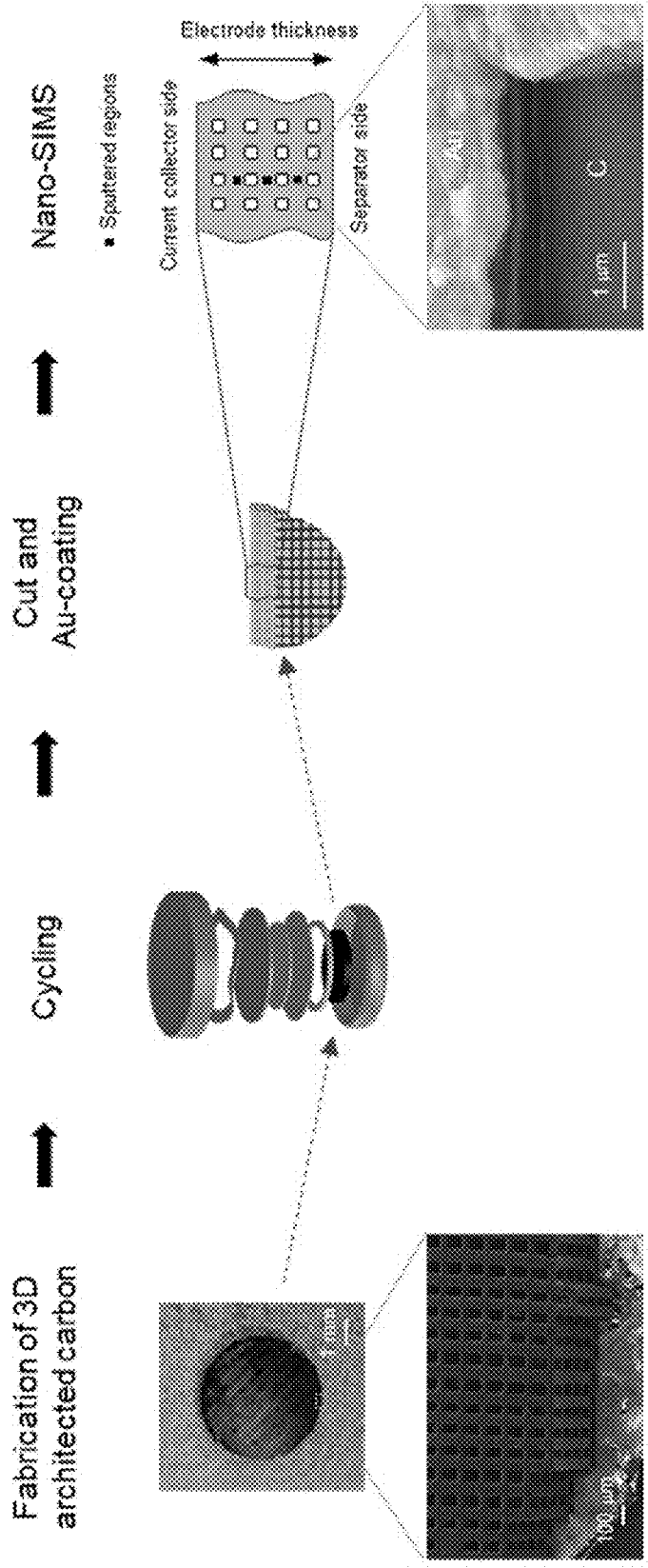

DIRECT CURRENT SPECTROSCOPY (DCS) TECHNIQUE FOR IN-OPERANDO CELL DIAGNOSTICS AND ANISOTROPIC RESISTANCE MONITORING

CROSS-REFERENCE TO RELATED APPLICATIONS

This application claims the benefit of priority to U.S. Provisional Patent Application No. 63/173,863, filed Apr. 12, 2021, which is hereby incorporated by reference in its entirety.

STATEMENT REGARDING FEDERALLY SPONSORED RESEARCH OR DEVELOPMENT

This invention was made with government support under Grant No. N00014-16-1-2827 awarded by ONR. The government has certain rights in the invention.

BACKGROUND OF INVENTION

Electrochemical methods are non-destructive and used to investigate electrochemical devices such as lithium-ion batteries at multiple spatial and time scales: from interfaces, through materials to device-level in space, and from reactions through transport to operation life in time. Common techniques to understand these dynamics at different time scales include current interrupt techniques and electrochemical impedance spectroscopy (EIS).

The current interrupt technique is usually employed for battery and fuel cell systems. It is performed by interrupting the current for a very short interval during charging/discharging, and resistance is calculated by dividing the voltage change before and after the interruption by the applied charge/discharge current. Although this methodology provides cell voltage immediately, it does not address voltage evolution associated with dynamics at different time constants and resistances for the opposite current directions to the charge/discharge currents.

In contrast to the current interrupt techniques, which use direct-current (DC), EIS applies a sinusoidal voltage or current signal with a small amplitude (within the range that shows linear voltage-current relations) in a perturbative manner to detect the currents/voltage response at different frequencies. EIS is used for various systems to understand kinetics, such as electrolyte conductivity, corrosion mechanism, and impedance changes during cycling for electrochemical devices. The EIS technique requires an AC supply and a detector, and a necessary condition to ensure that the EIS measurement is correct is that the sample is fully stationary throughout the measurement, which increases drastically depending on the time constant of dynamics of interest. The obtained impedances are time-averaged, this data does not provide insights on anisotropic dynamics around the stationary-state.

SUMMARY OF THE INVENTION

Direct current (DC)-based techniques that can measure resistance attributed to the dynamic response at different time constants are disclosed. This technique, which is sometimes referred to herein as DCS (direct current spectroscopy), is capable of detecting the resistance anisotropy that emerges when the direction of applied current is reversed, distinguishing between the forward and reverse applied currents. Neither the EIS techniques nor other electrochemical techniques that use DC are capable of detecting these details. In the disclosed methods, a positive/negative direct current (DC) is applied to an electrochemical cell, and voltage evolution is measured and analyzed until the time constant of the dynamic process of interest is reached. The resistance evolution is obtained by dividing the overpotential at each given time by the applied current, analogous to the impedance evolution obtained by EIS. This disclosed method acquires data up to the time constant of the dynamic process of interest, which renders it significantly more efficient compared with, for example, EIS which requires measurements at different frequencies separately. The DCS can be implemented by using a conventional DC supply/detector and can be easily integrated in other electrochemical tests such as galvanostatic cycling.

Aspects described herein include a method of interrogating an electrochemical cell comprises: applying a positive direct current to the electrochemical cell for a first time period, wherein the positive direct current is characterized by a first magnitude; applying a negative direct current to the electrochemical cell for a second time period, wherein the negative direct current is characterized by a second magnitude; wherein the first and second time periods have a combined duration of less than 2 seconds; wherein the second magnitude is equal to or within 50% of the first magnitude; recording cell resistance data of the electrochemical cell during each time period; and analyzing the cell resistance data to determine at least one of: (i) state of charge of the electrochemical cell; (ii) state of health of the electrochemical cell; and (iii) the resistance anisotropy of the cell. Aspects described herein include a method of interrogating an electrochemical cell comprises: applying a positive direct current to the electrochemical cell for a first time period, wherein the positive direct current is characterized by a first magnitude; applying a negative direct current to the electrochemical cell for a second time period, wherein the negative direct current is characterized by a second magnitude; wherein each of the first time period and the second time period is less than or equal to 1 second; wherein the second magnitude is equal to or within 50% of the first magnitude; recording cell resistance data of the electrochemical cell during each time period; and analyzing the cell resistance data to determine at least one of: (i) state of charge of the electrochemical cell; (ii) state of health of the electrochemical cell; and (iii) the resistance anisotropy of the cell. Aspects described herein include a method of interrogating an electrochemical cell comprises: applying a positive direct current to the electrochemical cell for a first time period, wherein the positive direct current is characterized by a first magnitude; applying a negative direct current to the electrochemical cell for a second time period, wherein the negative direct current is characterized by a second magnitude; wherein the second magnitude is equal to or within 50% of the first magnitude; wherein each of the first magnitude and the second magnitude is less than or equal to C/2 of the electrochemical cell; recording cell resistance data of the electrochemical cell during each time period; and analyzing the cell resistance data to determine at least one of: (i) state of charge of the electrochemical cell; (ii) state of health of the electrochemical cell; and (iii) the resistance anisotropy of the cell. Optionally, the step of analyzing comprises determining the resistance anisotropy of the cell. Aspects described herein include a method of interrogating an electrochemical cell comprises: applying a positive direct current to the electrochemical cell for a first time period, wherein the positive direct current is characterized by a first magnitude; applying a negative direct current to the electrochemical cell for a second time period, wherein the negative direct current is characterized by a second magnitude; wherein the second magnitude is equal to or within 50% of the first magnitude; recording cell resistance data of the electrochemical cell during each time period; and analyzing the cell resistance data to determine the resistance anisotropy of the cell. Optionally, the electrochemical cell is a collection of electrically connected electrochemical cells, such as the electrochemical cell optionally being a battery comprising multiple electrochemical cells, wherein the method is thus optionally a method for interrogating the collection of electrically connected electrochemical cells. Below descriptions of direct current spectroscopy (DCS) describe optional embodiments of methods for interrogating an electrochemical cell. Optionally, the electrochemical cell is a collection of electrically connected electrochemical cells, such as the electrochemical cell optionally being a battery comprising multiple electrochemical cells, wherein the method is thus optionally a method for interrogating the collection of electrically connected electrochemical cells. Below descriptions of direct current spectroscopy (DCS) describe optional embodiments of methods for interrogating an electrochemical cell.

In one embodiment, the first and second time periods have a combined duration of less than 5 seconds. In one embodiment, the first and second time periods have a combined duration of less than 4 seconds. In one embodiment, the first and second time periods have a combined duration of less than 3 seconds. In one embodiment, the first and second time periods have a combined duration of less than 1 seconds.

Optionally, in any of the methods and systems disclosed herein, each of the first magnitude and the second magnitude is less than or equal to C/2 of the electrochemical cell. Optionally, in any of the methods and systems disclosed herein, each of the first magnitude and the second magnitude less than or equal to C/3, optionally less than or equal to C/4, optionally less than or equal to C/5, optionally less than or equal to C/6, optionally less than or equal to C/7, optionally less than or equal to C/8, optionally less than or equal to C/9, optionally less than or equal to C/10, optionally less than or equal to C/11, optionally less than or equal to C/12, of the electrochemical cell. Optionally, for example, each of the first and second magnitude is less than or equal to a current value (Amps) corresponding to C/X of the electrochemical cell, wherein X is 2, 3, 4, 5, 6, 7, 8, 9, 10, 11, or 12, such that the C/x value may be determined by dividing the electrochemical cell's capacity or its Amp-hour rating by X.

Aspects described herein include a method of interrogating an electrochemical cell comprising: applying a positive direct current to the electrochemical cell for a first time period, wherein the positive direct current is characterized by a first magnitude; applying a negative direct current to the electrochemical cell for a second time period, wherein the negative direct current is characterized by a second magnitude; wherein the second magnitude is equal to or within 50% of the first magnitude; recording cell resistance data of the electrochemical cell during each time period; analyzing the cell resistance data to determine the resistance anisotropy of the cell; and determining state of charge of the electrochemical cell and/or state of health of the electrochemical cell using the resistance anisotropy of the cell.

In one embodiment, the second magnitude is equal to or within 25% of the first magnitude. In one embodiment, the second magnitude is equal to or within 20% of the first magnitude. In one embodiment, the second magnitude is equal to or within 15% of the first magnitude. In one embodiment, the second magnitude is equal to or within 10% of the first magnitude. In one embodiment, the second magnitude is equal to or within 5% of the first magnitude.

To obtain useful resistance data, where resistance=V/I, the current should be high enough so that the magnitude of voltage evolution at each measurement time step is higher than the voltage reading accuracy. However, the current should still be low enough to avoid disruption of the cell.

In some embodiments, the current may be sufficiently high and/or voltage measurement may be sufficiently accurate such that the first and second magnitudes may be equal. In other embodiments, for example in systems with relatively low voltage measurement accuracy, the magnitude of the first current relative to the second current may be adjusted to correspond to the degree of resistance anisotropy. For example, the ratio of magnitudes of positive and negative currents may be equal to the ratio of the magnitude of "positive" and "negative" resistance.

In some embodiments, the duration of the first time period is a function of a time constant of a process of the electrochemical cell. For, example, in one embodiment, the time constant is the time constant of the rate limiting process of the electrochemical cell. In one embodiment, the first time period is greater than a time constant of the response of the electrochemical cell to the positive direct current; and wherein the second time period is greater than a time constant of the response of the electrochemical cell to the negative direct current. Optionally, the time constant is an RC time constant. Optionally, the time constant is determined empirically by an AC (alternating current) impedance spectroscopy method, such as electrochemical impedance spectroscopy (EIS). Optionally, the rate limiting process corresponds to SEI (solid electrolyte interphase) resistance, charge transfer resistance, contact resistance, grain boundary resistance of solid electrolyte, bulk resistance of solid electrolyte, interfacial resistance, activation resistance, Ohmic resistance, diffusion resistance, polarization resistance, or any combination of these. Optionally, the time constant is determined from predetermined parameters of the electrochemical cell such as diffusion time (e.g., of Li), SEI (solid electrolyte interphase) resistance, charge transfer resistance, contact resistance, grain boundary resistance of solid electrolyte, bulk resistance of solid electrolyte, interfacial resistance, activation resistance, Ohmic resistance, diffusion resistance, polarization resistance, or any combination of these. Optionally, the time constant is an RC time constant, where C is determined by fitting data of resistance change over time such as described in the following reference: Y. Bao and Y. Chen, "Lithium-Ion Battery Real-Time Diagnosis with Direct Current Impedance Spectroscopy", Energies 2021, 14(15), 4396, DOI: 10.3390/en14154396. Optionally, in any method or system disclosed herein, the method further comprises determining the time constant empirically. Optionally, in any method or system disclosed herein, the method further comprises interrogating the electrochemical cell using an AC impedance spectroscopy to determine the time constant. Optionally, in any method or system disclosed herein, the method further comprises interrogating the electrochemical cell using an AC impedance spectroscopy to determine the time constant (e.g., of the rate limiting process of the electrochemical cell).

In one embodiment, the second time period has a duration equal to or within 50% of a duration of the first time period. In one embodiment, the second time period has a duration equal to or within 25% of a duration of the first time period. In one embodiment, the second time period has a duration equal to or within 15% of a duration of the first time period. In one embodiment, the second time period has a duration equal to or within 10% of a duration of the first time period. In one embodiment, the second time period has a duration equal to or within 5% of a duration of the first time period.

Optionally, in any method or system disclosed herein, each of the first time period and the second time period is less than or equal to 1 second, optionally less than 1 second, optionally less than or equal to 0.9 seconds, optionally less than or equal to 0.8 seconds, optionally less than or equal to 0.7 seconds, optionally less than or equal to 0.6 seconds, optionally less than or equal to 0.5 seconds, optionally less than or equal to 0.4 seconds, optionally less than or equal to 0.3 seconds. Optionally, in any method or system disclosed herein, each of the first time period and the second time period is selected from the range of 0.01 milliseconds to 1 second, optionally 0.01 milliseconds to 0.9 seconds, optionally 0.01 milliseconds to 0.8 seconds, optionally 0.01 milliseconds to 0.7 seconds, optionally 0.01 milliseconds to 0.6 seconds, optionally 0.05 milliseconds to 1 second, optionally 0.05 milliseconds to 0.9 seconds, optionally 0.1 milliseconds to 1 second, optionally 0.1 milliseconds to 0.9 seconds, optionally 0.1 milliseconds to 0.8 seconds, optionally 0.01 milliseconds to less than 1 second.

In one embodiment, the cell resistance data is collected at a rate of at least 1 individual cell resistance data point per second. In one embodiment, the cell resistance data is collected at a rate of at least 5 individual cell resistance data points per second. In one embodiment, the cell resistance data is collected at a rate of at least 10 individual cell resistance data points per second. In one embodiment, the cell resistance data is collected at a rate of at least 100 individual cell resistance data points per second. In one embodiment, the cell resistance data is collected at a rate of at least 500 individual cell resistance data points per second. In one embodiment, the cell resistance data is collected at a rate of at least 1000 individual cell resistance data points per second.

In one embodiment, the analyzing step comprises determining charge transfer resistance, and wherein the method comprises collecting the cell resistance data at a rate of at least 5 individual cell resistance data points per second.

In one embodiment, the analyzing step comprises determining SEI resistance, and wherein the method comprises collecting the cell resistance data at a rate of at least 500 individual cell resistance data points per second.

In one embodiment, the steps of application of the positive and negative direct currents comprise applying a square wave direct current profile.

In one embodiment, the cell resistance data includes cell overpotential data, and wherein the analyzing step comprises dividing overpotential at each datapoint by the applied current, and wherein the overpotential is defined as the difference between the equilibrium potential of the net redox reaction in the cell just prior to the time period and the evolved voltage.

In one embodiment, the steps of applying and the step of recording data collectively occur in 1 second or less.

In one embodiment, the analyzing step comprises determining the state of charge of the electrochemical cell by correlating cell resistance data to state of charge via a predetermined relationship.

In one embodiment, the analyzing step comprises determining the state of health of the electrochemical cell by correlating resistance anisotropy to state of health via a predetermined relationship.

In one embodiment, the analyzing step comprises determining the state of health of the electrochemical cell by correlating cell overpotential to state of health via a predetermined relationship.

In one embodiment, the analyzing step comprises probing for resistance anisotropy by comparing cell resistance data collected during the first time period to cell resistance data collected during the second time period.

In one embodiment, the steps of applying the positive current and applying the negative current are performed sequentially in any order. For example, in one embodiment, the constant positive direct current is applied prior to applying the constant negative direct current. In one embodiment, the constant negative direct current is applied prior to applying the constant positive direct current.

Optionally, in any of the methods and systems disclosed herein, the method comprises resting the electrochemical cell for a third time period between the steps of applying. Optionally, in any of the methods and systems disclosed herein, the method comprises resting the electrochemical cell for a third time period between the steps of applying, wherein the positive direct current and the negative direct current are not applied during the third time period. Optionally, the method comprises resting the electrochemical cell for a third time period between the steps of applying, wherein the method does not comprise applying the positive direct current and applying the negative direct current during the third time period). Optionally, in any of the methods and systems disclosed herein, the method comprises separating the steps of applying by a separation time or a third time period. Optionally, in any of the methods and systems disclosed herein, application of the positive direct current and application of the negative direct current are separated by separation time, the separation time being the third time period. In one embodiment, the third time period has a duration that is equal to or within 50% to the duration of the first time period and/or the second time period. In one embodiment, the duration of the third time period is sufficient to allow the cell to reach a stationary state. In one embodiment, the third time period is greater than a time constant of the electrochemical cell's response to the negative direct current and/or to the positive direct current. In one embodiment, the third time period is greater than an RC time constant of the electrochemical cell's response to the negative direct current and/or to the positive direct current. Optionally, the time constant is determined empirically by an AC (alternating current) impedance spectroscopy method, such as electrochemical impedance spectroscopy (EIS). Optionally, the rate limiting process corresponds to SEI (solid electrolyte interphase) resistance, charge transfer resistance, contact resistance, grain boundary resistance of solid electrolyte, bulk resistance of solid electrolyte, interfacial resistance, activation resistance, Ohmic resistance, diffusion resistance, polarization resistance, or any combination of these. Optionally, the time constant is determined from predetermined parameters of the electrochemical cell such as diffusion time (e.g., of Li), SEI (solid electrolyte interphase) resistance, charge transfer resistance, contact resistance, grain boundary resistance of solid electrolyte, bulk resistance of solid electrolyte, interfacial resistance, activation resistance, Ohmic resistance, diffusion resistance, polarization resistance, or any combination of these. Optionally, the time constant is an RC time constant, where C is determined by fitting data of resistance change over time such as described in the following reference: Y. Bao and Y. Chen, "Lithium-Ion Battery Real-Time Diagnosis with Direct Current Impedance Spectroscopy", Energies 2021, 14(15), 4396, DOI: 10.3390/en14154396.

In some embodiments, the duration of the resting step may depend on both the duration and the magnitude of the applied currents. In some embodiments, the duration of the applied currents may depend on "positive" and "negative" resistance since the time constant=R*C=(V/I)*C. Thus, in some embodiments, higher resistance may mean a longer time constant, and thus, a longer duration of applied current, and ac corresponding longer rest.

In one embodiment, the method comprises repeating the steps of: applying a constant positive direct current: and applying a corresponding constant negative direct current. In one embodiment, the method comprises repeating the method at least three times.

In one embodiment, analyzing the state of health of the battery comprises correlating resistance measured at a first measurement time step to a first source of resistance of the electrochemical cell. In one embodiment, analyzing the state of health of the battery further comprises correlating resistance measured at a second measurement time step to a second source of resistance of the electrochemical cell.

The term measurement time step is optionally used interchangeably to refer to a measurement time step frequency as a convenient description to correlate a time point in a DCS method to a corresponding frequency determined by an AC impedance spectroscopy technique.

In one embodiment, each of the first and second sources of resistance is individually selected from the group consisting of: SEI (solid electrolyte interphase) resistance, charge transfer resistance, contact resistance, grain boundary resistance of solid electrolyte, bulk resistance of solid electrolyte, interfacial resistance, activation resistance, Ohmic resistance, diffusion resistance, polarization resistance, and any combination of these.

Optionally, any method or system disclosed herein comprises determining an SEI resistance, $R_{SEI}$ (e.g., optionally based on first and/or second cell resistance data). Optionally, any method or system disclosed herein, the SEI resistance, $R_{SEI}$, is determined using formula FX1a:

$$R_{SEI} = \frac{|V_1 - V_0|}{I}; \quad (FX1a)$$

wherein I is the first magnitude or the second magnitude, $V_0$ is cell voltage immediately prior to application of the respective positive or negative direct current, and $V_1$ is cell voltage in response to the respective applied positive or negative direct current at a first measurement time step being equal to the time constant of the SEI of the electrochemical cell (e.g., SEI time constant).

Optionally, any method or system disclosed herein comprises determining a charge transfer resistance, $R_{CT}$ (e.g., optionally based on first and/or second cell resistance data). Optionally, any method or system disclosed herein, the charge transfer resistance, $R_{CT}$, is determined using formula FX2a:

$$R_{CT} = \frac{|V_2 - V_1|}{I}; \quad (FX2a)$$

and
wherein I is the first magnitude or the second magnitude, $V_1$ is cell voltage in response to the respective applied positive or negative direct current at a first measurement time step being equal to the time constant of the SEI (e.g., SEI time constant) of the electrochemical cell, $V_2$ is cell voltage in response to the respective applied positive or negative direct current at a second measurement time step being equal to the time constant of the charge transfer resistance of the electrochemical cell (e.g., CT time constant). Optionally, any method or system disclosed herein, each of the first measurement time step and the second measurement time step is individually determined by the formula FX3a:

$$f = 1/2 * \pi * t \quad (FX3a);$$

wherein t is the first measurement time step or the second measurement time step; and wherein f is a frequency determined by an AC impedance spectroscopy corresponding to the respective t. In one aspect, when t is the SEI time constant (i.e., the time constant associated with SEI resistance), f may be characterized as the characteristic frequency associated with the SEI resistance as measured, for example, using an AC impedance spectroscopy. In another aspect, when t is the CT time constant (i.e., the time constant associated with charge transfer resistance), f may be characterized as the characteristic frequency associated with the charge transfer resistance as measured using an AC impedance spectroscopy.

Optionally, any method or system disclosed herein, the first measurement time step is equal to or within 20% of the SEI time constant of the electrochemical cell; and wherein the second measurement time step is equal to or within 20% of the charge transfer time constant of the electrochemical cell. As used herein, SEI time constant refers to a time constant associated with the SEI resistance Optionally, any method or system disclosed herein, the step of analyzing comprises determining at least the resistance anisotropy of the cell.

Optionally, any method or system disclosed herein, the electrochemical cell is an intercalation cell or intercalation battery. Optionally, any method or system disclosed herein, the electrochemical cell is a lithium ion battery.

Optionally, any method or system disclosed herein, the cell resistance data comprises a first cell resistance data and a second cell resistance data; and wherein the method further comprises determining the first cell resistance data based on the applied positive direct current and determining the second cell resistance data based on the applied negative direct current. Optionally, any method or system disclosed herein, the step of analyzing further comprises: determining a first state of charge and/or a first state of health based on the first cell resistance data and determining a second state of charge and/or a second state of health based on the second cell resistance data. Optionally, any method or system disclosed herein, the step of analyzing further comprises: comparing the first cell resistance data to the second cell resistance data; and/or comparing the first state of charge and/or a first state of health to the second state of charge and/or a second state of health. Optionally, any method or system disclosed herein, the step of comparing comprises: determining (i) whether the first cell resistance data to the second cell resistance data are within a first predetermined tolerance value and/or (ii) whether the first state of charge and/or the first state of health and the second state of charge and/or a second state of health are within a second predetermined tolerance value; and making a decision. Optionally, any method or system disclosed herein, the decision is to: (a) record the first state of charge, the first state of health, the second state of charge, and/or a second state of health if the first state of charge and/or the first state of health and the second state of charge and/or a second state of health are within the second predetermined tolerance value; or (b) not record the first state of charge, the first state of health, the second state of charge, and/or a second state of health if the first state of charge and/or the first state of health and the second state of charge and/or a second state of health are not within the second predetermined tolerance value.

Optionally, the electrochemical cell is actively charging or discharging while said method is performed, in which case the third time period is a separation time period not characterized by the electrochemical cell being in a stationary state. Optionally, the electrochemical cell is part of a moving vehicle or component while said method is performed.

In one embodiment, the SEI resistance, $R_{SEI}$, is determined by formula FX1b:

$$R_{SEI} = \frac{|V_{f1} - V_0|}{I};$$ (FX1b)

wherein the charge transfer resistance, $R_{CT}$, is determined by formula FX2b:

$$R_{CT} = \frac{|V_{f2} - V_{f1}|}{I};$$ (FX2b)

and wherein I is the magnitude of the applied positive or negative direct current, $V_0$ is cell voltage immediately prior to application of the respective positive or negative direct current, $V_{f1}$ is cell voltage at the first measurement frequency in response to the respective positive or negative direct current, and $V_{f2}$ is cell voltage at the second measurement frequency in response to the respective positive or negative direct current. In one embodiment, each the first and second time measurement frequency is individually determined by the formula FX3b:

$$f = \frac{1}{2} * \pi * t$$ (FX3b);

wherein f is the first or second measurement frequency and t is the duration of the respective first or second time period.

Aspects disclosed herein include a system for interrogating an electrochemical cell comprising any embodiment(s) of methods disclosed herein. For example, aspects disclosed herein include a system for interrogating an electrochemical cell comprises: electrodes in electrical communication with the electrochemical cell; a controller in electrical communication with the electrodes, the controller configured to: apply a positive direct current to the electrochemical cell for a first time period, wherein the positive direct current is characterized by a first magnitude; apply a corresponding negative direct current to the electrochemical cell for a second time period, wherein the negative direct current is characterized by a second magnitude: wherein the second magnitude is equal to or within 50% of the first magnitude; wherein the first and second time periods have a combined duration of less than 2 seconds; record cell resistance data of the electrochemical cell during each time period; and analyze the cell resistance data to determine at least one of: (i) state of charge of the electrochemical cell; (ii) state of health of the electrochemical cell; and (iii) the resistance anisotropy of the cell.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

FIG. 1A: Voltage changes over time during the discharge cycle of a Li—LCO half cell. The current was interrupted at 4.0, 3.8, 3.6, 3.0 V, and the cell was rested for 2 hours, following pulsed current steps. FIGS. 1B-1E: Voltage evolution over time during the pulse current steps at different initial voltage, $E_0$, specified by arrows in FIG. 1A. FIG. 1F: Resistance evolutions over time while pulse current is applied, and (FIG. 1G) Bode magnitude plot using the frequencies converted from the time in FIG. 1F. Open circles show resistances for negative currents, and filled circles show resistances for positive currents.

FIG. 5A: Discharge and charge curves with the voltage changes in 10 seconds relaxation following each cycle, voltage changes in each (FIG. 5B) discharge cycle and (FIG. 5C) charge cycle over the time since the discharge/charge current applied, (FIG. 5D) resistance evolutions, calculated by dividing voltages by the magnitude of the applied current, and (FIG. 5E) Bode magnitude plots of FIG. 5D. In some embodiments, higher cycle count may generally correspond to higher $E_{cell}(V)$ for same time(s). In some embodiments, higher cycle count/number may generally correspond to higher $R_{cell}(Ohm)$ for charge cycles. In some embodiments, higher cycle count/number may generally correspond to higher $R_{cell}(Ohm)$ for discharge cycles. The closed and open circles shows discharge and charge cycles, respectively in FIG. 5D and FIG. 5E. The bars on the right in each figure show the cycle number.

FIGS. 7A-7F: Procedures of characterization of SEI using 3D architected carbon electrodes. FIG. 7A: A photograph of disk-shaped 3D architected carbon electrode, (FIG. 7B) cycling using a coin cell assembled with a 3D architected carbon electrode and a washer, (FIG. 7C) cycled carbon electrode which is cut into a semi-circle shape and gold-coated, (FIG. 7D) sputtered regions for depth analysis in Nano-SIMS characterizations, SEM images of (FIG. 7E) 3D architected carbon composed of cuboid unit cells, and (FIG. 7F) a region sputtered through the Au layer to the carbon electrode.

FIG. 8A: Discharge and charge profiles at 50 mA g$^{-1}$ for the first cycle, and 200 mA g$^{-1}$ for the following 10 cycles; in some embodiments, higher cycle numbers may generally correspond to higher specific capacity at same voltage. FIG. 8B: dQ/dV vs voltage curves from 2nd to 11th cycles for discharge process, and (FIG. 8C) charge process; in some embodiments, higher cycle numbers may generally correspond to higher dQ/dV values. FIG. 8D: Discharge capacity, charge capacity, and Coulombic efficiency vs cycle number. FIG. 8E: Irreversible capacity, $Q_{irr}$ vs cycle number. FIG. 8F: ΔQ vs cycle number for discharge and charge processes.

FIG. 13A: Discharge and charge profiles of galvanostatic cycling, (FIG. 13B) resistance changes attributed to SEI and charge transfer over the cycle obtained from DCS technique, (FIG. 13C) ΔQ vs cycle number, (FIG. 13D) $Q_{irr}$ vs cycle number, (FIG. 13E) depth profiles at the position close to separator obtained by SIMS. In some embodiments, higher cycle numbers may generally correspond to higher higher specific capacity for same V.

FIG. 16A: SEI resistance evolutions before and after $\Delta Q_{chg}$ for each cycle. In FIG. 16A, the leftmost datapoint corresponds to higher cycle number and the rightmost data point corresponds to lower cycle number. FIG. 16B: The representative Li depth profile was distinguished to SEI growth at each cycle by $\Delta Q^x/\Sigma\Delta Q$. F depth profile was plotted together.

STATEMENTS REGARDING CHEMICAL COMPOUNDS AND NOMENCLATURE

Figure 1A:
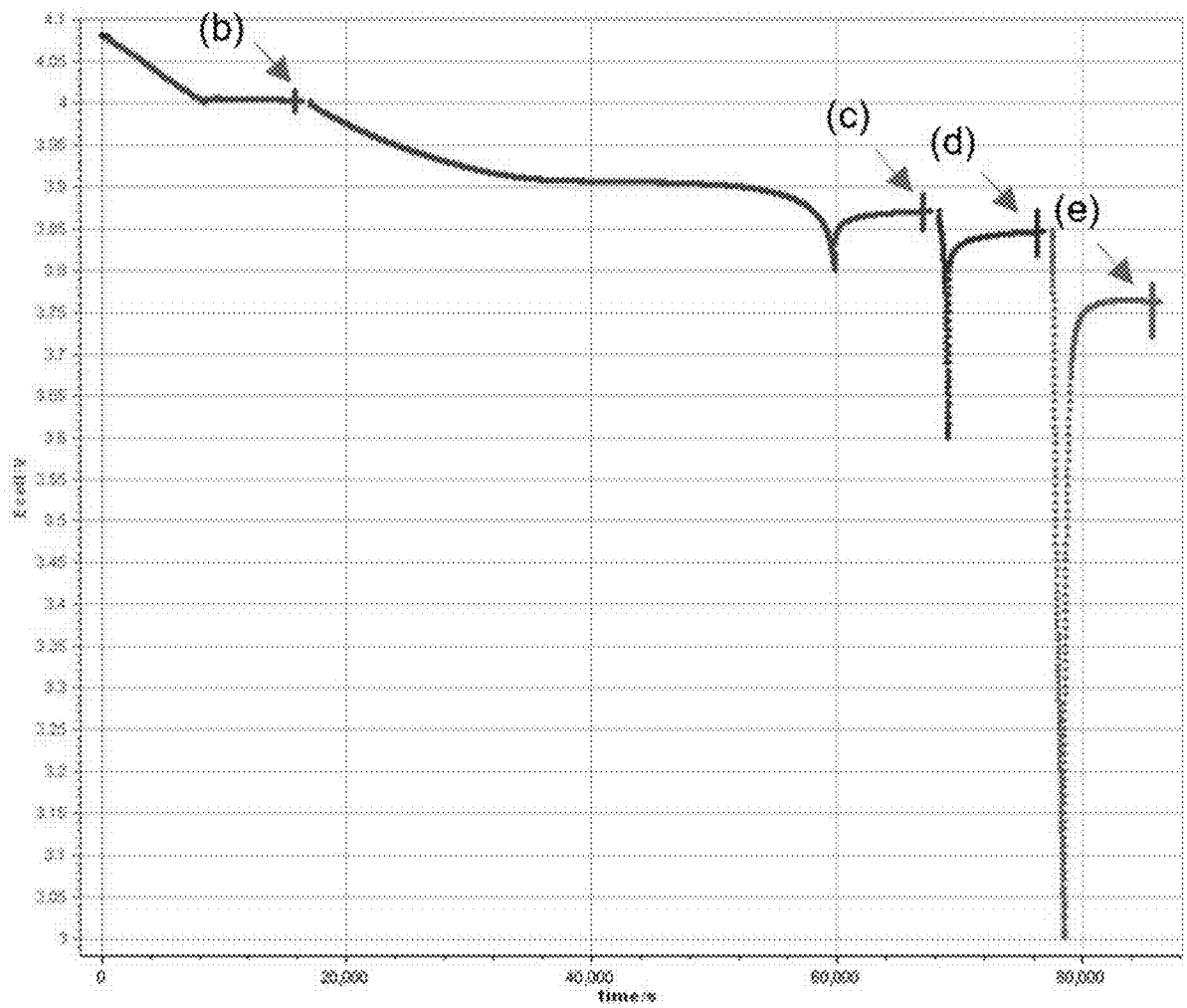
FIGS. 1A-1G: Representative results obtained by the DCS technique and (FIG. 1H) EIS results for comparison.
Figure 1B:
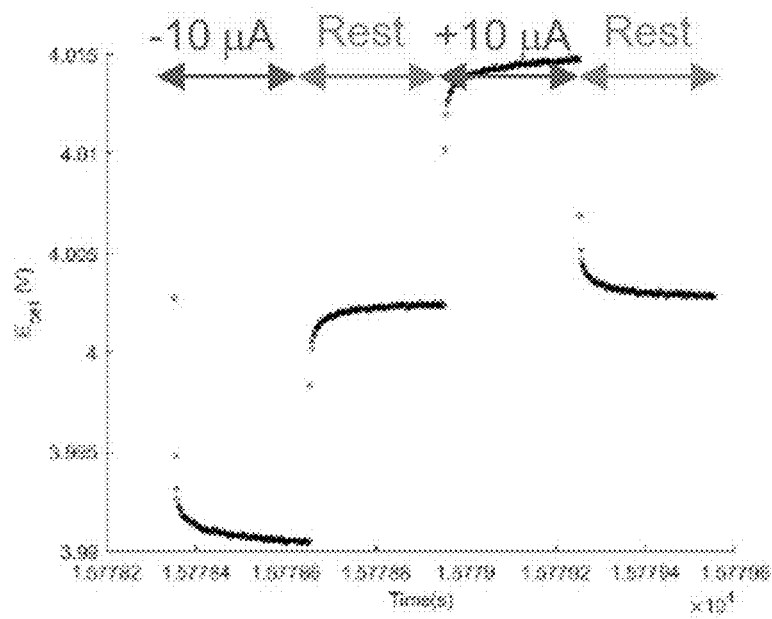
Figure 1C:
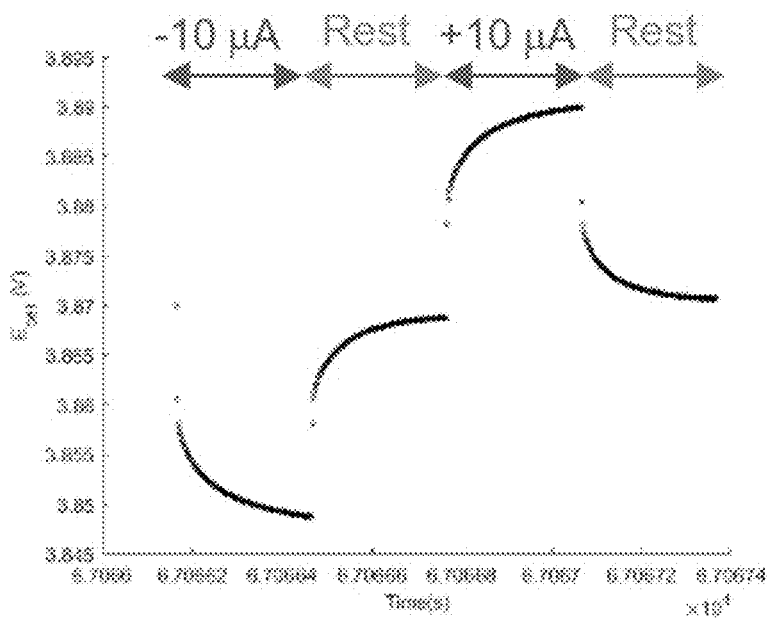
Figure 1D:
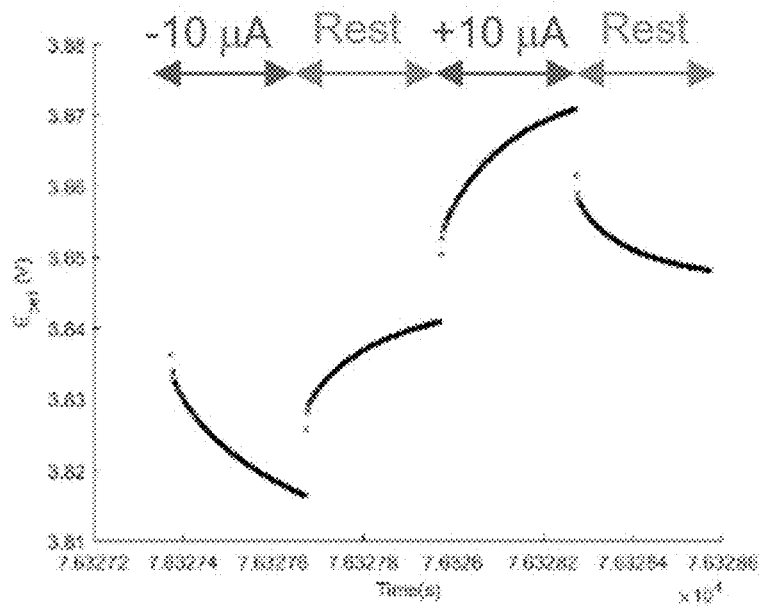
Figure 1E:
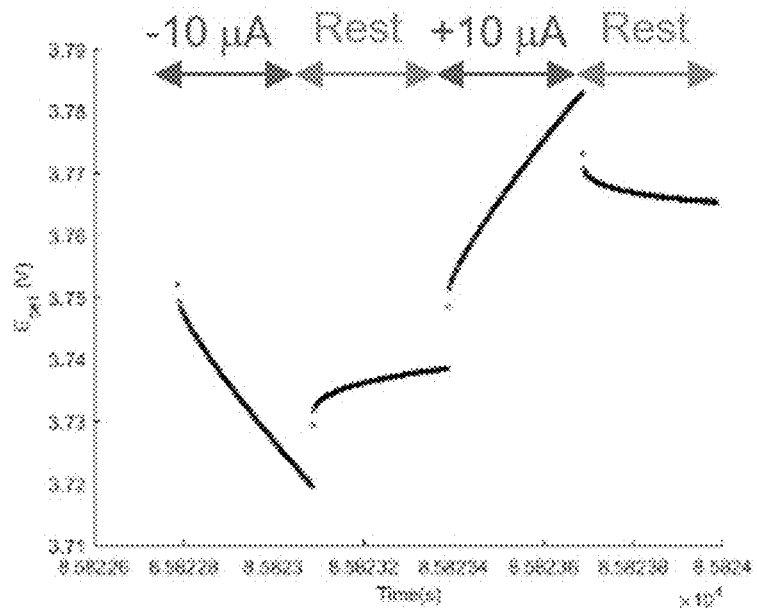

In general, the terms and phrases used herein have their art-recognized meaning, which can be found by reference to standard texts, journal references and contexts known to those skilled in the art. The following definitions are provided to clarify their specific use in the context of the invention.

The expression "state of charge" or "SOC" is a characteristic of an electrochemical cell or component thereof (e.g. electrode—cathode and/or anode) referring to its available capacity, such as a battery, expressed as a percentage of its rated or theoretical capacity. The value of the SoC varies between 0% and 100%. If the SoC is 100%, then the cell is said to be fully charged, whereas a SoC of 0% indicates that the cell is completely discharged. The expression "state of charge" can optionally refer to a true state of charge or a coulometric state of charge. The state of charge of an electrochemical cell can be measured using a variety of methods, including those described herein. The following references, hereby incorporated by reference, disclose methods for estimating, calculating or measuring a state of charge of an electrochemical cell: Ng et al., Applied Energy 86 (2009) 1506-1511; Piller et al., J. Power Sources 96 (2001) 113-120; Coleman et al., IEEE Trans. Ind. Electron. 54 (2007) 2250-2257; Ng et al., "An enhanced coulomb counting method for estimating state-of-charge and state-of-health of lead-acid batteries," INTELEC 31st, Incheon, K R, 2009; Snihir et al., J. Power Sources 159:2 (2006) 1484-1487. The terms "true state of charge" and "thermodynamic state of charge" interchangeably refer to a fractional or percentage of the actual charge capacity remaining in an electrochemical cell as compared to the original, theoretical, or maximum capacity of charge in the electrochemical cell. In embodiments, the true state of charge of an electrochemical cell is determined by comparing a condition of the electrochemical cell, such as one or more thermodynamic parameters, with a condition of a reference electrochemical cell and identifying the true state of charge of the electrochemical cell as the state of charge of the reference electrochemical cell having the same condition as the electrochemical cell. The term "Coulometric state of charge" refers to a fractional or percentage of the charge capacity remaining in an electrochemical cell as compared to the original, theoretical, or maximum capacity of charge in the electrochemical cell and measured by integrating a current actually delivered by or to the electrochemical cell. In embodiments, the Coulometric state of charge and the true state of charge can be different, such as when side reactions take place in an electrochemical cell that do not contribute to charging or discharging the electrodes of the electrochemical cell but are still associated with delivery of current from or to the electrochemical cell. Such side reactions include, but are not limited to, oxidation of an electrolyte in the electrochemical cell and reduction of electrochemical cell. In embodiments a Coulometric state of charge is determined by subtracting the total measured charge delivered by the electrochemical cell (including any charging and discharging of the electrochemical cell) from the original, theoretical or maximum charge capacity of the electrochemical cell and dividing by the original, theoretical or maximum charge capacity of the electrochemical cell.

The term "state of health" or "state of health of the electrochemical cell" (SoH) refers to the difference between an aged battery being studied and a fresh battery. SoH may be expressed as the percentage of the rated capacity the aged battery is able to obtain at maximum charge. In embodiments, the state of health of the electrochemical cell refers to the amount of energy (W·h) and power (W) deliverable or available in a system compared to the best, ideal, theoretical or rated amounts when the system is newly fabricated and tested, such as at 100% state of charge. In embodiments, battery state of health decays or reductions result from electrode and electrolyte materials degradation, from an increase in internal resistance and from mechanical and chemical effects, such as hardware deformation due to heat, gazing and corrosion. In embodiments, a metric for state of health assessment is the relative peak power fade at a specified or defined state of charge, such as expressed by $SOH=100(P(SOC)/P_0(SOC))$, where, SOH refers to the state of health of the electrochemical cell, P(SOC) is the peak power at a state of charge (SOC) of an aged cell and $P_0(SOC)$ is the peak power at a state of charge of a freshly manufactured and tested cell at the same state of charge (SOC); optionally a state of charge of 50% is used in determination of SOH, though other states of charge are optionally used as well. The following references, hereby incorporated by reference, disclose methods for estimating, calculating or measuring a state of health of an electrochemical cell: Ng et al., Applied Energy 86 (2009) 1506-1511; Remmlinger et al., J. Power Sources 196 (2011) 5357-5363; Andre et al., Engineering Applications of Artificial Intelligence 26 (2013) 951-961; Lin et al., IEEE Transactions on Industrial Informatics, 9:2 (2013) 679-685; Eddahech et al., Electrical Power and Energy Systems 42 (2012) 487-494.

The term "resistance anisotropy" of the cell refers to a difference in the positive current dynamic resistance behavior compared with the negative current dynamic resistance behavior of an electrochemical cell.

The term "charge transfer resistance" of the cell refers to the electrical resistance associated with electron transfer from one atom or compound to another atom or compound.

The term "SEI resistance" of the cell refers to the electrical resistance associated with the solid electrolyte interphase layer of the cell.

The term "stationary state" of an electrochemical cell refers to an absence of measurable polarization in the electrolyte. Optionally, for example, the stationary state of an electrochemical cells corresponds to the electrochemical cells not being in a state of being charged or discharged.

The term "electrochemical cell" refers to devices and/or device components that convert chemical energy into electrical energy or electrical energy into chemical energy. Electrochemical cells typically have two or more electrodes (e.g., cathode and anode) wherein electrode reactions occurring at the electrode surfaces result in charge transfer processes. Electrochemical cells include, but are not limited to, primary batteries, secondary batteries, galvanic cells, fuel cells and photovoltaic cells. An electrochemical cell may be for example a lithium ion battery. A lithium ion battery, for example, comprises electrochemical cells.

The term "open circuit voltage" refers to the difference in potential between terminals (i.e. electrodes) of an electrochemical cell when the circuit is open (i.e. no load conditions). Under certain conditions the open circuit voltage can be used to estimate the composition of an electrochemical cell. The present methods and system utilize measurements of open circuit voltage for thermochemically stabilized conditions of an electrochemical cell to determine thermodynamic parameters, materials properties and electrochemical properties of electrodes, electrochemical cells and electrochemical systems.

The term "capacity" is a characteristic of an electrochemical cell that refers to the total amount of electrical charge an electrochemical cell, such as a battery, is able to hold. Capacity is typically expressed in units of ampere-hours.

An "intercalation electrochemical cell" (or shorter, "intercalation cell") refers to an electrochemical cell, such as of a battery, which comprises an intercalation process. " Intercalation" refers to refers to the process wherein an ion inserts into a host material to generate an intercalation compound via a host/guest solid state redox reaction involving electrochemical charge transfer processes coupled with insertion of mobile guest ions, such as fluoride ions. Major structural features of the host material are preserved after insertion of the guest ions via intercalation. In some host materials, intercalation refers to a process wherein guest ions are taken up with interlayer gaps (e.g., galleries) of a layered host material. Examples of intercalation compounds include, but are not limited to, fluoride ion intercalation compounds wherein fluoride ions are inserted into a host material, such as a layered fluoride host material or carbon host material. The term "host material" refers to a component of an electrochemical cell configured for accommodating a molecule, atom, ion and/or group into the host material. In this context, accommodating includes insertion of a molecule, atom, ion and/or group into the host material, intercalation of a molecule, atom, ion and/or group into the host material and/or reaction of a molecule, atom, ion and/or group with the host material. In embodiments, accommodation of a molecule, atom, ion and/or group is a reversible process, such that a molecule, atom, ion and/or group can be released from the accommodating host material. For certain embodiments, reversible accommodation by host materials does not result in significant degradation or significant structural deformation of the material upon multiple accommodation/ release cycles. In some embodiments a host material is an intercalation material. In some embodiments a host material is a framework material. In some embodiments a host material is a host electrode of an electrochemical cell and/or an intercalation electrode of an electrochemical cell.

"Electrical communication" refers to the arrangement of two or more devices or device components such that electrons can efficiently flow between the devices or device components. In an embodiment, two devices positioned in electrical communication are positioned in physical contact. In an embodiment, two devices positioned in electrical communication are positioned such that an electrical conductor is positioned between them, such as a copper wire or other metallic wire or conductor.

Various potentially useful aspects, embodiments, definitions, components, processes, steps, configurations, and background information may be found in the following references, each of which is incorporated herein in its entirety, to the extent not inconsistent herewith: (1) Y. Bao and Y. Chen, "Lithium-Ion Battery Real-Time Diagnosis with Direct Current Impedance Spectroscopy", Energies 2021, 14(15), 4396, DOI: 10.3390/en14154396; (2) U.S. Pat. No. 8,521,497 (K. L. Gering); (3) U.S. Pat. No. 8,346,495 (K. L. Gering); (4) U.S. Pat. No. 10,910,858 (T. L. Taylor, et al.); (5) U.S. Pat. No. 10,036,779 (S. V. Sazhin, et al.); (6) U.S. Pat. No. 9,419,313 (C. Paik, et al.); (7) U.S. Pat. No. 9,599,584 (R. Yazami, et al.); (8) J. P. Christopherson, 2015, "Battery Test Manual For Electric Vehicles", Idaho National Laboratory, Revision 3, document number INL/EXT-15-34184; (9) International Pat. Pub. No. WO2021023346 (M. Baumann); and (10) International Pat. Pub. No. WO2015014764 (J. B. Gerschler, et al.).

The term "and/or" is used herein, in the description and in the claims, to refer to a single element alone or any combination of elements from the list in which the term and/or appears. In other words, a listing of two or more elements having the term "and/or" is intended to cover embodiments having any of the individual elements alone or having any combination of the listed elements. For example, the phrase "element A and/or element B" is intended to cover embodiments having element A alone, having element B alone, or having both elements A and B taken together. For example, the phrase "element A, element B, and/or element C" is intended to cover embodiments having element A alone, having element B alone, having element C alone, having elements A and B taken together, having elements A and C taken together, having elements B and C taken together, or having elements A, B, and C taken together.

The term "±" refers to an inclusive range of values, such that "X±Y," wherein each of X and Y is independently a number, refers to an inclusive range of values selected from the range of X−Y to X+Y. In the cases of "X±Y" wherein Y is a percentage (e.g., 1.0±20%), the inclusive range of values is selected from the range of X−Z to X+Z, wherein Z is equal to X·(Y/100). For example, 1.0±20% refers to the inclusive range of values selected from the range of 0.8 to 1.2.

DETAILED DESCRIPTION OF THE INVENTION

In the following description, numerous specific details of the devices, device components and methods of the present invention are set forth in order to provide a thorough explanation of the precise nature of the invention. It will be apparent, however, to those of skill in the art that the invention can be practiced without these specific details.

Detailed Procedure of the DCS Technique Using Positive/Negative Pulse Currents

FIGS. 1A-1H shows representative data using DCS with pulsed current. The employed battery system is a half-cell of lithium cobalt oxide (LCO) slurry electrode and lithium metal electrode with 1.0 M lithium hexafluorophosphate in 1:1 (v/v) ratio of ethylene carbonate: diethyl carbonate in a stainless steel 2032 coin cell. The constant discharge current is applied up to the prescribed voltage of (4.0, 3.8, 3.6, 3.0 V), followed by a 2-hour rest period. A pulsed current of −10 mA was then applied for 0.3 seconds, followed by a 0.3-second long rest period. This process was repeated for the applied current of +10 mA. A potentiostatic EIS was concurrently conducted for comparison. These processes were repeated until the voltage reached a cur-off voltage of 3.0 V. FIG. 1A and FIGS. 1B-1E show the voltage response over time in these processes. $E_0$ indicates the voltage before applying the pulsed current and indicates the state-of-charge (SoC) of LCO electrodes. To investigate the resistance evolution attributed to battery dynamics with different time constants, the obtained voltage responses (FIGS. 1B-1E) were plotted as $$\frac{\Delta E}{i} \text{ vs Time}$$

Figure 1F:
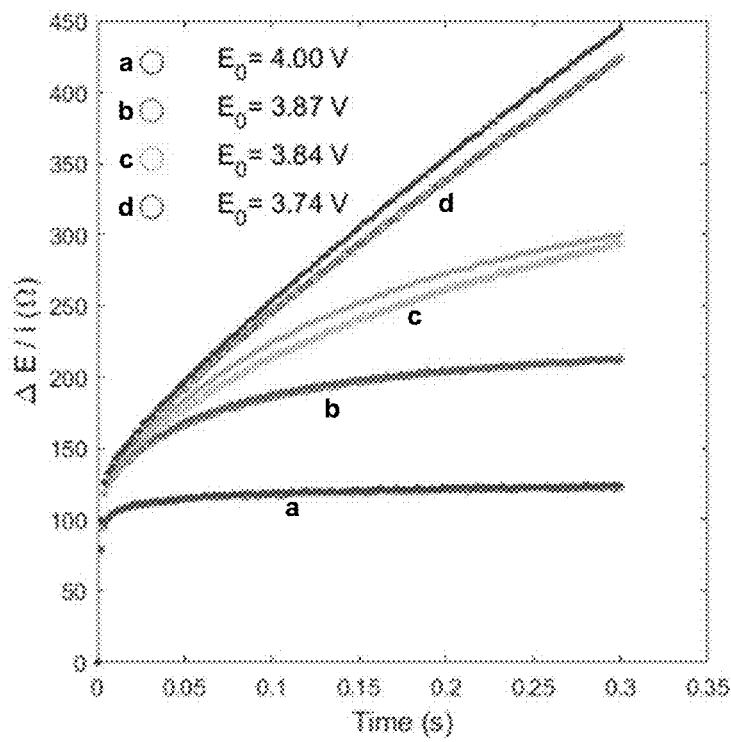
Figure 1G:
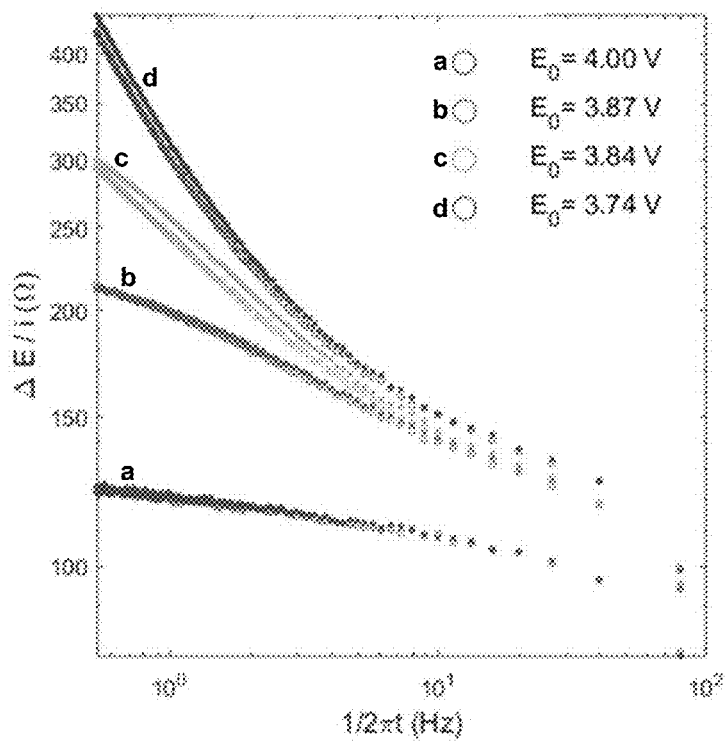
Figure 1H:
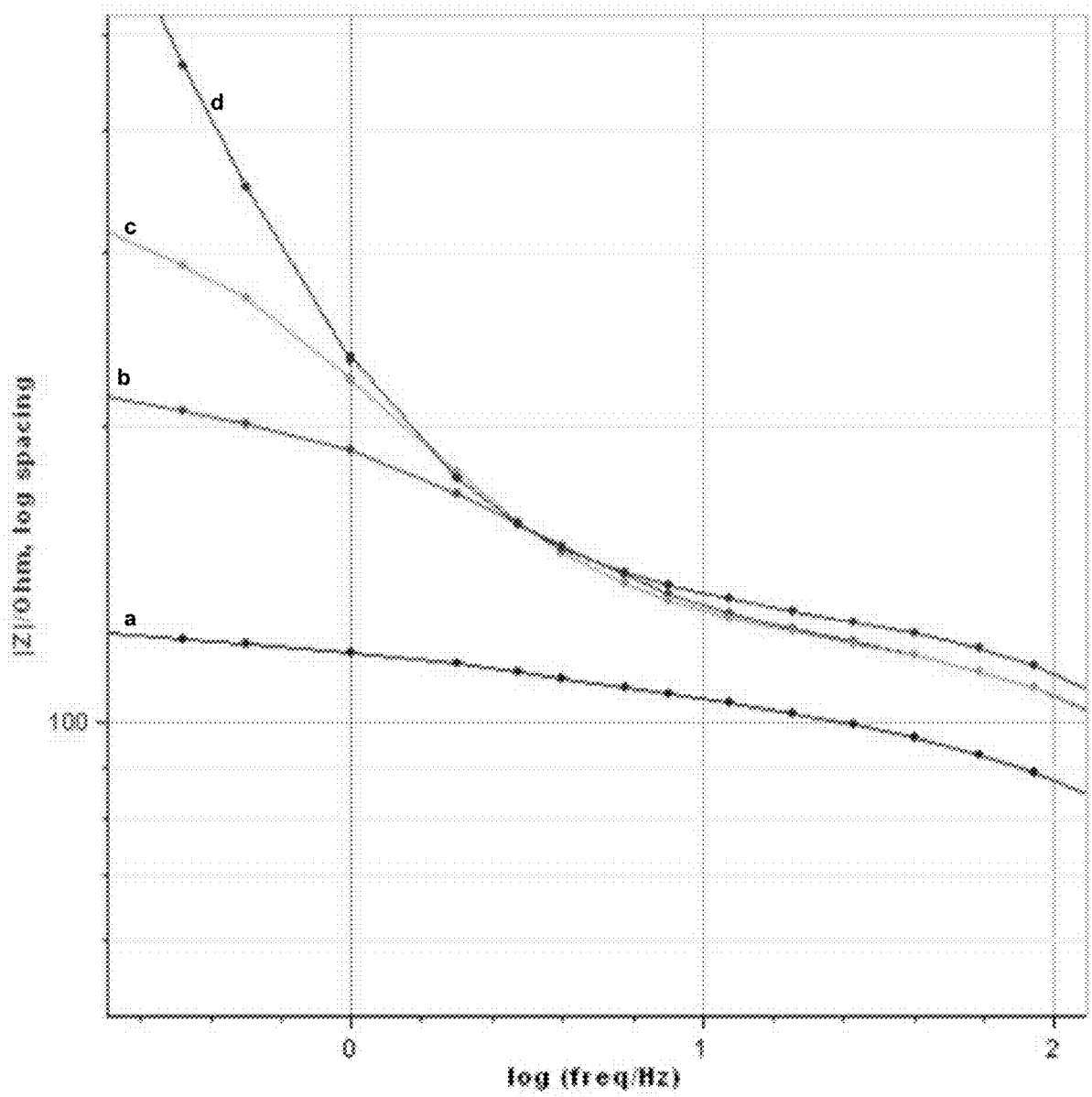
FIG. 1H: Bode magnitude plot in the same frequency ranges as FIG. 1G, obtained by potentiostatic EIS.

(FIG. 1F); where $\Delta E$ indicates overpotential relative to $E_0$ when the pulsed current is applied, i indicates the amplitude of the applied current (i.e. 10 mA), and Time indicates the duration of the pulsed current application. The trends in resistance evolution depend on SoC, which agrees with previous reports that employed EIS [7]. Interestingly, the resistance evolution varies with current direction at lower SoCs (i.e. $E_0$=3.84 V for 11 Ohm and $E_0$=3.74 V for 10 Ohm), which cannot be detected by EIS (FIG. 1H). The obtained results can be illustrated by a Bode magnitude plot shown in FIG. 1G. The Bode magnitude plot obtained by the DCS technique is consistent with the one obtained by EIS (FIG. 1F). The DCS measurement occurred over a substantially shorter measurement time of 0.6 s compared with 33 seconds of EIS measurements to obtain the range of frequencies shown in FIG. 1H, with 6 data points per decade in logarithmic spacing, and averaging 2 measurements per frequency.

EXAMPLE 1: LCO-Li HALF CELL OVER CYCLING

Figure 2A:
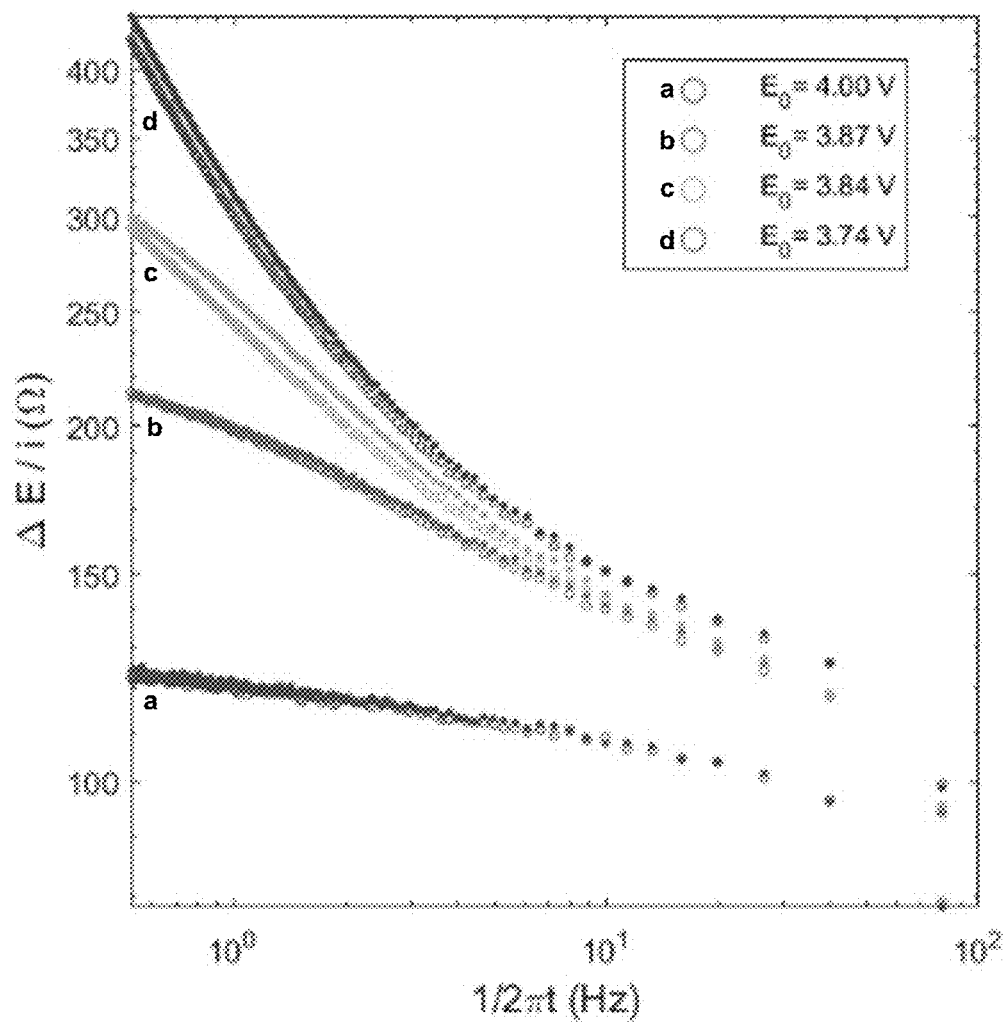
FIGS. 2A-2C: Bode magnitude plots obtained by the DCS technique for Li—LCO half cell during (FIG. 2A) 1st discharge cycle, (FIG. 2B) 1st charge cycle, and (FIG. 2C) 2nd discharge cycle.
Figure 2B:
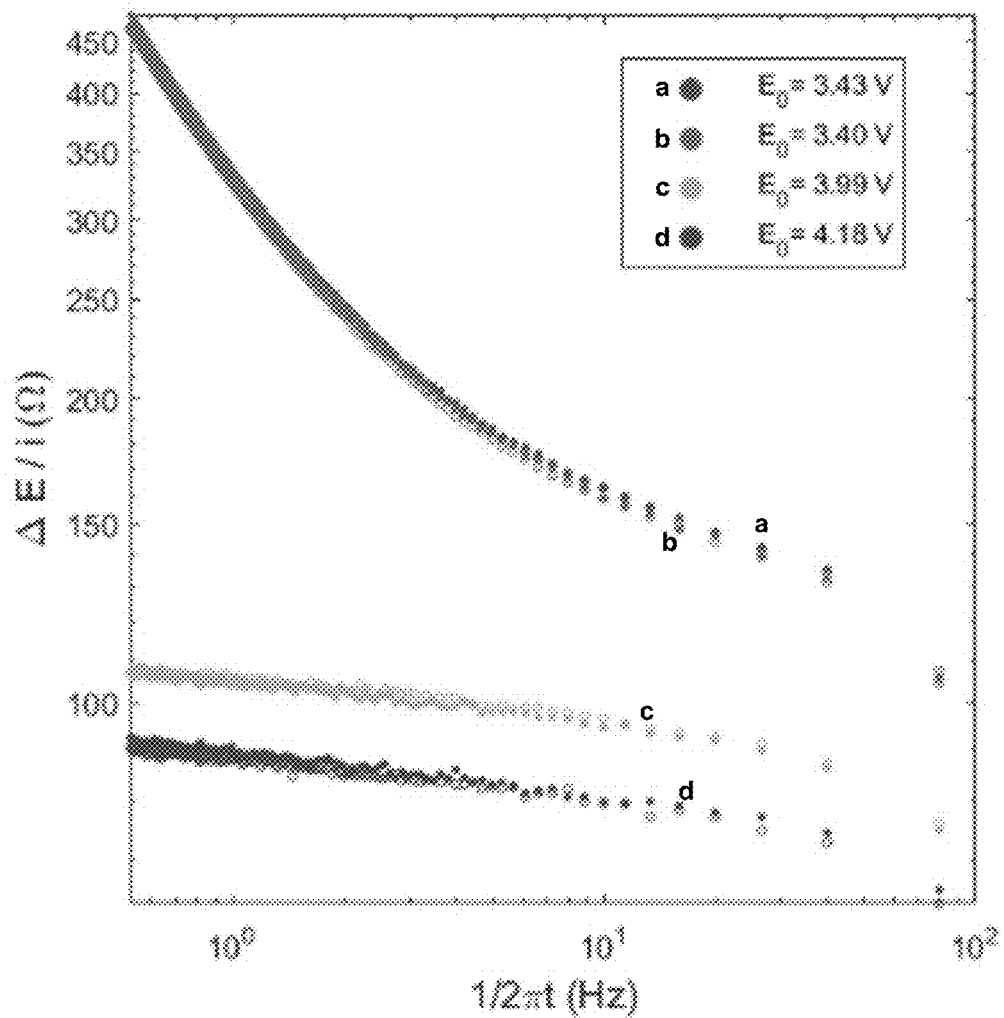
Figure 2C:
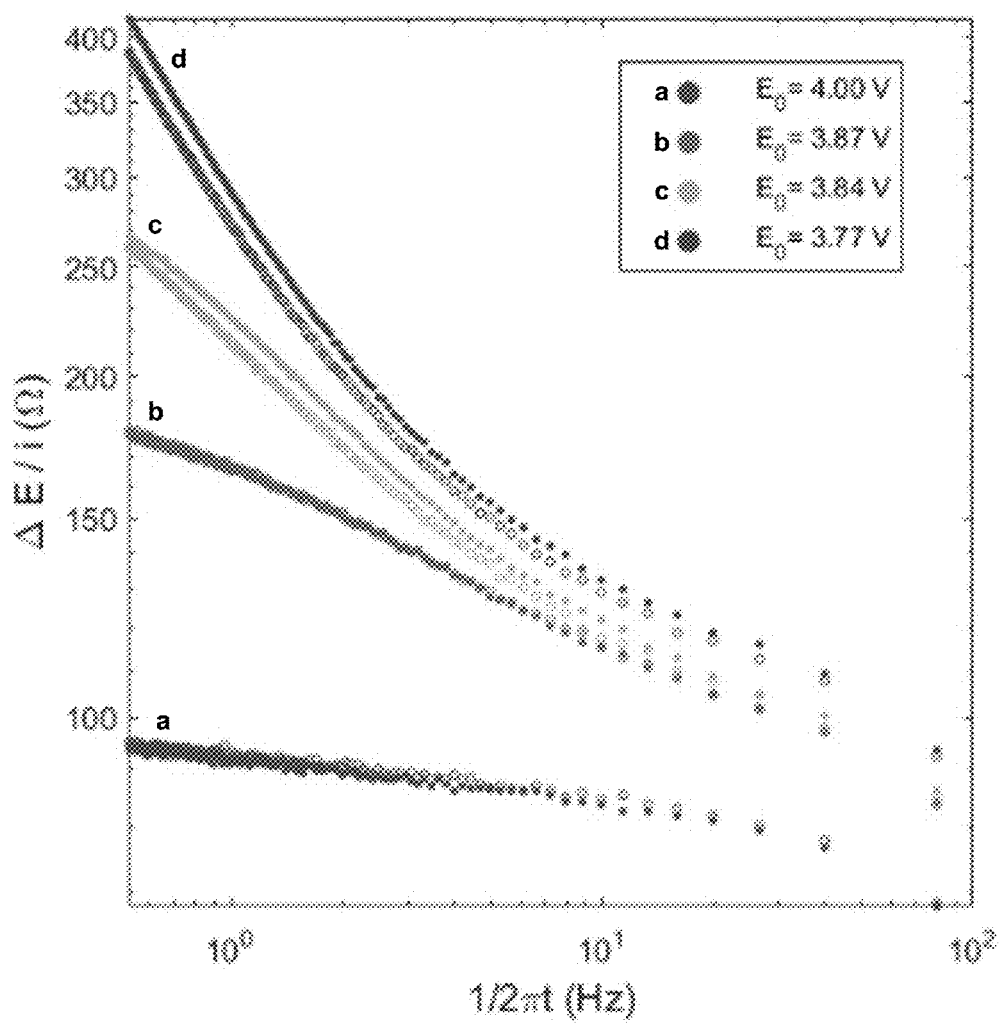
Figure 3A:
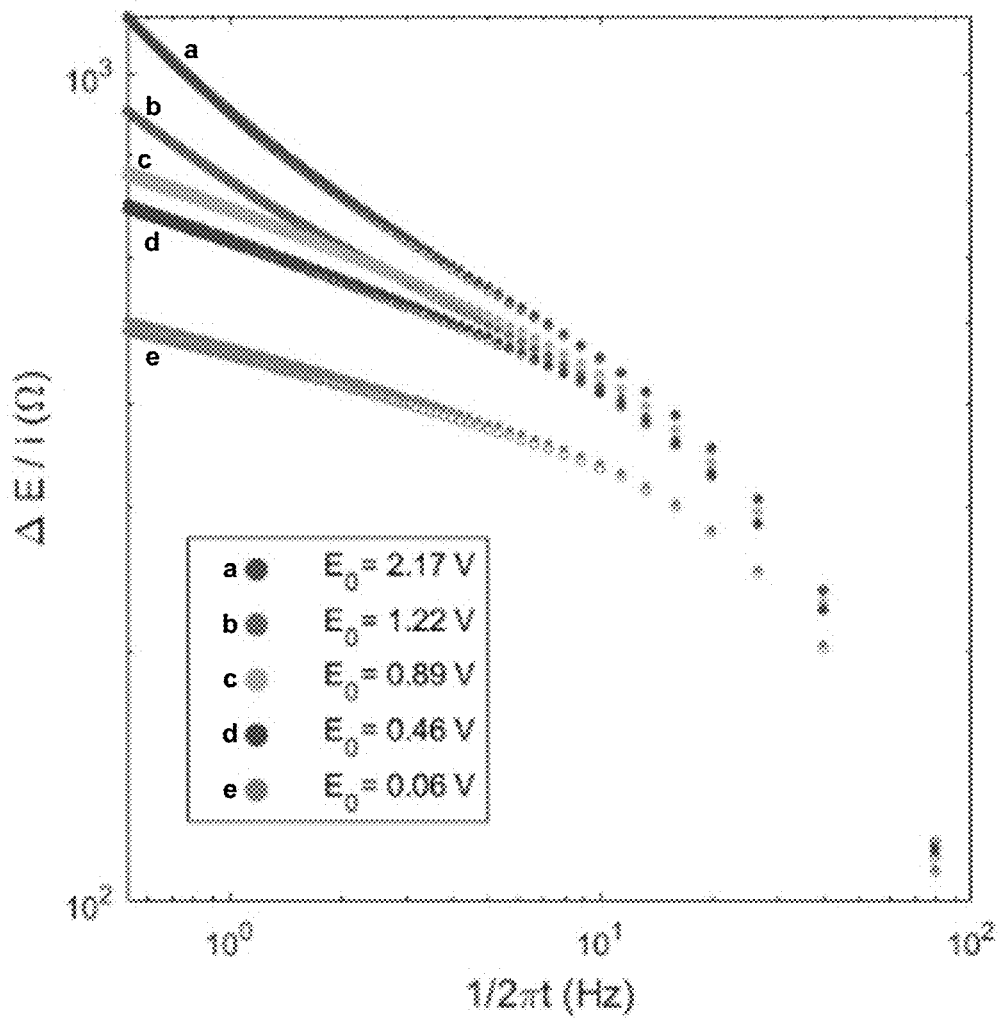
FIGS. 3A-3C: Bode magnitude plots obtained by the DCS technique for Li-graphite half cell during (FIG. 3A) 1st discharge cycle, (FIG. 3B) 1st charge cycle, and (FIG. 3C) 2nd discharge cycle.
Figure 3B:
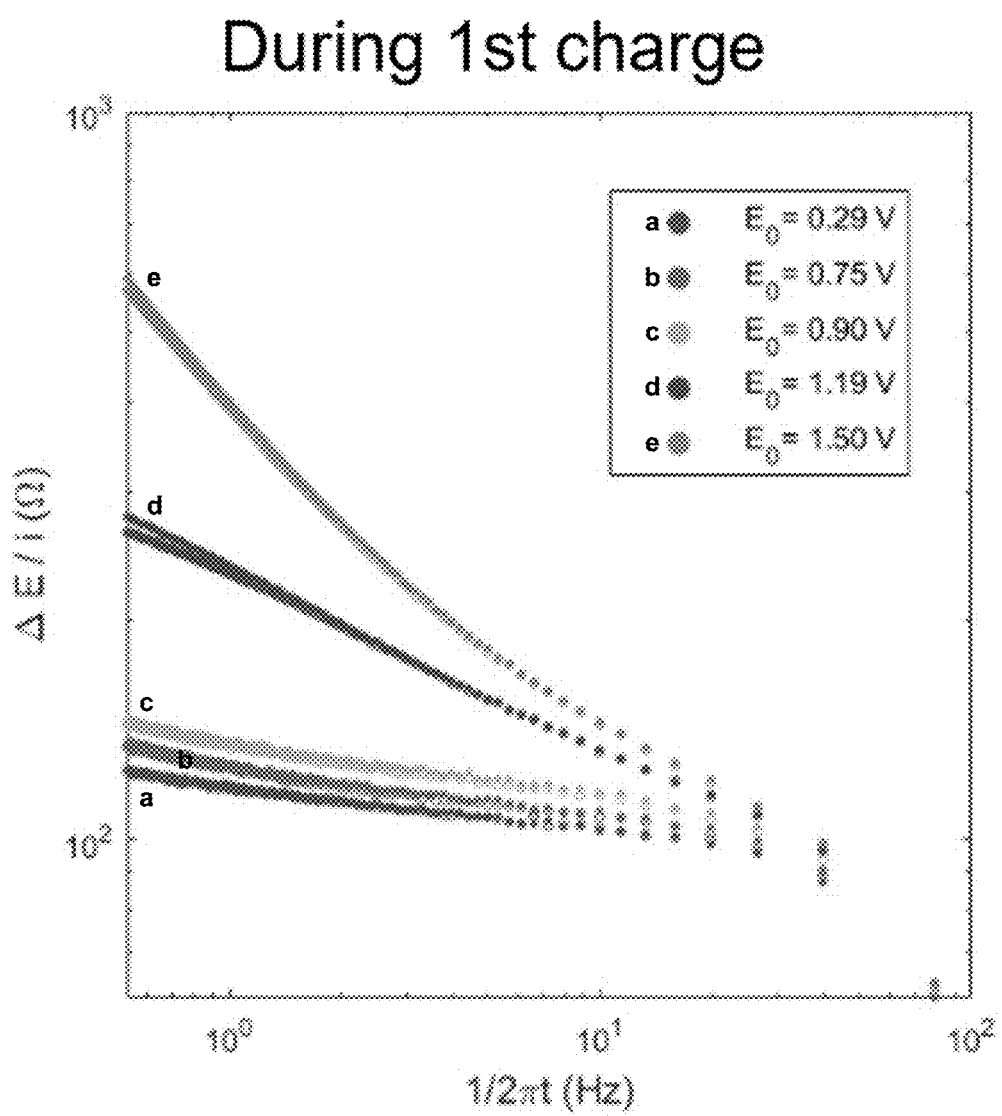
Figure 3C:
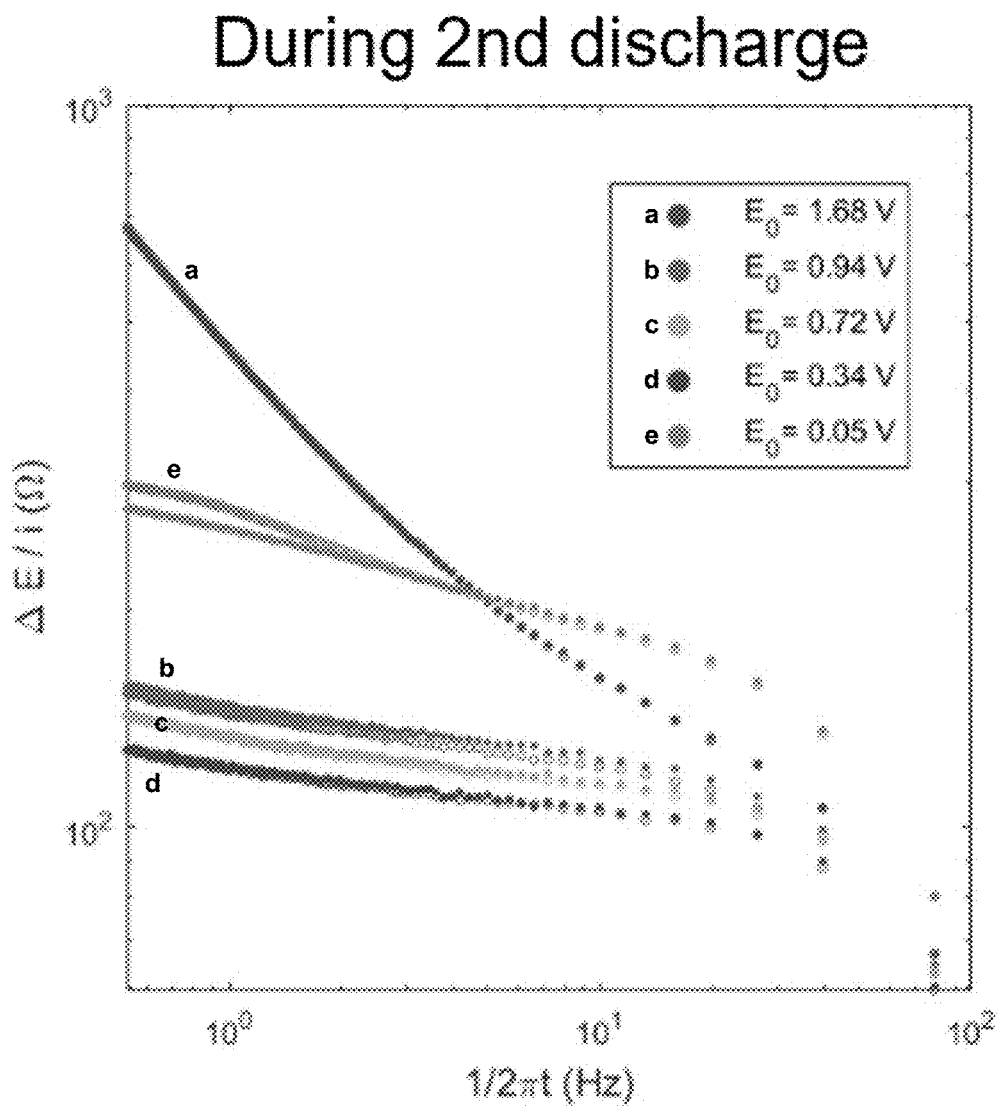

The same procedures described in the previous section were applied to the LCO-Li half cell over the 1st discharge-charge cycle and the 2nd charge cycle. FIGS. 2A-2C show the obtained Bode magnitude plots. The prescribed voltages for interrupted-current conditions were 3.6, 3.8, 4.0, and 4.2 V for the charge cycle. The trends in resistance evolution and directionality were consistent throughout the 1st and 2nd discharge cycles (FIGS. 2A and 2C). FIGS. 2A and 2B also show consistent resistance evolution similar SoCs throughout 1st discharge and charge cycles.

EXAMPLE 2: GRAPHITE-Li HALF CELL OVER CYCLING

To demonstrate the versatility of the DCS technique compared with other systems, we prepared a graphite slurry- Li half cell in the same way as the LCO-Li half cell. The same procedures were applied with prescribed voltages of 1.5, 0.8, 0.6, 0.3, 0.005 V for discharge cycle and 0.3, 0.8, 1.0, 1.5, 2.0 V for charge cycle. The resistance evolution in the 1st and 2nd charge cycles is different, which indicates that the solid electrolyte interface (SEI) is formed during the 1st charge-discharge cycle and affects the resistance evolution. The resistance changes at different SoC and SEI formations were reported in the literature using EIS [8]. The Bode plot for the lowest $E_0$ during the 2nd charge cycle shows unambiguous direction dependency of the resistance, which was absent in the 1st discharge-charge cycle.

EXAMPLE 3: RULING OUT POTENTIAL CAUSES OF OBSERVED RESISTANCE DIFFERENCES UPON OPPOSITE CURRENT DIRECTIONS

Figures 4A, 4B:
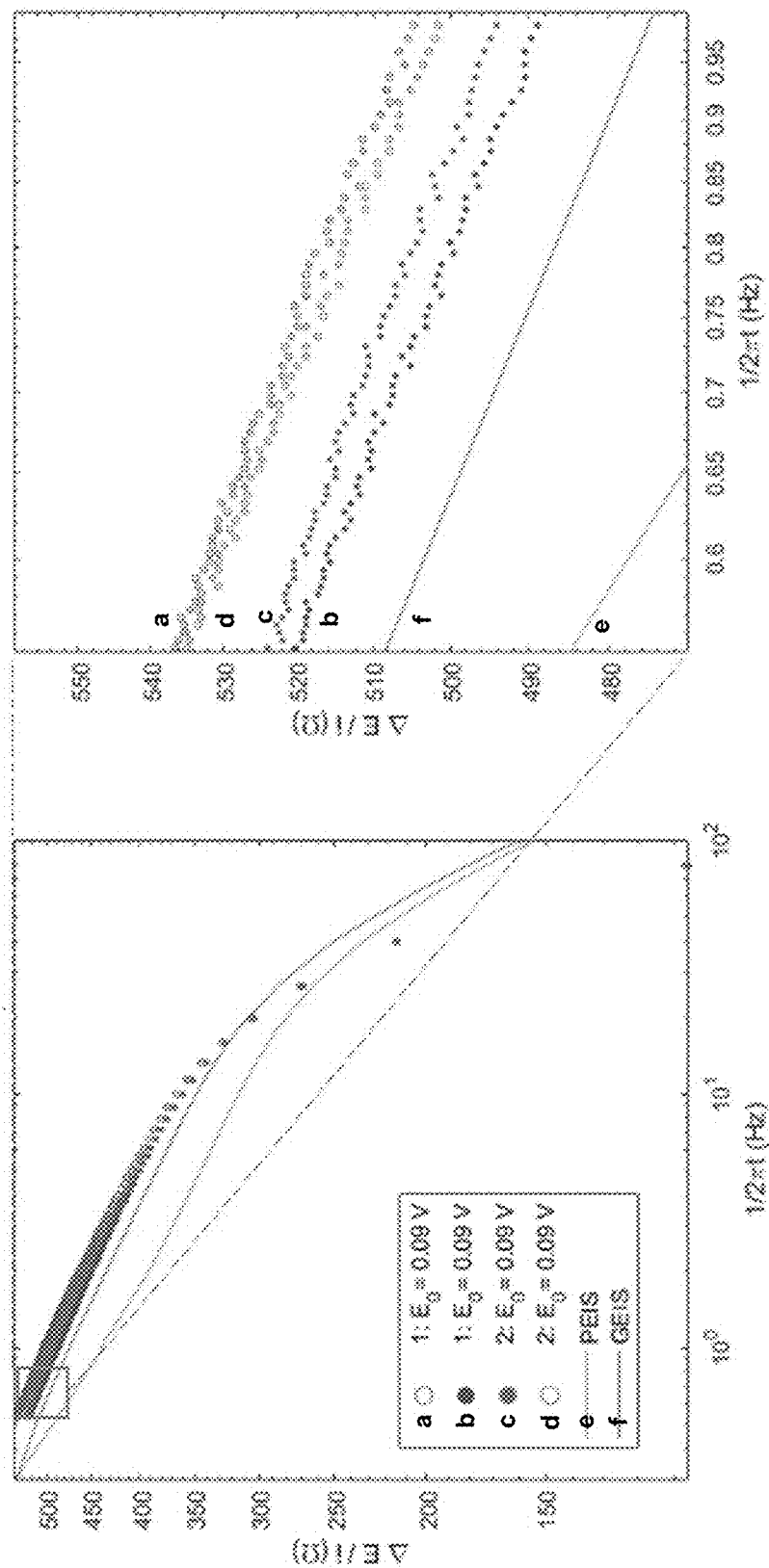
FIG. 4A: Comparison of the DCS method, PEIS and GEIS for Bode magnitude plots, and (FIG. 4B) a close look of the square region in FIG. 4A. DCS methods were conducted first with the order of positive ("a" open circles) and negative ("b" filled circles) currents, and then the order was switched in the second measurement to the order of negative ("c" filled circles) and positive ("d" open circles) currents.

We investigated other potential causes of the resistance difference that could emerge as a result of the opposite current directions in the DCS. We used the same graphite-Li half cell system as the one in Example 2 at 0.09 V of the initial voltage, $E_0$. We first applied a positive pulse current over 0.3 s, relaxed the cell for 5 s, then applied the negative pulse current. The second DCS measurement was conducted in the opposite order of current directions; we first applied a negative current for 0.3 s, relaxed the cell for 5 s, and then applied the positive currents. The magnitude of the applied pulse currents was 100 mA. FIGS. 4A-4B show Bode magnitude plots obtained by DCS conducted at different current directions and in sequence steps. The voltages measured after each cell relaxation were self-consistent, indicating no observable SoC change due to the pulse currents. The difference in resistance caused by the reversal In current direction was >10 ohm (FIG. 4B), which is 2× larger than the <5 Ohms difference in resistance caused by switching the sequential order of the applied current directions. These results suggest that the observed difference of resistances with opposite current directions is attributed not to the history of applied currents but to the directionality of resistances in the probed system.

EXAMPLE 4: COMPARISON WITH POTENTIOSTATIC AND GALVANOSTATIC EIS

We conducted the GEIS and PEIS measurements after the DCS techniques described in Example 3, with 100 mA of the magnitude of current perturbation in GEIS and 5 mV of the magnitude of potential perturbation in PEIS. FIGS. 4A-4B include Bode magnitude plots obtained by the DCS method, PEIS, and GEIS. The DCS method and GEIS measurement, both of which uses currents as inputs and voltages as outputs, showed similar frequency-dependent resistances (or impedances). At lower frequencies than 30 Hz, GEIS showed close resistances within <35 ohm difference to the ones obtained by the DCS method, whereas at the highest frequency of 80 Hz, the difference of resistances was ~60 ohms between the DCS method and EIS methods.

Figure 5A:
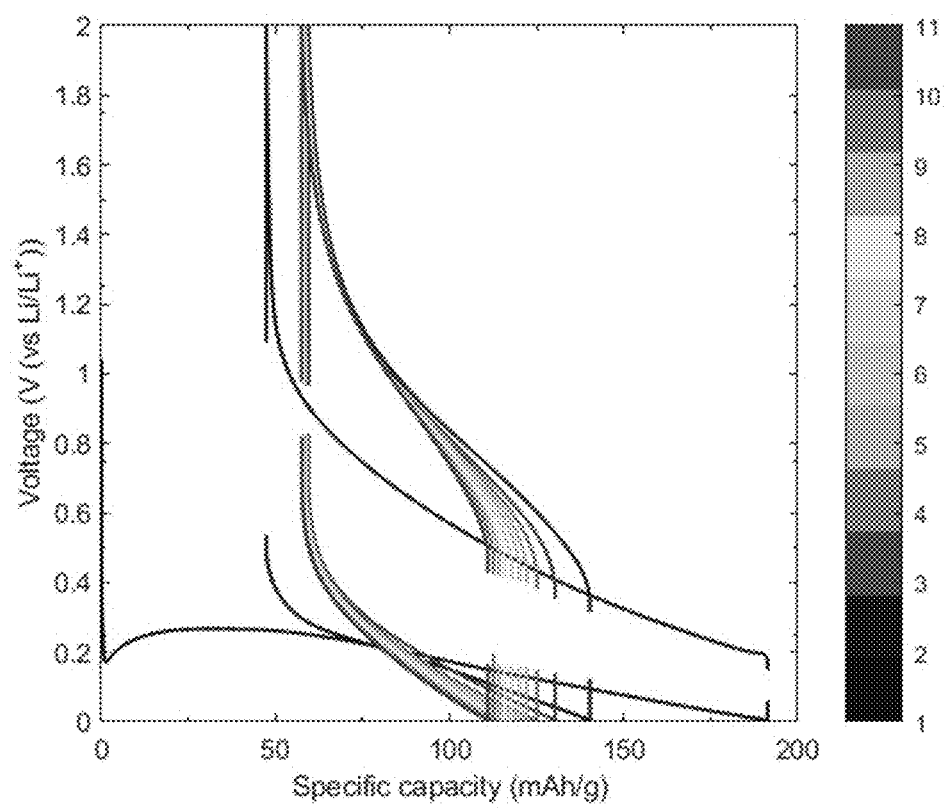
FIGS. 5A-5E: Incorporation of the DCS technique in galvanostatic cycling at 50 mA/g for 1st cycle and 200 mA/g for the following 10 cycles with Li-hard carbon half cell.
Figure 5B:
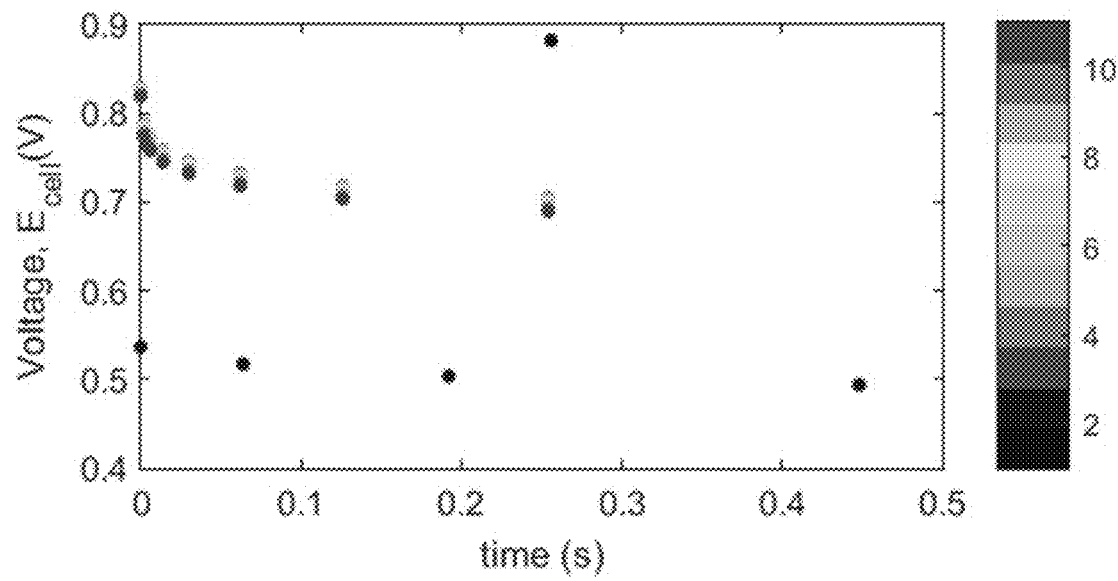
Figure 5C:
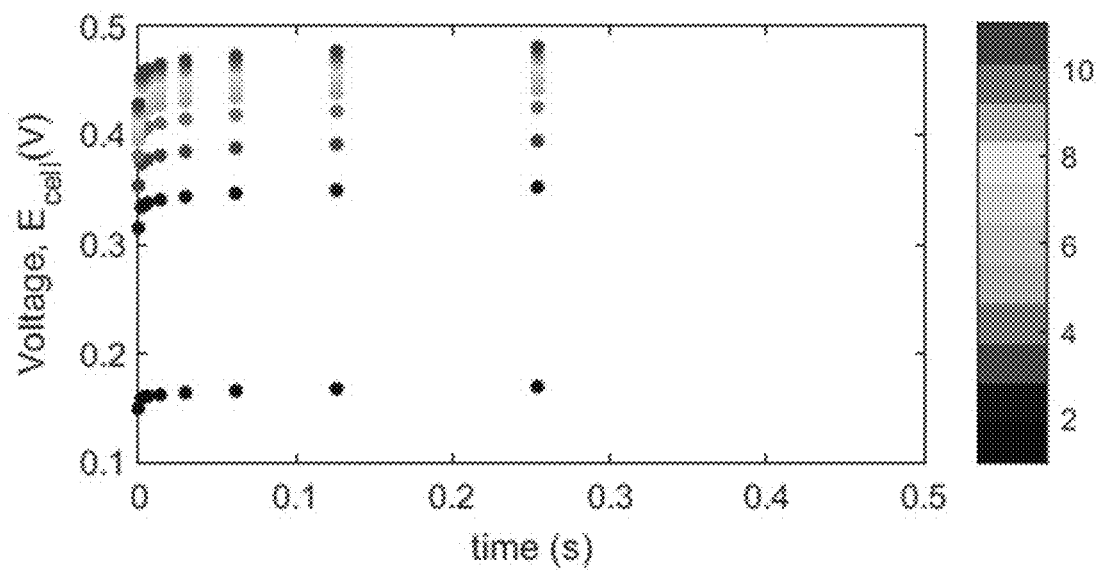
Figure 5D:
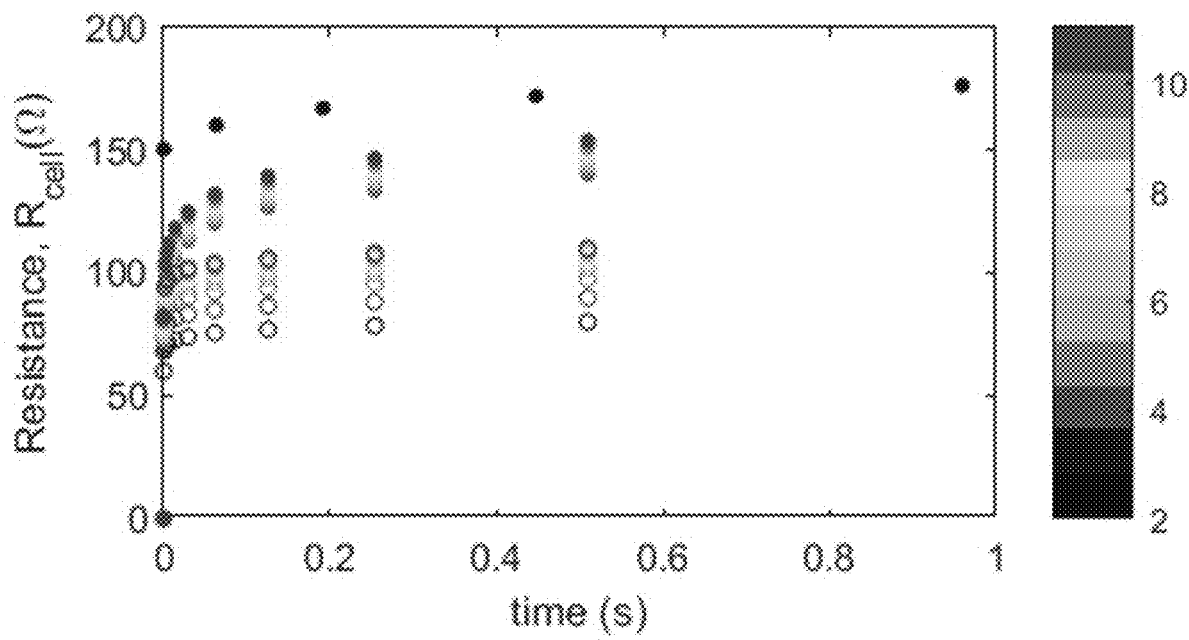
Figure 5E:
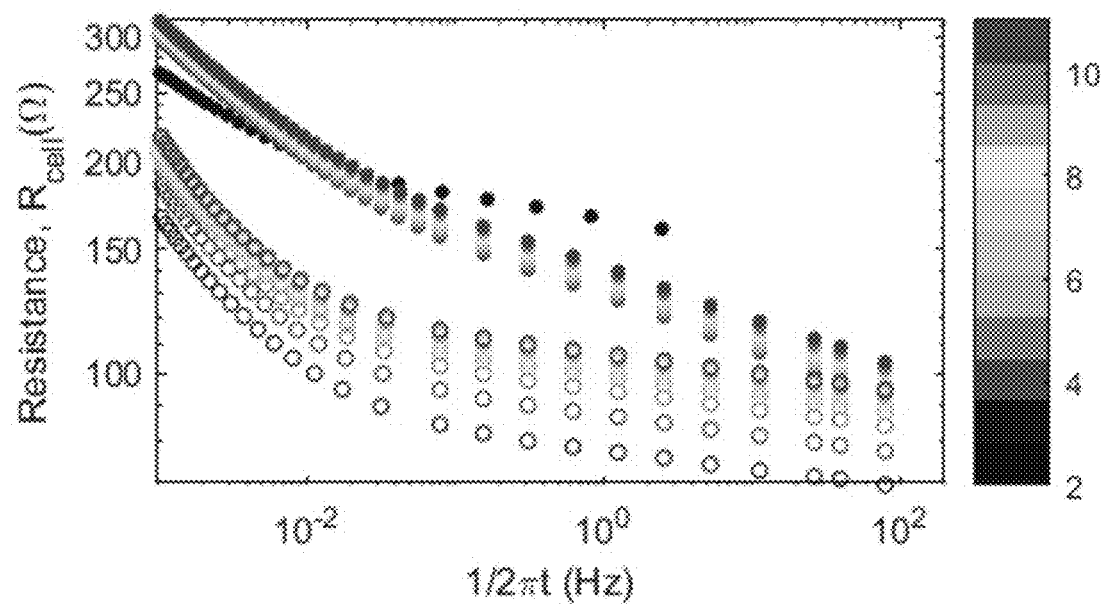

Detailed Procedure of the DCS Technique that is Integrated in Galvanostatic Cycling The DCS method can be integrated in galvanostatic cycling without applying additional pulse currents. FIGS. 5A-5E illustrate representative results of the integration of the DCS method in galvanostatic cycling. We created a half cell of hard carbon lattice [9] and Li using a 2032 coin cell and 1.0 M lithium hexafluorophosphate in 1:1 (v/v) ratio of ethylene carbonate: diethyl carbonate. We conducted galvanostatic cycling at 50 mA/g for the 1st cycle and 200 mA/g for the following 10 cycles with the cell relaxation for 10 seconds after each discharge/charge cycle. FIG. 5A shows discharge-charge curves with the voltage changes during the cell relaxation. Initial voltage changes during discharge/charge cycles are extracted in FIGS. 5B and 5C, and resistance evolutions were calculated by dividing voltages by the magnitude of the applied currents, as shown in FIG. 5D. FIG. 5E shows Bode amplitude plots, converted from FIG. 5D. The Bode amplitude plots in FIG. 5E show the change of resistance evolutions, which can be attributed to dynamics with different time constants during cycling.

EXAMPLE 5: ASSIGNING RESISTANCES EVOLVED AT DIFFERENT TIME CONSTANTS AND INVESTIGATING RESISTANCE CHANGES OVER CYCLE USING HARD CARBON-Li HALF CELL

Figure 6A:
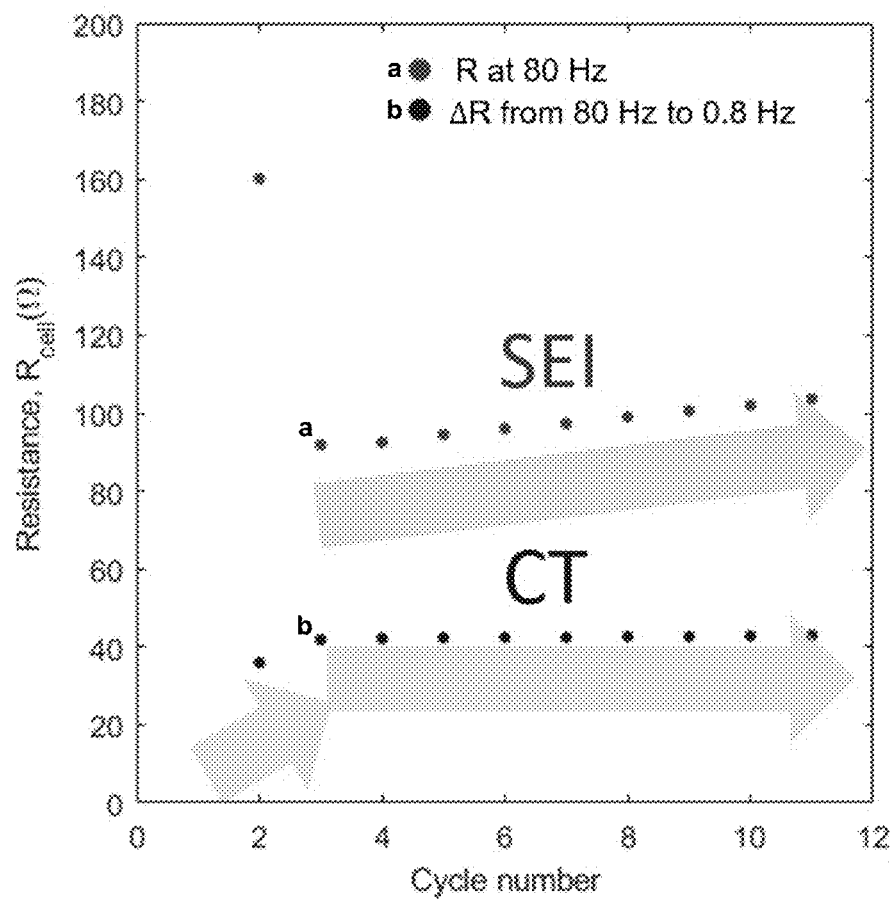
FIG. 6A: Resistance changes over the cycle, measured by taking resistance at 80 Hz, attributed to solid electrolyte interphase (SEI) resistance, and taking resistance evolution from 80 Hz to 0.8 Hz, attributed to charge transfer (CT) resistance, for discharge cycle in FIG. 5E.
Figure 6B:
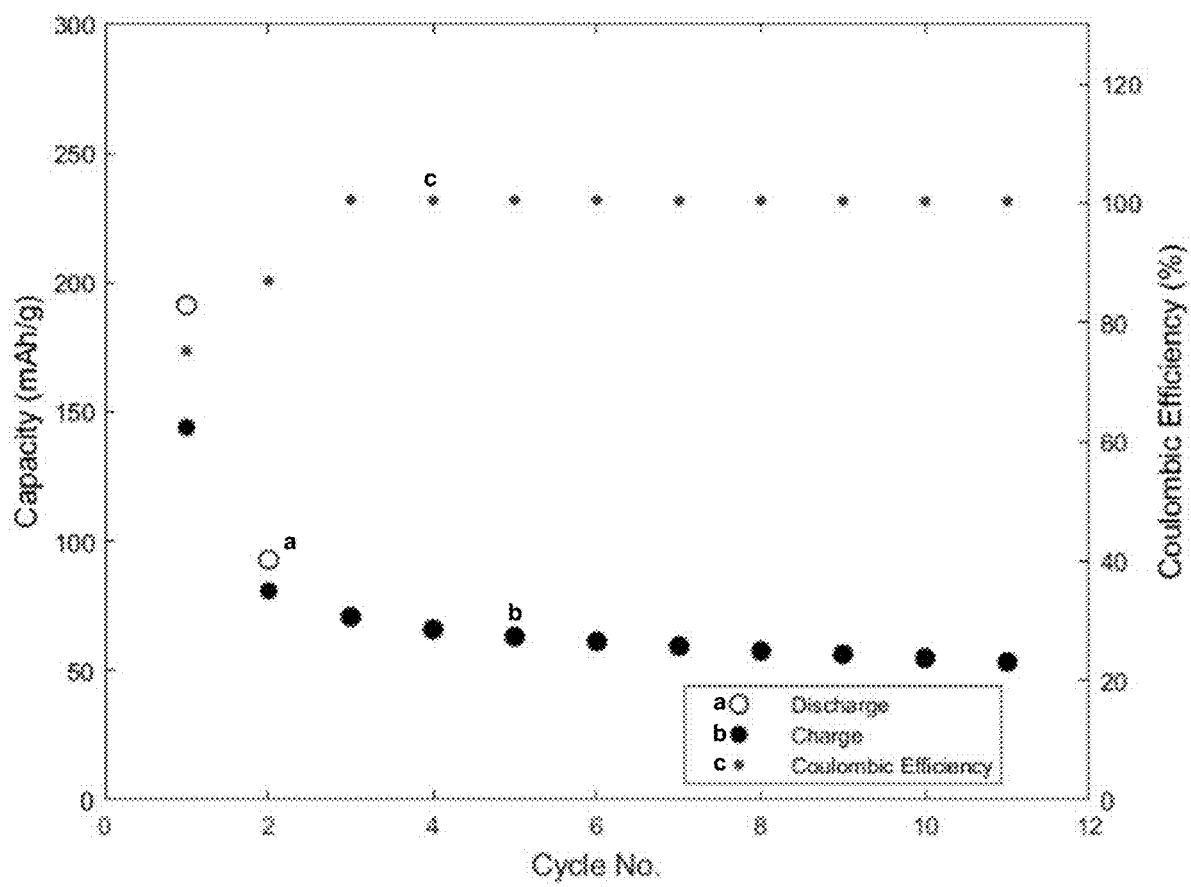
FIG. 6B shows discharge/charge capacities and coulombic efficiencies over the cycle.

The evolving resistances at different time/frequencies can be understood in terms of the dynamics with different time constants, as often demonstrated by EIS measurements. As a representative example, the resistance evolution obtained by the DCS method for the hard carbon-Li half cell in FIGS. 5A-5E can be separated into two dynamic battery components: (1) Resistances at the highest frequency in our measurement, 80 Hz were assigned to the summation of resistances of solid electrolyte interphase (SEI) formed on the hard carbon electrode and contact resistances, and (2) charge transfer resistance, evolved from 80 Hz to 0.8 Hz, the frequency around the inflection point in FIG. 5E. FIG. 6A shows these assigned resistances for the discharge cycles, which cannot be obtained by conventional current interrupt methods. The charge transfer resistance increased up to the 3rd cycle and then became stable at ~42 Ohms; the SEI resistances decreased to 92 ohms until the 3rd cycle and increased over cycling. FIG. 6B shows discharge/charge capacities and coulombic efficiencies in the same system. The coulombic efficiencies reached ~100% at the 3rd cycle, indicating a stable SEI formation. This agrees with the trends of SEI and charge transfer resistances in FIG. 6A: the decrease of SEI resistance up to the 3rd cycle and stabilizing charge transfer resistance at the 3rd cycle. After the 3rd cycle, capacities decreased with maintaining ~100% of coulombic efficiencies, which may be due to the SEI resistance increase shown in FIG. 5A. It is worth noting that these discussions with resistances originated from different dynamics are often undertaken with EIS results; however, the incorporated DCS method can extract these distinguished resistances without additional experiments.

References Corresponding To Examples 1-5

1. van Heuveln, F. H. Analysis of Nonexponential Transient Response Due to a Constant-Phase Element. *J. Electrochem. Soc.* 1994, 141, 3423-3428, doi:10.1149/1.2059348.
2. Fly, A.; Chen, R. Rate dependency of incremental capacity analysis (dQ/dV) as a diagnostic tool for lithium-ion batteries. *J. Energy Storage* 2020, 29, 101329, doi:10.1016/j.est.2020.101329.
3. Zhang, L.; Liu, F.; Brinkman, K.; Reifsnider, K. L.; Virkar, A. V. A study of gadolinia-doped ceria electrolyte by electrochemical impedance spectroscopy. *J. Power Sources* 2014, 247, 947-960, doi:10.1016/j.jpowsour.2013.09.036.
4. Bonora, P. L.; Deflorian, F.; Fedrizzi, L. Electrochemical impedance spectroscopy as a tool for investigating underpaint corrosion. *Electrochim. Acta* 1996, 41, 1073-1082, doi:10.1016/0013-4686(95)00440-8.
5. Jüttner, K. Electrochemical impedance spectroscopy (EIS) of corrosion processes on inhomogeneous surfaces. *Electrochim. Acta* 1990, 35, 1501-1508, doi: 10.1016/0013-4686(90)80004-8.
6. Saleh, F. S.; Easton, E. B. Diagnosing Degradation within PEM Fuel Cell Catalyst Layers Using Electrochemical Impedance Spectroscopy. *J. Electrochem. Soc.* 2012, 159, B546-B553, doi:10.1149/2.098205jes.
7. Ovejas, V. J.; Cuadras, A. State of charge dependency of the overvoltage generated in commercial Li-ion cells. *J. Power Sources* 2019, 418, 176-185, doi: 10.1016/j.jpowsour.2019.02.046.
8. Zhang, S.; Ding, M. S.; Xu, K.; Allen, J.; Jow, T. R. Understanding solid electrolyte interface film formation on graphite electrodes. *Electrochem. Solid-State Lett.* 2001, 4, 206-209, doi:10.1149/1.1414946.
9. Narita, K.; Citrin, M. A.; Yang, H.; Xia, X.; Greer, J. R. 3D Architected Carbon Electrodes for Energy Storage. *Adv. Energy Mater.* 2021, 11, 1-13, doi:10.1002/aenm.202002637.
10. Steinhauer, M.; Risse, S.; Wagner, N.; Friedrich, K. A. Investigation of the Solid Electrolyte Interphase Formation at Graphite Anodes in Lithium-Ion Batteries with Electrochemical Impedance Spectroscopy. *Electrochim. Acta* 2017, 228, 652-658, doi:10.1016/j.electacta.2017.01.128.

EXAMPLE 6: FORMULATION, STRUCTURE, AND RESISTANCE OF SOLID ELECTROLYTE INTERPHASE AT MULTIPLE LENGTH SCALES

Solid state electrolyte (SEI) is associated with most of the degradation mechanisms of anodes in lithium-ion batteries. In this study, deterministic, periodic, and mechanically resilient 3D architected carbon electrodes with a thickness of >600 μm and a coin cell were used to assemble a half-cell with 1M $LiPF_6$ in 1:1 (v/v) ratio of EC: DEC for studying the formation, structure-resistance relationship, and position-dependent growth of SEI by combining the newly developed DC-based technique and depth analysis using secondary ion mass spectroscopy (SIMS) as post-characterization. We discovered that Li consumption estimation for SEI growth using the cumulative ΔQ, defined as the difference of capacity at each cycle and the last cycle, showed a strong linear correlation with the Li amount in SEI obtained by SIMS. The total counts of F in SEI obtained by SIMS showed a good correlation with SEI resistance evolution, which may be attributed to the formation of LiF, an ionic insulator, during SEI growth. The SIMS analysis along the electrode-thickness direction revealed a higher amount of Li and a lower amount of F in SEI toward the separator side, which implies that the consideration of LiF components as multi-layer SEI may be necessary for precise estimations of battery aging. These results provide new insights for battery aging of thick electrodes with fast charging.

Introduction

Improving the cycle life of Li-ion batteries is critical to reducing the environmental and economic impacts of the productions and disposal of batteries and to meeting ever-growing energy demands in modern human society. In battery operation, solid electrolyte interphase (SEI) is formed on the surface of anodes when potentials at the interface with an electrolyte are lower than the stability window of the electrolyte. The formed SEI covers the electrode surface, which protects from aggressive electrolyte decomposition and enables reversible lithiation/delithiation. However, the growth of SEI leads to battery degradation over long-term operation.

The degradation mechanisms of Li-ion batteries have been extensively investigated and proposed [1-5]. Table 1 summarizes the mechanisms associated with anodes in a cell using a liquid electrolyte [5]. Electrolyte decomposition and SEI formation are associated with most of the degradation effects: 1) loss of cyclable lithium inventory [6], 2) impedance increase [7], 3) decrease of accessible surface area for lithiation/delithiation reactions, and 4) decrease of porosity, which limits Li-ion transport in an electrolyte [8]. These SEI-related degradation mechanisms can be linked to three different kinetics about SEI: a) Li consumption to form SEI, b) structure-property relationship of SEI, and c) position-dependent SEI growth.

TABLE 1

Li-ion battery degradation mechanism associated with an anode. Adopted from [5].

| Cause | Effect | Leads to | Reduced by | Enhanced by |
|---|---|---|---|---|
| Electrolyte decomposition (→SEI) (Continuous side reaction at low rate) | Loss of lithium Impedance rise | Capacity fade Power fade | Stable SEI (additives) Rate decreases with time | High temperatures High SOC (low potential) |
| Solvent co-intercalation, gas evolution and subsequent cracking formation in particles | Loss of active material (graphite exfoliation) Loss of lithium | Capacity fade | Stable SEI (additives) Carbon pre-treatment | Overcharge |
| Decrease of accessible surface area due to continuous SEI growth | Impedance rise | Power fade | Stable SEI (additives) | High temperatures High SOC (low potential) |
| Changes in porosity due to volume changes. SEI formation and growth | Impedance rise Overpotentials | Power fade | External pressure Stable SEI (additives) | High cycling rate High SOC (low potential) |
| Contact loss of active material particles due to volume changes during cycling | Loss of active material | Capacity fade | External pressure | High cycling rate High DOD |
| Decomposition of binder | Loss of lithium Loss of mechanical stability | Capacity fade | Proper binder choice | High SOC (low potential) High temperatures |

TABLE 1-continued

Li-ion battery degradation mechanism associated with an anode. Adopted from [5].

| Cause | Effect | Leads to | Reduced by | Enhanced by |
|---|---|---|---|---|
| Current collector corrosion | Overpotentials Impedance rise Inhomogeneous distribution of current and potential | Power fade Enhances other ageing mechanisms | Current collector pre-treatment (?) | Overdischarge Low SOC (high potential) |
| Metallic lithium plating and subsequent electrolyte decomposition by metallic Li | Loss of lithium (Loss of electrolyte) | Capacity fade (power fade) | Narrow potential window | Low temperature High cycling rates Poor cell balance Geometric misfits |

Precise estimation of the amount of Li consumed for the SEI formation is essential to understand Li inventory loss and SEI growth, but has been overlooked. A common parameter used to estimate capacity used for SEI formation is irreversible capacity loss, which is defined as the difference between charge capacity and discharge capacity [2,9-11]. In particular, the irreversible capacity loss for the first cycle is often used as a parameter that represents SEI formation for carbon electrodes with different microstructure or surface modifications [9]. For the long cycle operation, cumulative irreversible capacities follow time$^{0.5}$ scaling, consistent with transport-limited surface layer growth [11,12]. These studies mostly employ electrochemical characterizations; it has not been experimentally demonstrated yet that irreversible capacity represents the consumption of Li for SEI formation with non-electrochemical characterizations.

Experimental investigations on the structure and property relationship of SEI have been conducted mostly using a thin electrode. SEI formed on a Cu film has been studied by electrochemical impedance spectroscopy (EIS) and secondary ion mass spectroscopy (SIMS), which showed nonlinear resistance change as a function of SEI thickness [13,14]. Individual SEI components, $Li_2O$ and LiF, were grown on Li metal at the same scale as SEI (i.e. tens nanometers) and evaluated for their conductivities: ~$1 \times 10^{-9}$ S cm$^{-1}$ for $Li_2O$ and ~$5 \times 10^{-10}$ S cm$^{-1}$ for LiF. [15,16]. Investigating the multicomponent SEI formed on porous electrodes has been challenging because of its inhomogeneous formation [17], complex structure [18], air-sensitivity [19], and sensitivity to cell and cycling conditions [18,20-22]. Fluorine-containing binders (e.g. polyvinylidene difluoride (PVdF)) and transition metal oxide cathodes also have an influence on the SEI formation and structure, for instance, facilitating LiF formation [23,24] and transition metal incorporation [25], respectively.

Position-dependent SEI formation has been proposed by numerical simulations [26-28]. SEI grows faster at the position closer toward the separator along the through-thickness direction because of ion consumption in the electrolyte during lithiation processes. Pinson proposed that the position-dependent SEI formation is more noticeable for a thick electrode (e.g. 250 μm) with fast charging (e.g. 3C), which causes strong depletion of the electrolyte. The position-dependent SEI growth behaviors have not been experimentally demonstrated, mostly because of the deviation of local structural factors between experiments and simulations. The porous electrode theory adopted in Newman's model averages local structural factors in planes parallel to the stacked layers in a cell. In contrast, the local SEI growth in slurry electrodes may be significantly affected by these local structural factors, such as local porosity and tortuosity. This indicates that structure characterization of SEI at the nanoscale may not show a representative structure of SEI at a distance from the current collector. Quantifying these local structural factors in a stochastic and nondeterministic structure of slurry electrodes requires additional tomographic imaging and computationally expensive 3D multi-physics modeling. Overall, there is a lack of experimental studies on the relationship of structure, property, and formation of SEI and these variations in porous electrodes along the through-thickness direction.

To provide a systematic understanding of SEI, 3D architected carbon electrodes were employed with independently controlled micrometer-to-centimeter form-factors as a model system to study these SEI formation kinetics with post-characterizations and electrochemical characterizations. A secondary ion mass spectroscopy (SIMS) was used for post-characterizations, which elucidates the structure of SEI at the nanoscale by elemental depth profiles. For electrochemical characterizations, DCS techniques were employed that distinguish different resistance contributions (e.g. SEI resistance vs charge transfer resistance) using constant currents or DC measurement. The deterministic, interconnected, periodic, and non-tortuous 3D architected carbon allows us to decouple complex aging mechanisms associated with SEI from an influence of transport due to local porosity decrease by SEI growth [8], the contribution of inactive materials such as binders and conductive additives to SEI growth, and electrical contact loss or contact resistance increase of active materials. A half-cell with 3D architected carbon as a working electrode and a Li-metal counter and a reference electrode were chosen to eliminate influences by transition metal dissolution from cathodes and cyclable Li-inventory loss. The mechanical resilience of 3D architected carbon enables SIMS characterizations at different positions throughout the preserved architecture after cycling. Thus, the experimental set up allows the study of the formation, structure, and resistance of SEI at the nanoscale and their position-dependency throughout porous electrodes at the sub-millimeter scale, not feasible by slurry electrodes or in-situ techniques using thin film electrodes.

Brief Procedures of Position-Dependent SEI Characterization using 3D Architected Carbon Electrodes FIGS. 7A-7F overview procedures to investigate SEI on 3D architected carbon electrodes; 1) fabricating 3D architected carbon electrodes with prescribed form factors, 2) conducting galvanostatic cycling using a coin cell, 3) disassembling the cell, rinsing the electrode, creating a cross-section, and coating the cross-section by gold in a glovebox, and 4) performing depth analysis by SIMS at different positions on the cross-section from the current collector side to separator side. First, we fabricated the 3D carbon by DLP 3D printing and post-exposure pyrolysis processes at 1000° C. Representative architected carbon samples used for cycling and SIMS analysis were disk-shaped composed of cuboid unit cells with a diameter of ~6 mm, a porosity of ~70%, and varied thicknesses of 0.6-1.1 mm. Diameters and intervals of the beams were ~35 mm and ~72 mm for the through-plane direction of the disk sample and ~22 mm and ~93 mm for the in-plane direction. The microstructure of the 3D carbon was disordered structures composed of several stacked graphitic layers. A 2032 coin cell was used to assemble a half-cell with the 3D architected carbon electrodes and a Li-metal counter and reference electrode. An electrolyte of 1M $LiPF_6$ in 1:1 (v/v) ratio of EC: DEC was flooded in the cell. For the selected electrodes, a polypropylene washer was inserted surrounding the caron electrode to minimize Li-ion transport from the side and effectively investigate an effect of Li-ion transport along the electrode thickness direction (denoted as with washer in Table 2).

TABLE 2

The number of samples, categorized by cell-making conditions: the presence/absence of washer and reassembling process. Reassembly indicates that the cell was disassembled after the 24-hour rest and reassembled for galvanostatic cycling. One sample assembled without a washer and reassembling process was discharged (i.e., lithiated) before SIMS analysis.

|  | Without washer | With washer |
| --- | --- | --- |
| Single assembly | N = 5 (2* for SIMS) | N = 2 (1 for SIMS) |
| Reassembly | N = 1 | N = 2 (2 for SIMS) |

The assembled cells were first rested for more than 4 hours to ensure complete electrolyte wetting. As the extreme case exhibiting different SEI formation and structure, two selected cells were rested for more than 24 hours and disassembled in an Ar-filled glove box. The carbon electrodes were then rinsed by the 1M $LiPF_6$ in EC: DEC and used for assembling a new coin cell with fresh electrolyte and Li-metal (denoted as Reassembly in Table 2). The cells were subject to galvanostatic processes at 50 mA $g^{-1}$ for one cycle to form a stable SEI and at 200 mA $g^{-1}$ for 10 cycles to cause polarization in the electrolyte and investigate position-dependent SEI formation. Potentiostatic electrochemical impedance spectroscopy was conducted after the first cycle and 11th cycles. One sample assembled without a washer underwent another discharge half-cycle at 20 mA $g^{-1}$ as a reference to quantity Li concentrations in carbon and SEI as discussed later. The cycled cells were disassembled, rinsed by dimethyl carbonate, and dried in a glovebox. The dried cells were cut into a semi-circle disk shape, and the cross-section was coated with gold to prevent direct air exposure during the transfer to a SIMS instrument. The number of samples characterized by SIMS is summarized in Table 2. The depth analyses of 6 different secondary ions (7Li, 12C, 16O1H, 19F, 31P, and 197Au) were conducted at 3-5 different positions on the cross-section along the electrode thickness direction by $Cs^+$ sputtering through a protective gold layer. Note that one sample without a washer and single assembly, and which ended the cycling process with charge (i.e., delitiation), was characterized by different secondary ions for Li (7Li16O).

Table 2 summarizes the number of tested samples with different cell-making conditions. We show the results of cycling and the SIMS analysis using the sample with a single assembly and a washer as a representative sample. For another sample type, such as the sample with washer and reassembly, the results are summarized in FIGS. 13A-13E.

Galvanostatic Cycling and Capacity Loss

Figure 8A:
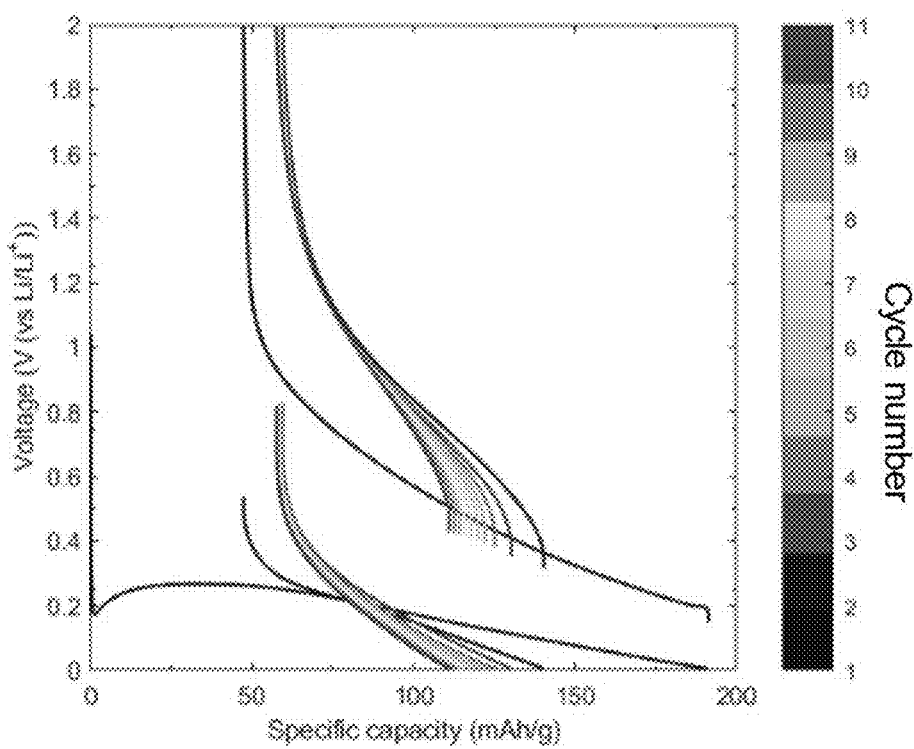
FIGS. 8A-8F: Representative electrochemical characterization results with 3D architected carbon electrodes using galvanostatic cycling.

FIGS. 8A-8F illustrate electrochemical characterization results obtained by galvanostatic cycling using the 3D architected carbon electrodes with the cell-making condition of a single assembly and a washer. FIG. 8A contains discharge and charge profiles of the first cycle at 50 mA $g^{-1}$ and the subsequent ten cycles at 200 mA $g^{-1}$. During the first discharge, the voltage dropped up to ~0.2 V, followed by a gradual increase to 0.27 V with 28 mAh $g^{-1}$ at the local maximum. The voltage then gradually decreased, leading to 191 mAh $g^{-1}$ for the first discharge capacity. During the first charge, the voltage increased without an inflection point, which appeared at 0.2 V during the first discharge. The subsequent cycles at 200 mA $g^{-1}$ showed gradual voltage slopes in discharge and charge profiles, typical behaviors for pyrolytic carbon [29,30].

Figure 8B:
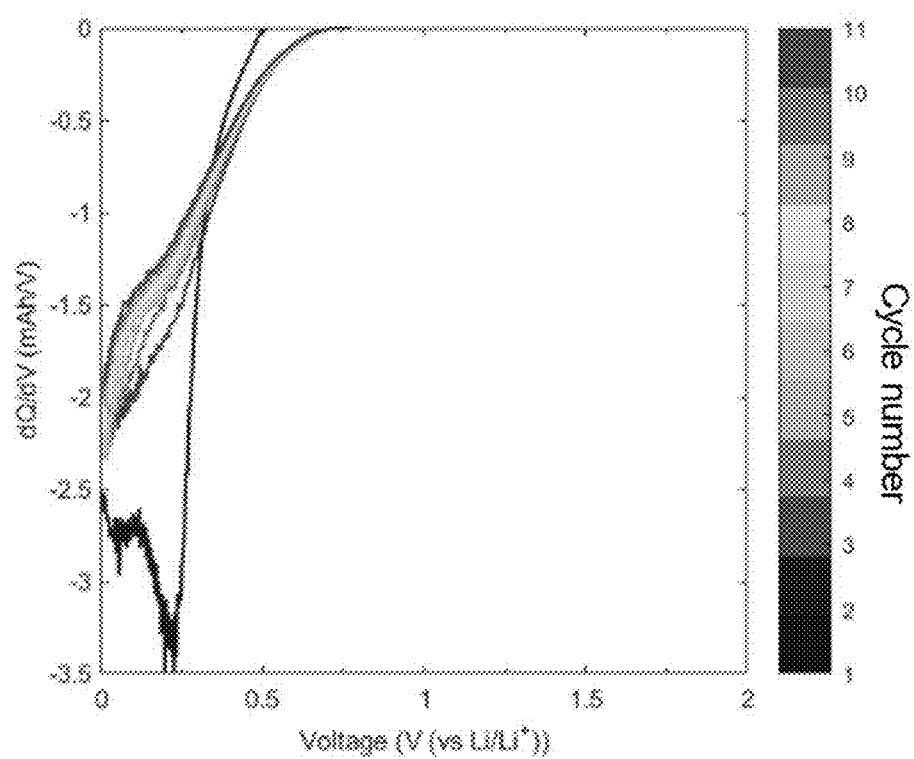
Figure 8C:
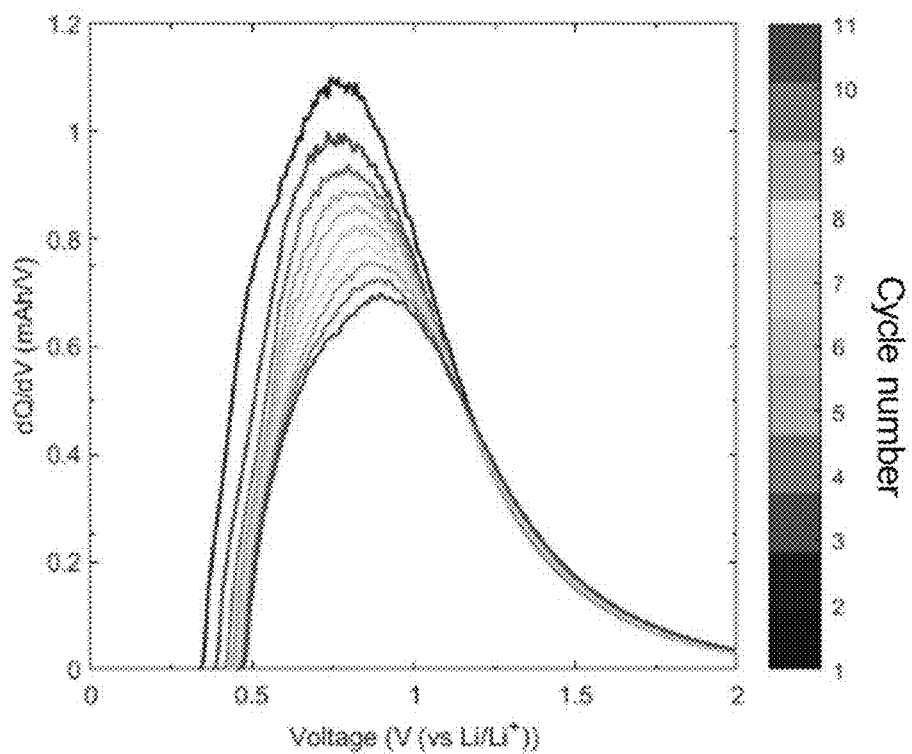

FIGS. 8B and 8C display dQ/dV analysis for discharge and charge from second to 11th cycle. The dQ/dV curves for discharge show peaks at ~0.05 V and ~0.22 V at the second cycle, which disappeared gradually over the cycles. The dQ/dV at >0.5 V showed little change over the cycles. During charge, the peak at ~0.78 V for the second cycle shifted to a higher voltage by 0.14 V at 11th cycle. The peak height gradually decreased from 1.1 mAh $V^{-1}$ to 0.69 mAh $V^{-1}$ during cycling. The dQ/dV for charging at >1.2 V showed little change from the second to 11th cycles.

Figure 8D:
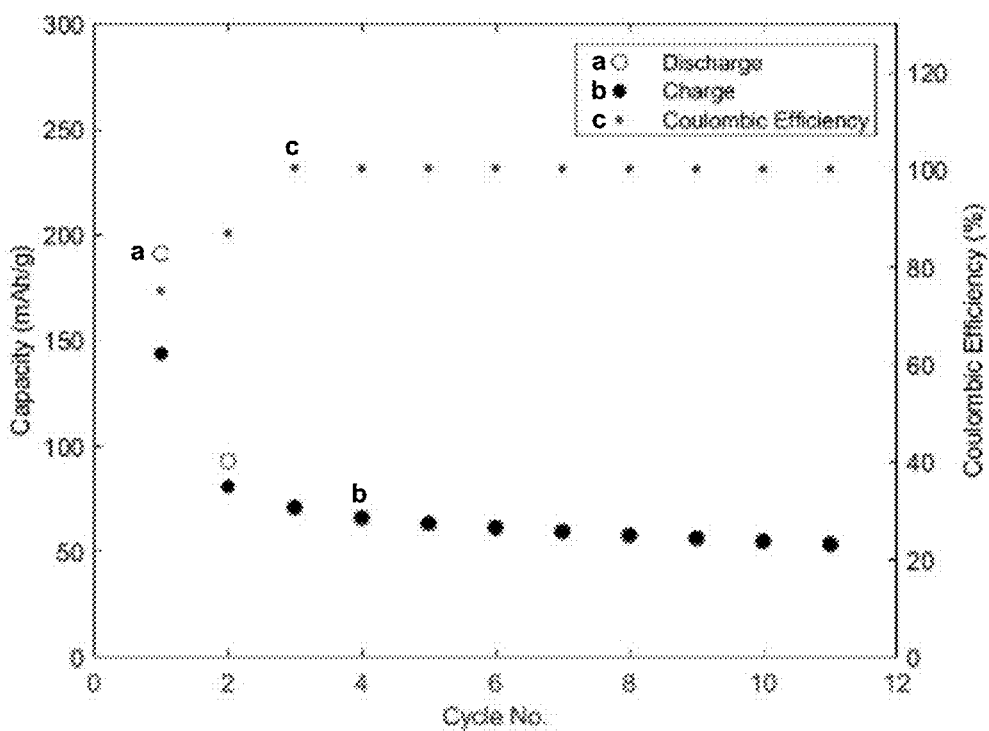

FIG. 8D shows capacities and Coulombic efficiencies over cycling. Discharge and charge capacities at the first cycle were 191 mAh $g^{-1}$ and 143 mAh $g^{-1}$ with 75.2% of Coulombic efficiency. The subsequent cycles at higher currents, 200 mA $g^{-1}$, showed reduced capacities, 93 mAh $g^{-1}$ for the second discharge capacity. The rate performance was limited by diffusion in an electrode. The capacities decreased over the cycles to 53 mAh $g^{-1}$. The Coulombic efficiencies were 87.0% for the second reached ~100% from the third cycle.

To estimate SEI growth from capacities that obtained galvanostatic cycling, we defined two indicators. First, we defined the difference between discharge and charge capacities at each cycle $Q_{irr}$:

$$Q_{irr}^{x} = Q_{dchg}^{x} - Q_{chg}^{x}. \tag{1}$$

Figure 8E:
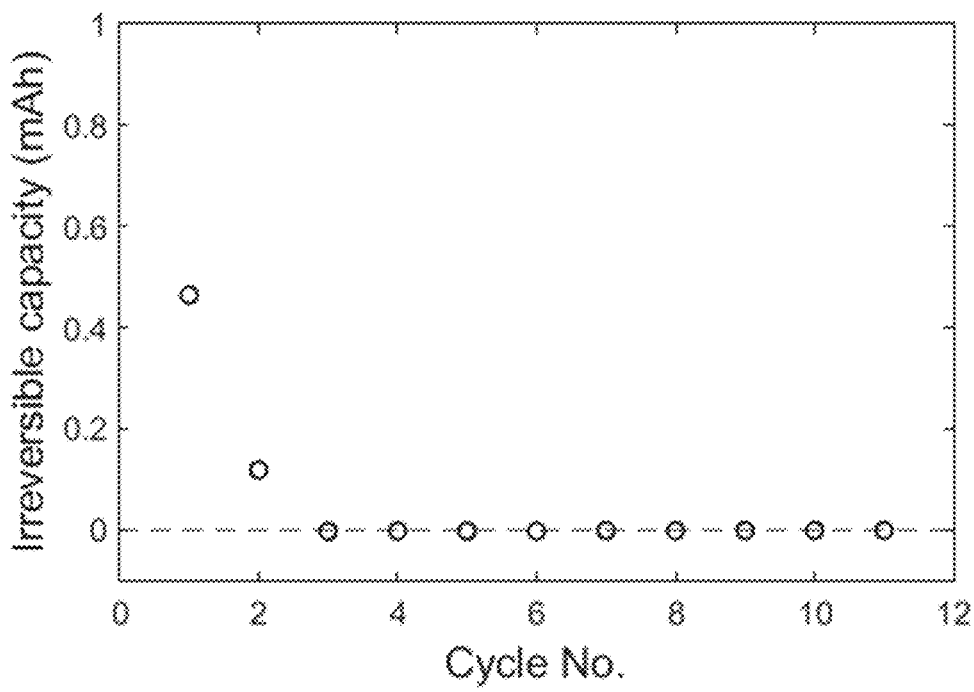

Here, the superscript x indicates a cycle number, and capacity with the subscript "dchg" indicates discharge capacity, "chg" indicates charge capacity, and "irr" indicates an irreversible capacity loss. The irreversible capacity loss, $Q_{irr}$, has been commonly used to estimate SEI formation and growth [2,9-11]. The underlying assumption is that capacity loss between discharge and charge is due to irreversible SEI formation, which consumes electrolyte and Li-ions. FIG. 8E shows the change of $Q_{irr}$ over the cycles. The $Q_{irr}$ decreases over the cycles and reaches approximately zero at the third cycle.

Figure 8F:
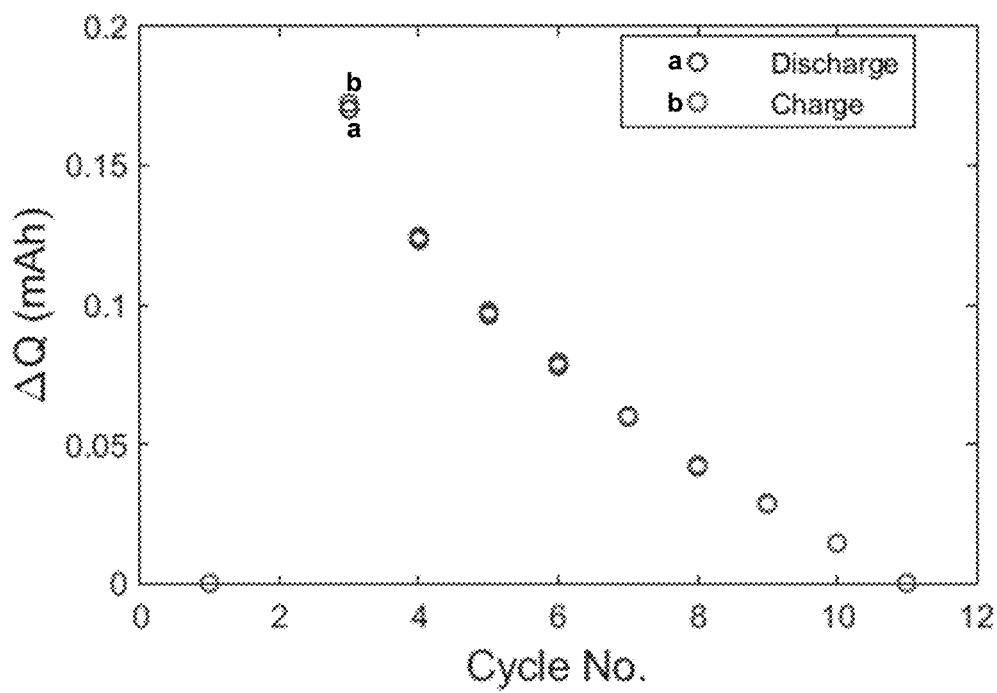

For the second indicator, we defined capacity loss ΔQ for second to 11th cycle as the difference of capacity at each cycle from the last cycle:

$$\Delta Q_{\alpha}^{x} = Q_{\alpha}^{x} - Q_{\alpha}^{last} \tag{2}$$

where subscript α can be discharge or charge, "last" indicates the last cycle (i.e. 11th cycle), and x ranges 2 to 11. ΔQ can be interpreted as an integral of difference of dQ/dV between the last cycle and the cycle of interest within the range of operated voltages (0.005 to 2 V). The concept of ΔQ for SEI growth was demonstrated by Attia [31] with assumptions that storage mechanism and capabilities are consistent over cycles, and the SEI growth approaches zero as the cycle goes because of the rate-limiting transport mechanism for SEI growth [31,32]. FIG. 8F shows the change of ΔQ over cycles. ΔQ decreases with the cycle number from ~0.27 mAh, linearly from sixth cycle with the slope of 0.016 mA cycle$^{-1}$.

Impedance Measurement by AC and DC

Electrochemical Impedance Spectroscopy

Figure 9:
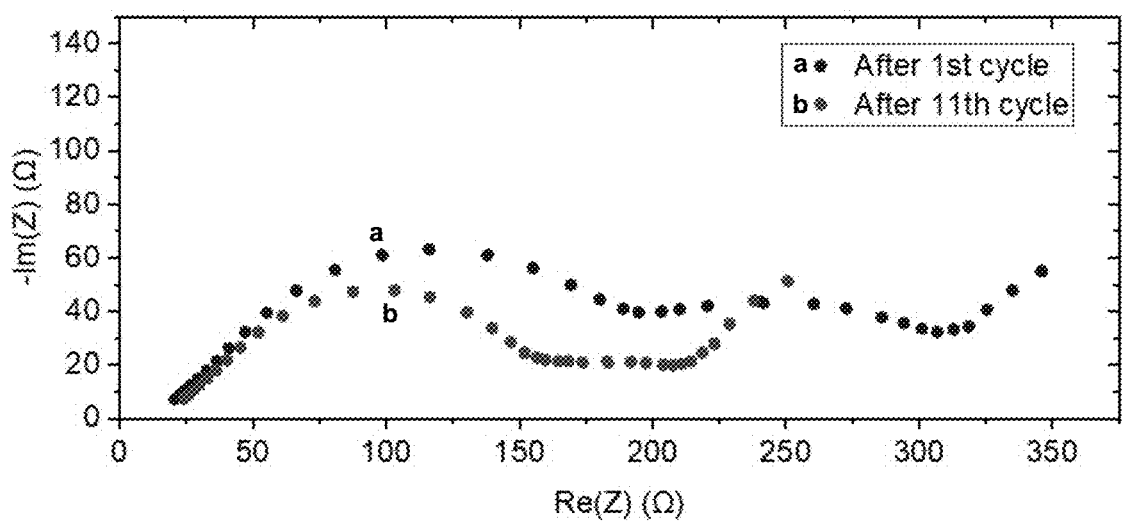
FIG. 9: Nyquist plots of PEIS conducted after the first cycle and 11th cycle using a half-cell composed of Li metal and 3D architected carbon electrode.

FIG. 9 shows representative Nyquist plots of PEIS obtained after the first cycle and 11th cycle for the sample with a single assembly and a washer. Two depressed semicircles with characteristic frequencies of ~10$^2$ Hz (middle frequency) and ~10$^0$ Hz (low frequency), and the Warburg effect associated with diffusion were observed. Some samples show a small semi-circle at high frequencies, ~10$^3$ Hz, overlapped with the semi-circle associated with ~10$^2$ Hz. These frequency ranges, which represent underlying kinetics, agree with previous studies using a half-cell of carbon and Li electrodes [33]. We employed the equivalent circuit models shown in FIGS. 19A-19B to obtain resistances and capacitances attributed to different kinetics. The first parallel circuit associated with high frequencies (~10$^3$ Hz) is attributed to the conductance between 3D architected carbon and a coin cell case; the second parallel circuit at middle frequencies (~10$^2$ Hz) represents the influence of the SEI layer; the third parallel circuit at low frequencies (~10$^0$ Hz) represents the charge transfer reactions. The obtained resistances of SEI ($R_{SEI}$) and charge transfer ($R_{CT}$) are used to evaluate SEI formation and resistance evolutions in a later section.

Direct Current Spectroscopy (DCS) to Evaluate Resistance Evolution

To evaluate resistance evolution in operando without relaxing polarizations in an electrolyte, which is necessary for EIS, DCS (direct current spectroscopy) was employed. DCS monitors potential response to constant current and analyzes it with time constants of dynamics of interest. The constant current can be integrated into galvanostatic cycling or independently applied as a pulse current. Thus the DCS technique was integrated into galvanostatic cycling. The DCS technique with a pulse current is capable of detecting the resistance anisotropy that emerges when the direction of the applied current is reversed, distinguishing between the forward and reverse applied currents. The resistance evolution is obtained by dividing the overpotential at each given time by the applied current, analogous to the impedance evolution obtained by EIS. The Bode magnitude plots obtained by DCS and galvanostatic EIS (GEIS) show good agreement. This DCS technique acquires data up to the time constant of the dynamic process of interest, which renders it significantly more efficient than EIS, which requires measurements at different frequencies separately.

Figure 10A:
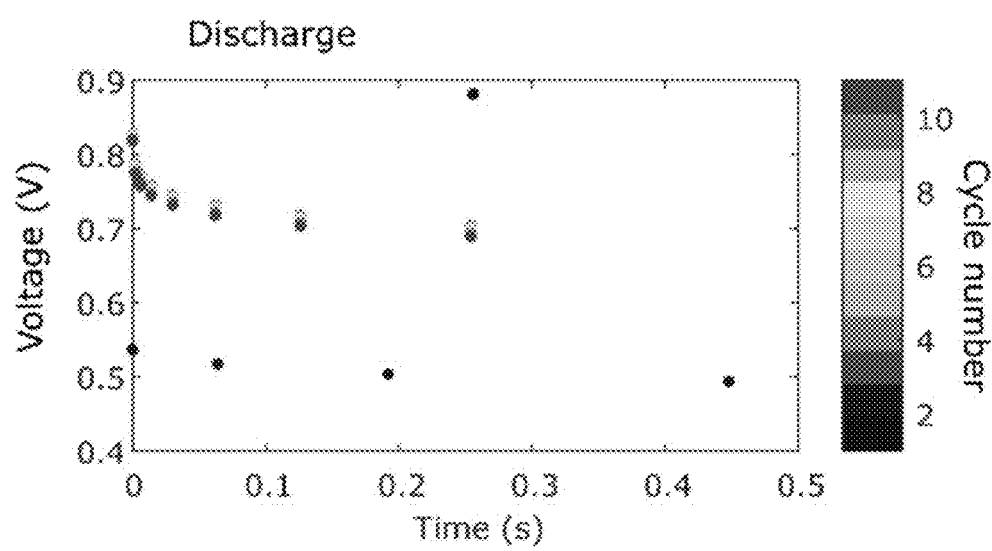
FIGS. 10A-10D: Incorporation of the DCS technique in galvanostatic cycling at 50 mA/g for 1st cycle and 200 mA/g for the following 10 cycles with Li-3D carbon half cell. Voltage changes in (FIG. 10A) discharge cycle and (FIG. 10B) charge cycle over the time since the discharge/charge current applied, (FIG. 10C) resistance evolutions, calculated by dividing voltages by the magnitude of the applied current, and (FIG. 10D) Bode magnitude plots of FIG. 10C. In some embodiments, higher cycle number corresponds to higher Voltage at same time. In some embodiments, higher cycle count/number may generally correspond to higher $R_{cell}$ (Ohm) for charge cycles. In some embodiments, higher cycle count/number may generally correspond to higher $R_{cell}$(Ohm) for discharge cycles. The closed and open circles show discharge and charge cycles, respectively, in FIG. 10C and FIG. 10D. The bars on the right in each figure show the cycle number.
Figure 10B:
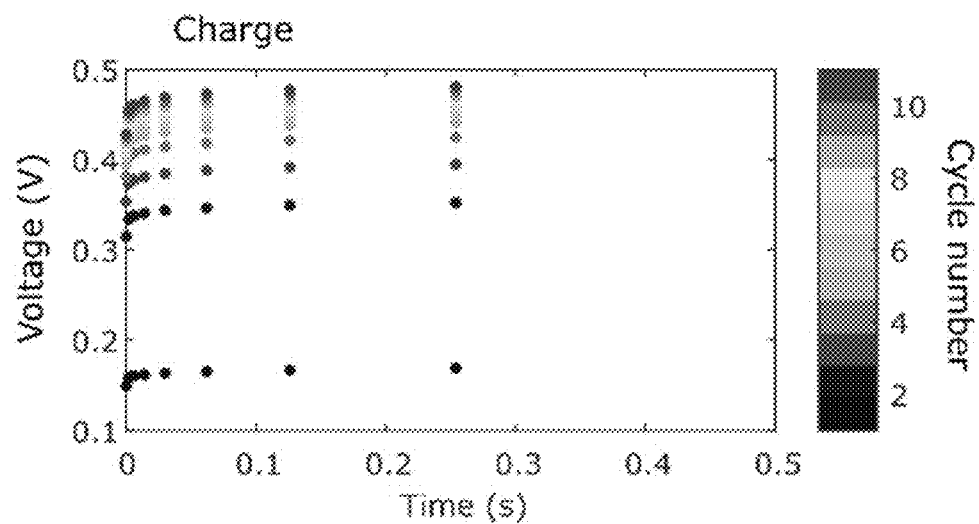
Figure 10C:
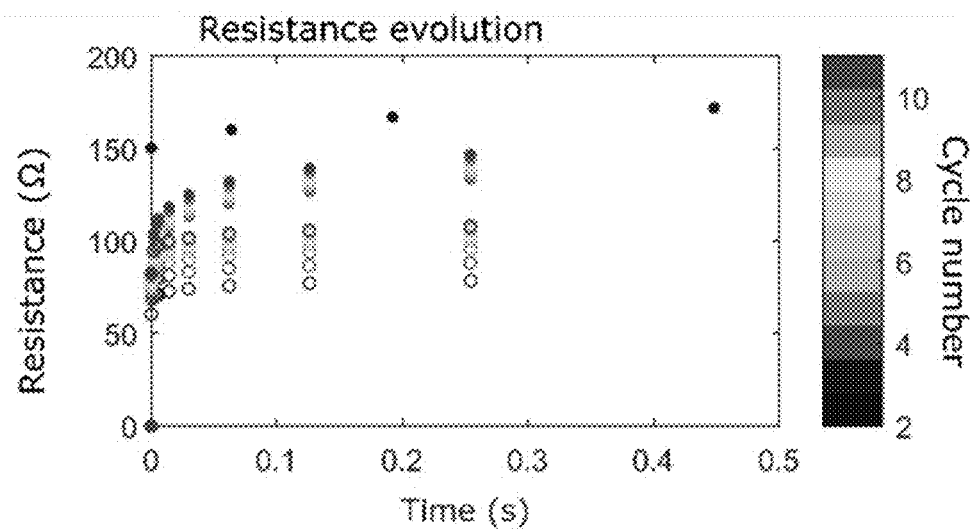
Figure 10D:
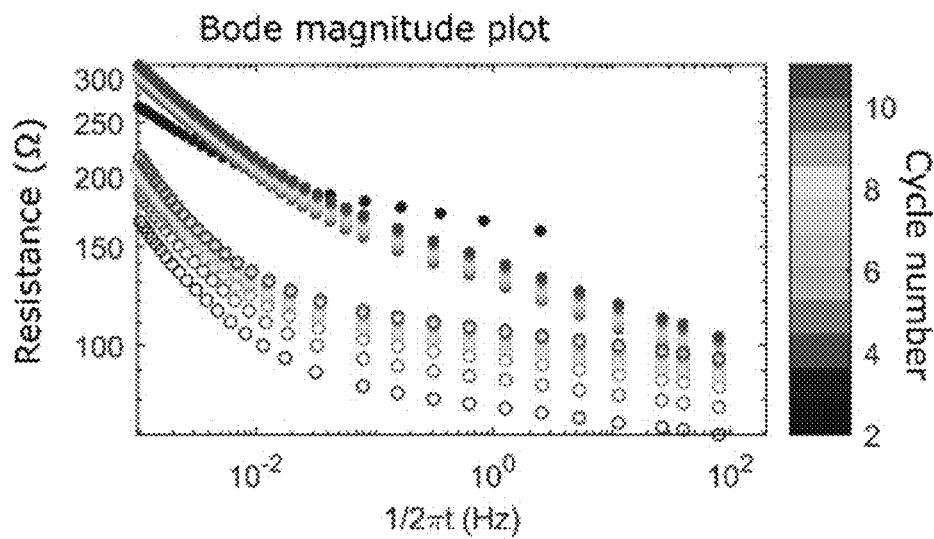

FIGS. 10A-10D illustrate the results of integrating the DCS method in galvanostatic cycling for the sample with a single assembly and a washer. FIGS. 10A and 10B show voltage change up to 0.5 s during discharge/charge cycles, extracted from FIG. 8A. Resistance evolutions were calculated by dividing overpotentials by the applied currents, as shown in FIG. 10C. FIG. 10D shows Bode amplitude plots, converted from FIG. 10C by using $\tau=1/2\pi f$, where $\tau$ indicates time constant, and f indicates frequency. The Bode amplitude plots in FIG. 10D show the change of resistance evolutions, which can be attributed to dynamics with different time constants during cycling.

Figure 11:
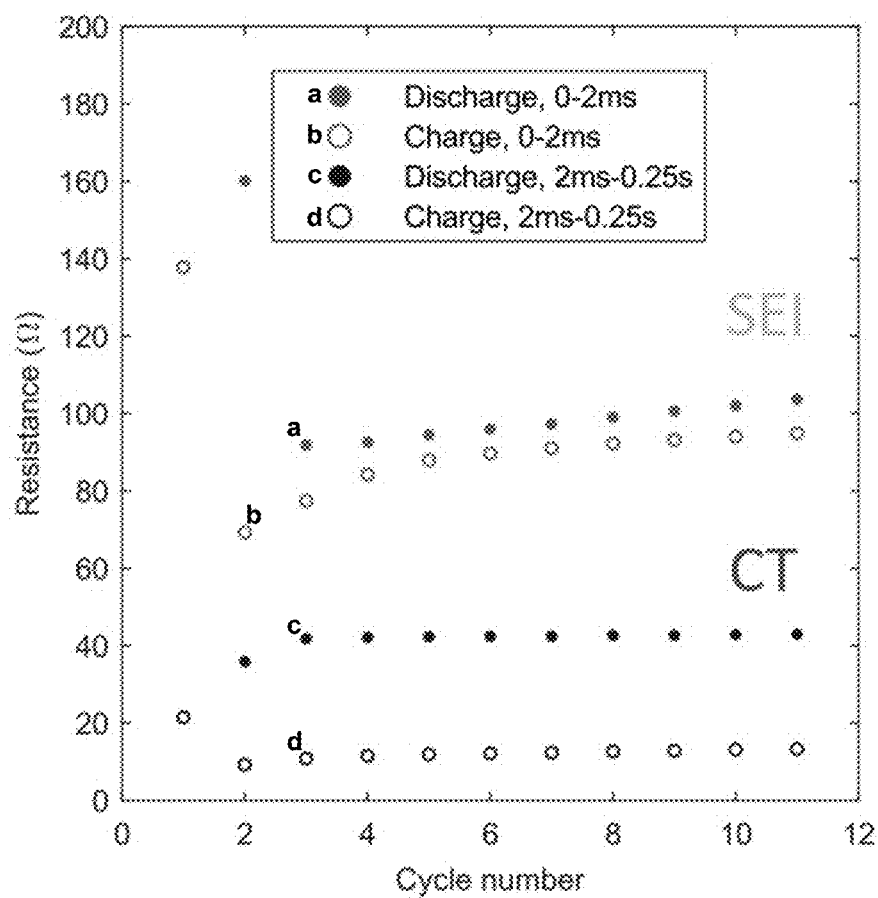
FIG. 11: Resistance changes over the cycle, measured from overpotential at 80 Hz (~0.2 ms), attributed to solid electrolyte interphase (SEI) resistance, and from overpotential evolution from 80 Hz (~0.2 ms) to 0.8 Hz (0.25 s), attributed to charge transfer (CT) resistance in FIG. 10D.

To quantify evolving resistances associated with different time constants or frequencies, we distinguished the voltage responses into two kinetics [33]: (1) resistance contributed from SEI and contact, the measured resistance at 80 Hz, and (2) charge transfer resistance, the resistance evolved from 80 Hz to 0.8 Hz, the frequency around the inflection point in FIG. 10D. FIG. 11 shows these distinguished resistances for discharge and charge cycles. The "discharge" indicates the response to the discharge current (i.e. lithiation) at the delithiated state, and the "charge" indicates the response to the charge current (i.e. delithiation) at the lithiated state. The charge transfer resistance for lithiation increased up to the third cycle and then became stable with ~42Ω. The SEI resistances for lithiation decreased to 92Ω until the third cycle and increased by 12Ω until the 11 h cycle. The resistance of charge transfer and SEI for delithiation showed a similar trend with smaller values than the ones for lithiation. This trend indicates that stable SEI, which facilitates charge transfer reaction, was formed up to the third cycle and continuous SEI growth increased SEI resistance after the third cycle. The observed behavior agrees with capacity loss in FIGS. 8E and 8F, negligible irreversible capacity at the third cycle, and continuous capacity loss ΔQ even after the third cycle.

SIMS Structural Analysis for SEI

Depth profiles of SEI by SIMS

Figure 12:
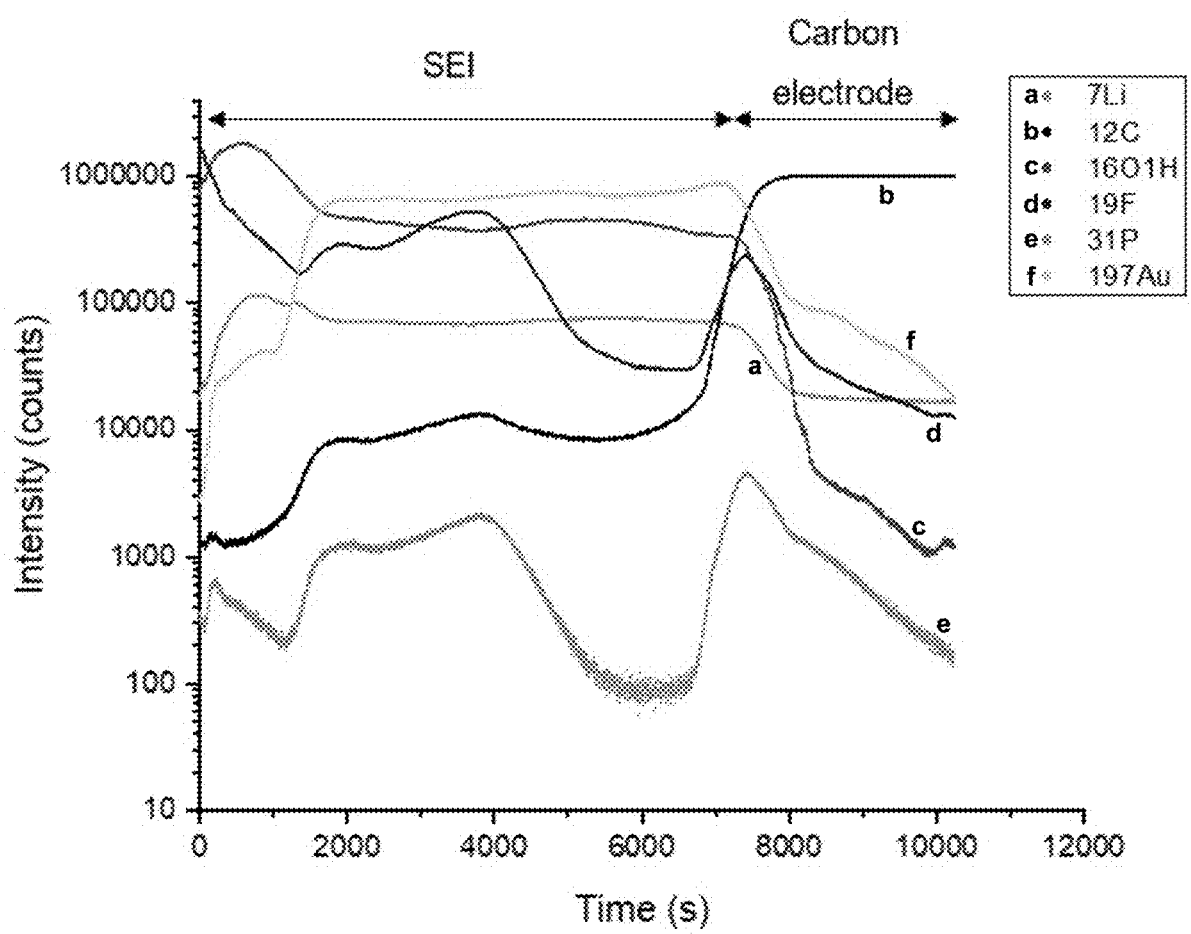
FIG. 12: Depth profiles of SEI on an architected carbon electrode.
Figure 13A:
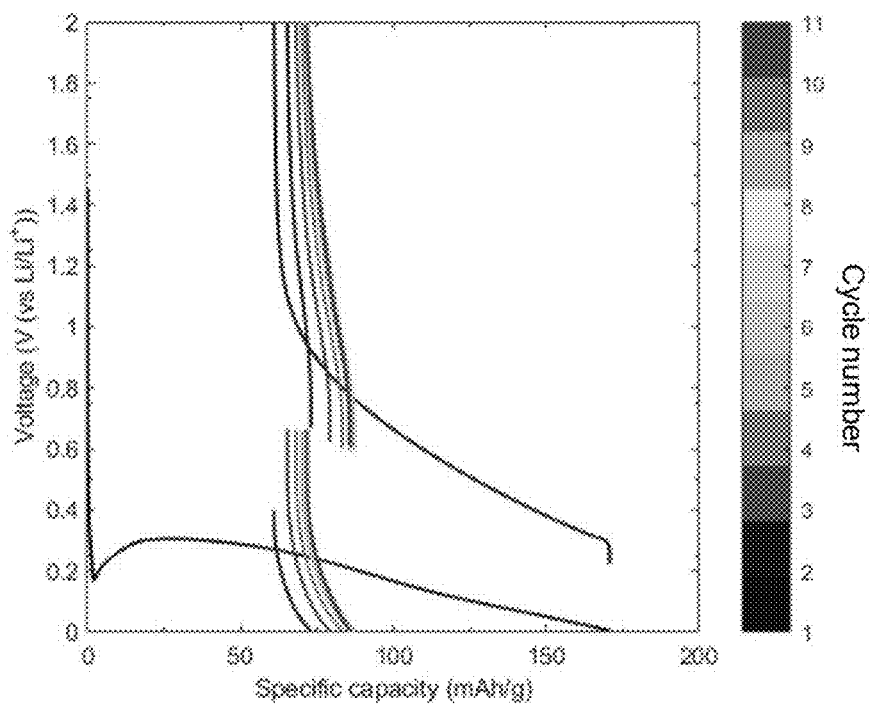
FIGS. 13A-13E: Electrochemical and SIMS results representing cells reassembled with a washer.
Figure 13B:
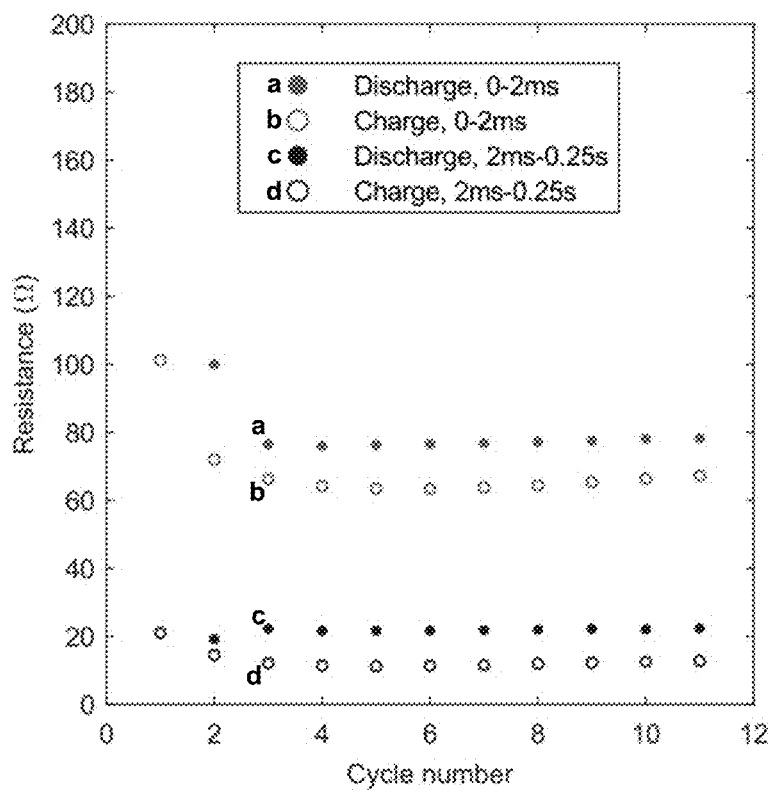
Figure 13C:
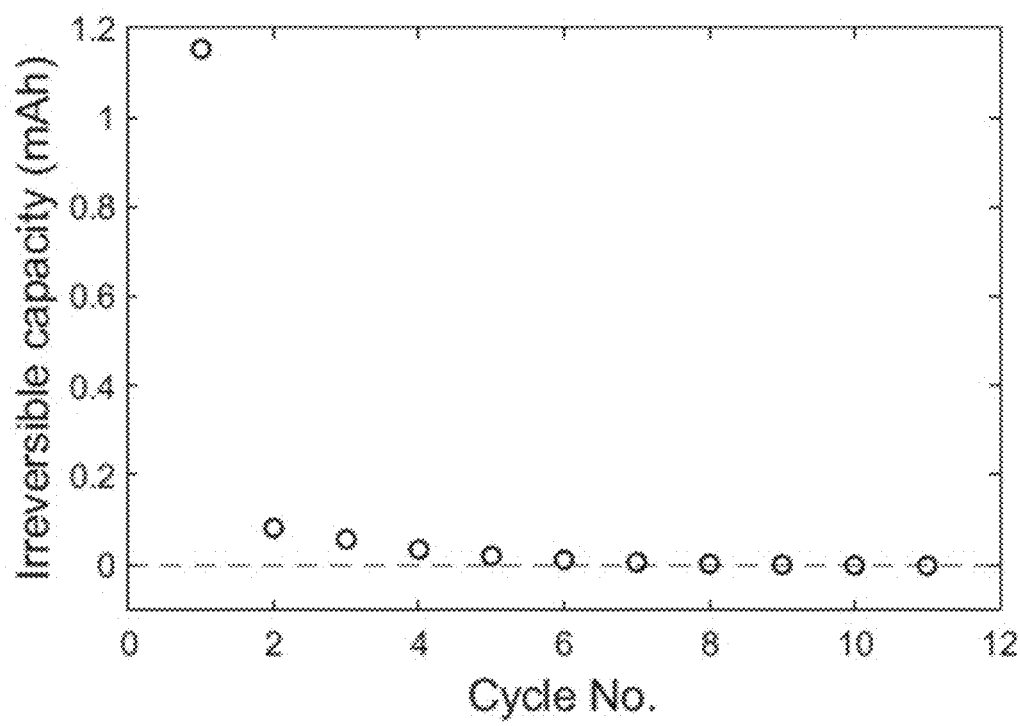
Figure 13D:
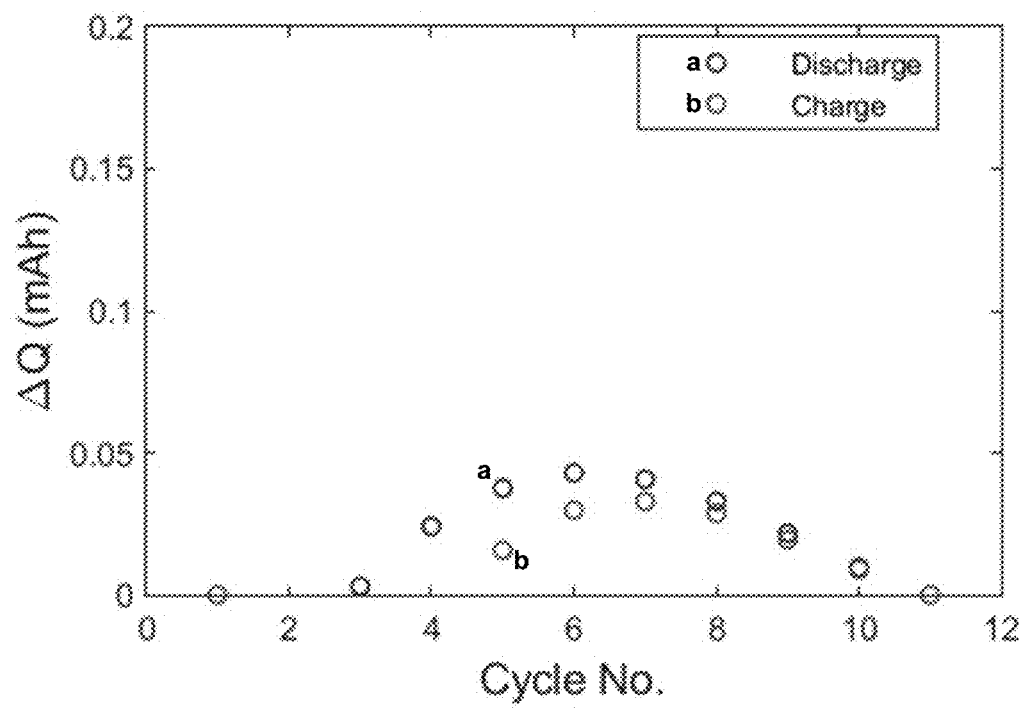
Figure 13E:
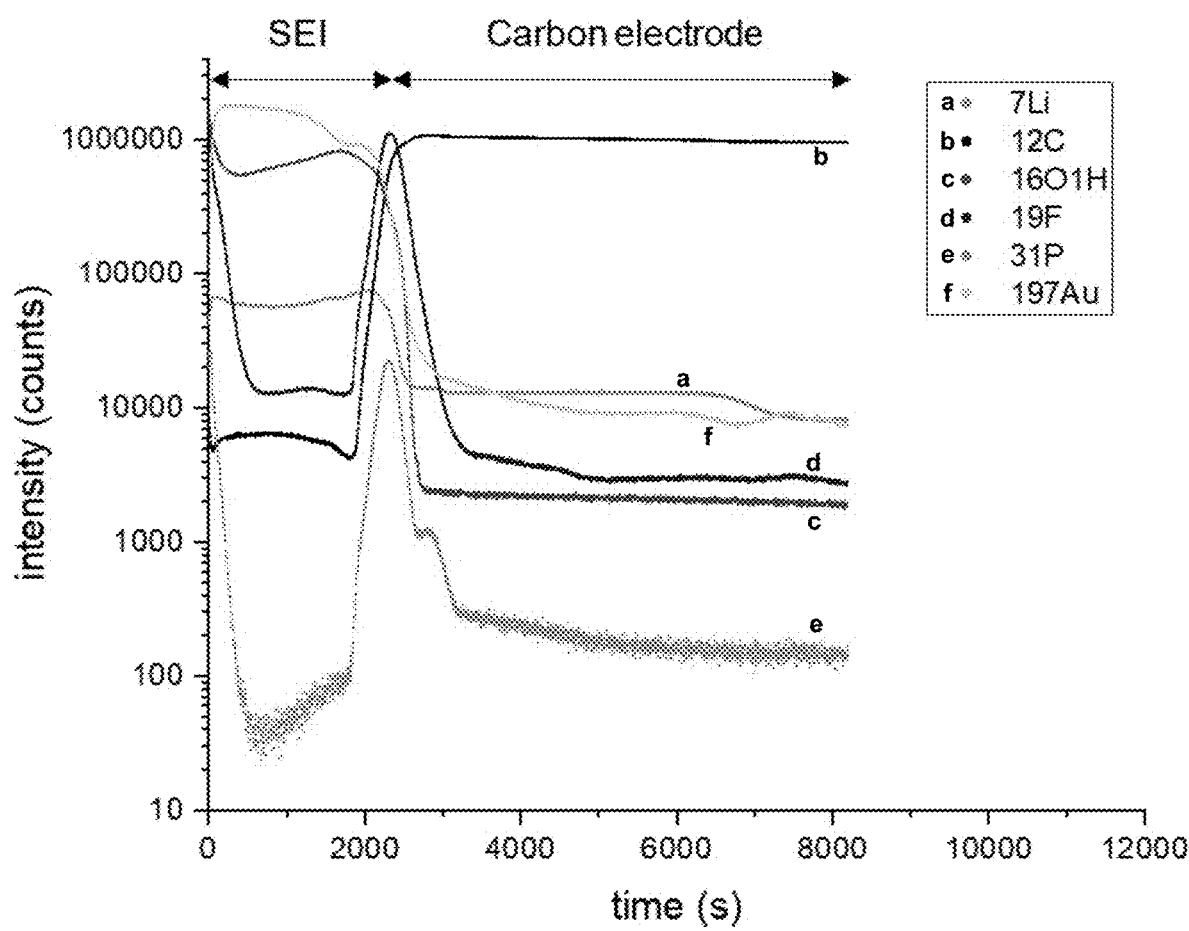

FIG. 12 shows depth profiles of SEI formed on the 3D architected carbon sample cycled with a washer and single assembly. Secondary ions of 7Li, 12C, 16O1H, 19F, 31P, and 197Au were collected simultaneously while Cs$^+$ primary ion beams sputtered the sample surface, which provided intensity profiles as a function of sputtering time. These depth profiles allowed us to distinguish SEI region and the carbon electrode region, as depicted above the depth profiles in FIG. 12. The depth profile of C shows a plateau after 8000 seconds of sputtering time, where the profiles of other secondary ions declined. These results indicate that the plateau region of C corresponds to the carbon electrode, and the profiles before the C plateau correspond to SEI. The exponential decrease of intensities in the carbon electrode may be due to mixing into the carbon region [34]. The profiles of F and P showed a similar trend from the carbon electrode to the topmost surface. The F and P profiles showed the peak around the interface of SEI and the carbon electrode, followed by a low-intensity plateau to the sputtering of 5000 seconds and an intensity increase by x10. The profiles then decreased gradually up to ~1300 seconds and showed a gradual increase toward the surface. The profiles of Li and O showed plateau throughout SEI and a small bump closer to the surface. The profile of Au showed two plateaus with ~10$^4$ counts from the topmost to ~1100 seconds and with ~10$^6$ counts throughout the SEI region.

Estimation of Li Concentrations in Carbon Electrodes and SEI

To quantify Li concentration in carbon and SEI, we estimated the amount of inserted Li in the carbon electrode from the discharge capacity and compared it with the intensity profile obtained from SIMS. One selected 3D architected carbon electrode was discharged at 20 mA g$^{-1}$ after the 11 cycles. Assuming that all the discharge capacity, 1.18 mAh, was used for Li insertion, we calculated the amount of inserted Li, n (mol) with Faraday's law:

$$n = \frac{Q}{Fv} \quad (3)$$

where Q indicates the charge (mAh), F indicates Faraday constant (mAh mol$^{-1}$), and v indicates the valence. The obtained n is divided by a sample volume to calculate Li concentration (mol cm$^{-3}$) using the 1.8 g cm$^{-3}$ of material density for pyrolytic carbon and mass of the sample. Separately, we calculated the concentration of Li in the carbon from the SIMS results. The amount of Li in carbon was obtained by an integral of SIMS intensity profile of Li in the carbon electrode region, and the sputtered volume was estimated from the collection area (1.4×1.4 mm$^2$) and sputtered depth, which was calculated from sputtering time and estimated sputtering rate in the carbon region (0.25 nm/s). These calculations provide Li concentration in SEI with the unit of count·s cm$^{-3}$. By equating the concentration of the inserted Li in carbon calculated by independently electrochemical characterization and SIMS with the different units (i.e. mol cm$^{-3}$ vs count·s cm$^{-3}$), we can obtain a conversion factor from counts to mol for estimating Li concentration from the SIMS intensity profile. By assuming the sputtering yield of Li as 7Li is consistent in the matrices of carbon and SEI, we can use the obtained conversion factor to estimate Li concentration in SEI from the SIMS results.

Electrochemical Estimation of SEI Growth and Resistance Evolutions

Figure 14A:
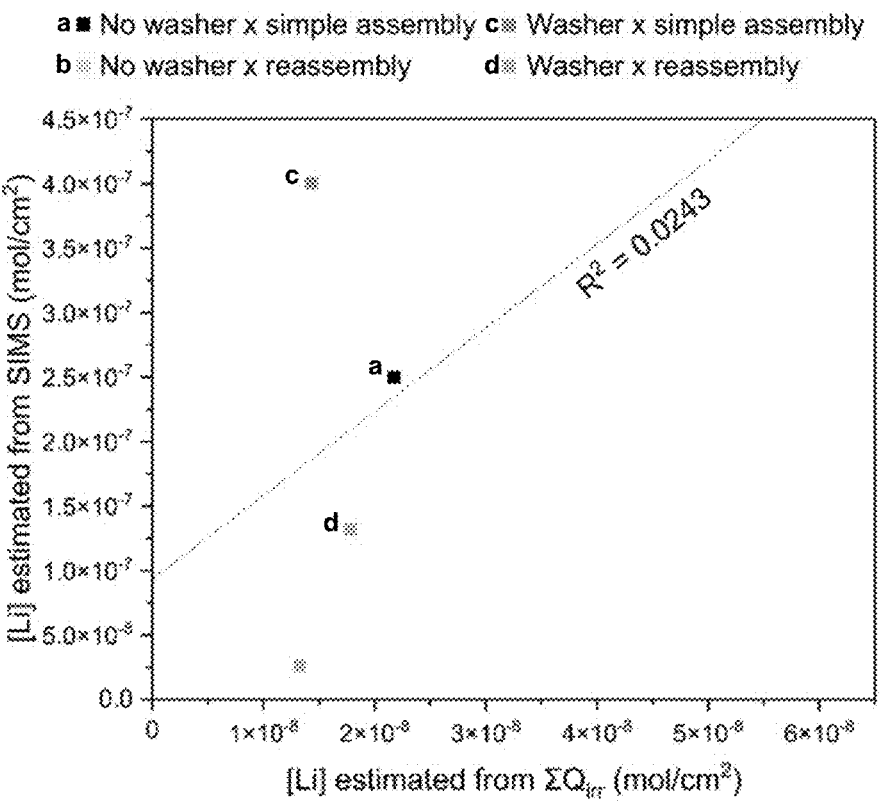
FIGS. 14A-14D: Correlations of Li concentration in SEI estimated from SIMS and cycling, and resistance of SEI obtained from EIS. The Li concentration obtained from SIMS is compared with (FIG. 14A) Li concentration estimated from total irreversible capacity loss $\Sigma Q_{irr}$, and (FIG. 14B) Li concentration estimated from total capacity loss $\Sigma \Delta Q$. The resistance of SEI is compared with (FIG. 14C) total irreversible capacity loss $\Sigma Q_{irr}$, and (FIG. 14D) total capacity loss $\Sigma \Delta Q$.
Figure 14B:
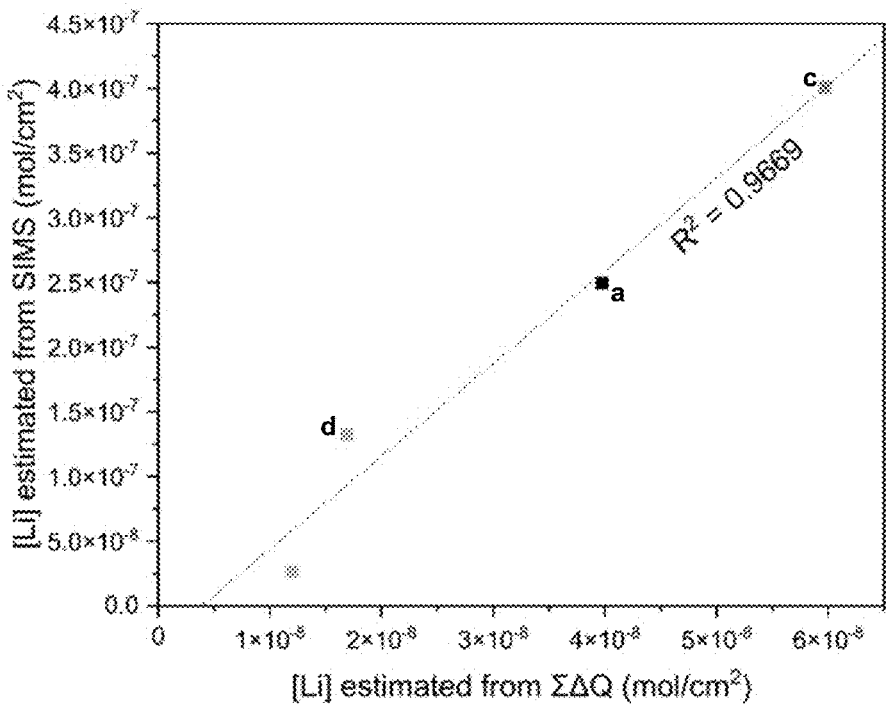

To investigate the relationship between cycling and SEI growth, we estimated Li concentrations in SEI with three different approaches. The SIMS depth profiles of 7Li with the conversion factor discussed in the previous section provide an estimation of Li concentration in SEI. Electrochemically, Li concentration in SEI can be estimated from the total irreversible capacity losses $\Sigma Q_{irr}$ (Eq. 1) or the total capacity losses $\Sigma \Delta Q$ (Eq. 2) by using Faraday's law (Eq. 3). The total capacity losses $\Sigma \Delta Q$ were calculated by summing $\Delta Q$ from second to the tenth cycle plus $Q_{irr}^1$ to take into account SEI formation in the first cycle. These independently estimated Li concentrations were compared in FIGS. 14A and 14B. The Li concentration calculated using $\Sigma Q_{irr}$ shows negligible correlation with Li concentration estimated from SIMS results with 0.0243 of the coefficient of determination, $R^2$. In contrast, the Li concentrations estimated from SIMS and the total capacity losses $\Sigma \Delta Q$ showed strong positive and linear correlation ($R^2=0.9669$) and same order of magnitude agreement (slope=7.19).

Figure 14C:
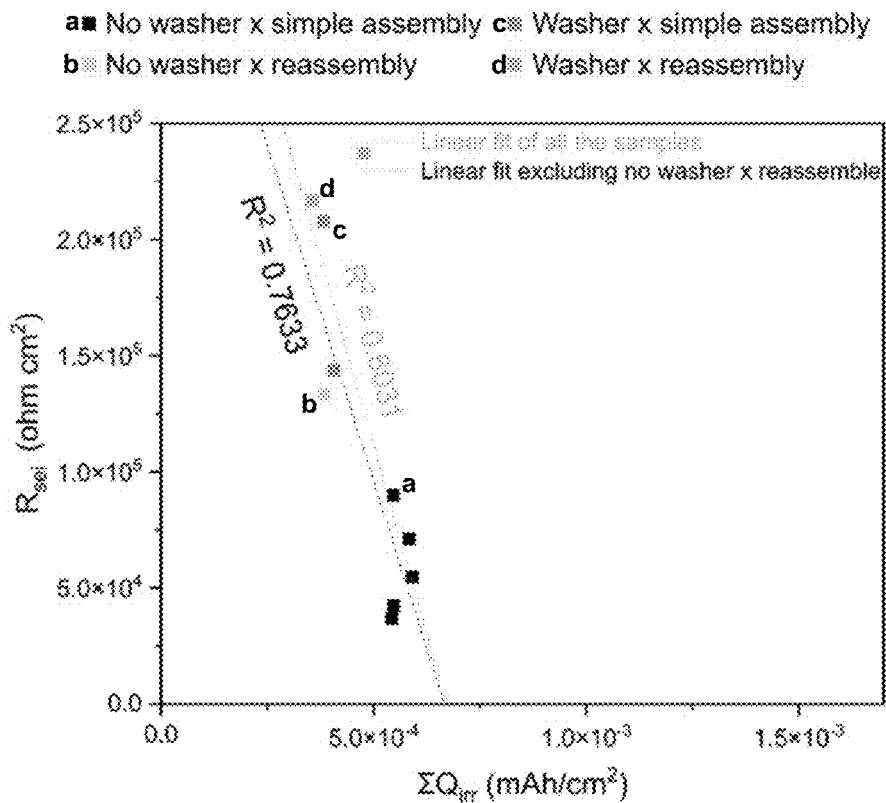
Figure 14D:
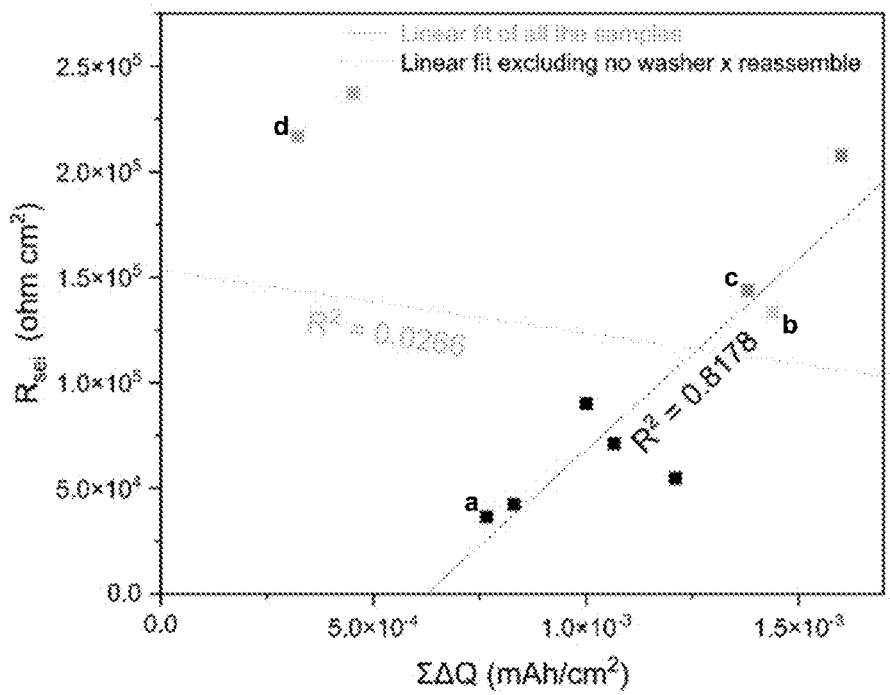

FIGS. 14C and 14D compare total irreversible capacity losses $\Sigma Q_{irr}$, total capacity losses $\Sigma \Delta Q$, and the resistance of SEI, $R_{sei}$ obtained from EIS after the 11 th cycle. Both capacities losses and resistances are normalized by a total surface area. Relationship between $\Sigma Q_{irr}$ and $R_{sei}$ was negative with $R^2=0.6031$. Without considering the sample with washer and reassembly, the correlation was slightly improved to $R^2=0.7633$. The correlation between $\Sigma \Delta Q$ and $R_{sei}$ was not observed with considering all the samples ($R^2=0.0266$). The negligible correlation was due to the samples with washer and reassembly, which showed a capacity increase to four cycles and nonzero irreversible capacities up to six cycles, not observed in other types of samples (FIGS. 13A-13E). The SIMS depth profiles also showed a one-layer SEI structure similar to the inner layer of SEI formed on the sample with a washer and single assembly (FIG. 12). By excluding the sample with a washer and reassembly, which showed different SEI growth behavior than others, the correlation was remarkably improved to $R^2=0.8178$.

The interesting discovery in this work is that $\Sigma \Delta Q$, rather than $\Sigma Q_{irr}$ shows a strong linear correlation with Li concentrations in SEI, which was estimated by the SIMS results. To the best of our knowledge, there is little experimental evidence in the literature that demonstrate any capacity losses, including irreversible capacity loss, $Q_{irr}$, obtained from electrochemical measurements are correlated with SEI structure, including thickness obtained by non-electrochemical characterizations, especially for post-first-cycle. The recent study by Huang shows that ~5 nm-thick SEI formation on carbon black electrodes observed by cryo-TEM after 20 cycles at C/10 is consistent with a simple geometric estimate of SEI growth using cumulative irreversible capacities $\Sigma Q_{irr}$ excluding the $Q_{irr}$ at the first cycle. However, they observed ~2 nm-thick SEI after the first cycle and heterogeneous SEI growth such as ~100 nm-thick SEI for the same sample [17]. This indicates that $Q_{irr}$ may not capture ~3 nm SEI growth and growth of extended SEI. Nevertheless, $Q_{irr}$ is used as a common indicator for SEI growth, because $Q_{irr}$ at the first cycle shows a good correlation with surface area of carbon electrodes [9], and cumulative irreversible capacities $\Sigma Q_{irr}$ follows time$^{0.5}$ scaling [11,12], which represents transport-limited surface layer growth. In this work, the electrochemical characterizations using the sample with a single assembly and a washer showed that $Q_{irr}$ reached almost zero (FIG. 8E) and the resistance of charge transfer decreased to the stable value at the third cycle (FIG. 11), indicating that $\Sigma Q_{irr}$ is used to form SEI that facilitates charge transfer Li-insertion/deinsertion reactions. However, further increase of resistance SEI after the third cycle was not captured by $Q_{irr}$, where subscripts d and c indicate discharge and charge, $t_d$ and $t_c$ indicate the time that takes the discharge/charge process, and $i^c$ and $i^{sei}$ indicate a current that is used for intercalation/deintercalation and SEI formation.

In contrast, $\Delta Q$ considers the SEI formation during both discharge and charge (Eq. (2)). The 3D architected carbon electrodes showed similar $\Delta Q$ between discharge and charge at each cycle (FIG. 8F). Attia found that SEI growth on carbon black electrodes is significantly higher on lithiation (discharge) than on delithiation (charge) for the second cycle [31,35]. They attribute the observed asymmetry in SEI growth to the change of electronic conductivity of the SEI as a mixed ion-electron conductor that varies electronic conductivity with the square of the local lithium concentration in SEI. They observed SEI thickness by cyro-TEM, which ranged 2-5 nm, within the range of electron-tunneling length [17]. The SEI thickness on the 3D architected carbon electrodes after 11 cycles ranged from ~200 nm to ~1000 nm (FIG. 15C, discussed later), which is unlikely limited by electron transport. In addition, the depth profiles of Li at different positions in 3D architected carbon electrodes along electrode-thickness direction revealed that Li remained more in the carbon electrode as closer to the separator side, which may result from polarization in an electrolyte and electrode diffusion-limited rate performance of the 3D carbon electrodes. The gradation of local potentials or state of charge in electrodes was proposed by 3D simulations for thick electrodes [36]. The remained Li in the carbon electrode after the last charge process indicates that local potentials closer to the separator side may be maintained below the stability window of the electrolyte during charge, which leads to continuous SEI growth in both discharge and charge cycles [37].

Other factors that have an influence on the estimation of SEI growth by $\Delta Q$ include storage capability change as distinctly seen by revisiting the definition of $\Delta Q$:

$$\Delta Q_\alpha^x = Q_\alpha^x - Q_\alpha^{last}$$
$$= \left(\int_0^{t_{\alpha,x}} |i_\alpha^{c,x}|dt + \int_0^{t_{\alpha,x}} |i_\alpha^{sei,x}|dt\right) - \left(\int_0^{t_{\alpha,last}} |i_\alpha^{c,last}|dt + \int_0^{t_{\alpha,last}} |i_\alpha^{sei,last}|dt\right)$$
$$= \left(\int_0^{t_{\alpha,x}} |i_\alpha^{c,x}|dt - \int_0^{t_{\alpha,last}} |i_\alpha^{c,last}|dt\right) + \left(\int_0^{t_{\alpha,x}} |i_\alpha^{sei,x}|dt - \int_0^{t_{\alpha,last}} |i_\alpha^{sei,last}|dt\right)$$

(4)

where $t_\alpha$ indicates the time that takes the discharge/charge process, and $i^{c,x}$ and $i^{sei,x}$ indicate a current that is used for intercalation/deintercalation and SEI formation x-th cycle. As we discussed, the concept of $\Delta Q$ is built on the assumptions that storage mechanism and capabilities are consistent over cycles (the first and second term are equal in Eq. (4)), and the SEI growth approaches zero as the cycle goes (i.e. $\int_0^{t_{\alpha,last}} |i_\alpha^{sei,last}|dt=0$). Possible storage capability loss of carbon electrodes includes contact loss of active materials [38], decreased porosity of electrodes by SEI growth, which limits Li-ion transport in an electrolyte [8], and overpotential increase due to transport through a grown SEI. The contact loss of active materials can be ruled out in this work because the 3D architected carbon electrodes are interconnected and mechanically resilient, unlike slurry electrodes, whose electrical connections are supported by conductive additives and physical contacts by binders. If the contact loss of active materials happened, we would expect a decrease in dQ/dV at all potentials, which was not seen for 3D architected carbon electrodes (FIGS. 8B and 8C). The decrease of porosity is also unlikely to affect capacity because the rate performance of the 3D architected carbon electrode is limited by diffusion in electrode rather than in electrolyte. The influence of SEI growth on overpotential and capacity cannot be ruled out in this work. If the capacity decay occurs due to the overpotential increase by SEI growth, we overestimate SEI growth (i.e. $\int_0^{t_{\alpha,x}}|i_\alpha^{c,x}|dt-\int_0^{t_{\alpha,last}}|i_\alpha^{c,last}|dt>0$). Future study with reduced currents, which minimizes overpotential effects on capacities, is necessary for further understanding of the relationship between $\Delta Q$ and SEI growth.

The correlations between $R_{sei}$ vs $\Sigma Q_{irr}$, and $R_{sei}$ vs $\Sigma \Delta Q$ in FIGS. 14C and 14D also provide new insight on an estimation of SEI growth and influence on resistance. $\Sigma Q_{irr}$ was contributed mostly from the first 3 cycles, in which the charge transfer resistance decreased to the stable value. This result and the weak negative correlation between $R_{sei}$ and $\Sigma Q_{irr}$ may indicate that the initial SEI formation cycles are important to form "good" SEI that facilitates lithiation/delitation reactions and suppresses the resistance of SEI. Carefully controlled cycling protocol and structure characterization of SEI for the initial cycles may elucidate factors to form "good" SEI.

The strong correlation of $\Sigma \Delta Q$ and SEI resistance if we exclude the sample with washer and reassembly suggests that $\Delta Q$ can be a good indicator to estimate the influence of SEI growth on resistance if we can confirm similar SEI growth behaviors. The depth profiles of the excluded sample were distinct from the others; for instance, SEI was composed of single-layer and thinner than other characterized SEIs. In other words, the structure of SEI may have significant influences on resistance. To understand the structure-property relationship of SEI, we discuss SIMS depth profiles and SEI resistance evolutions in the next section.

Structure of SEI and Influences on Resistance

Figure 15A:
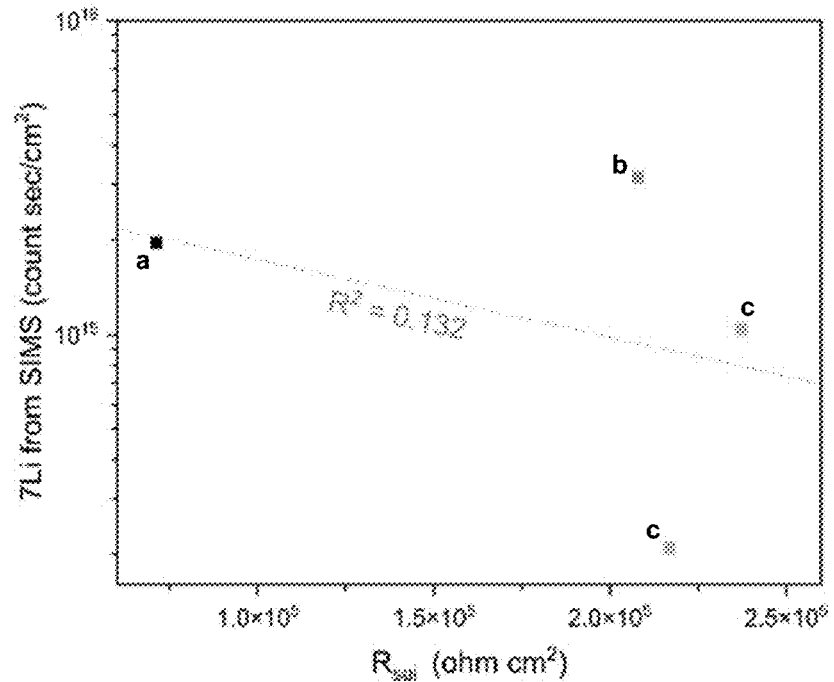
FIGS. 15A-15C: Correlation of the resistance of SEI with total intensities in SEI for (FIG. 15A) 7Li and (FIG. 15B) 19F, and (FIG. 15C) thickness of SEI.
Figure 15B:
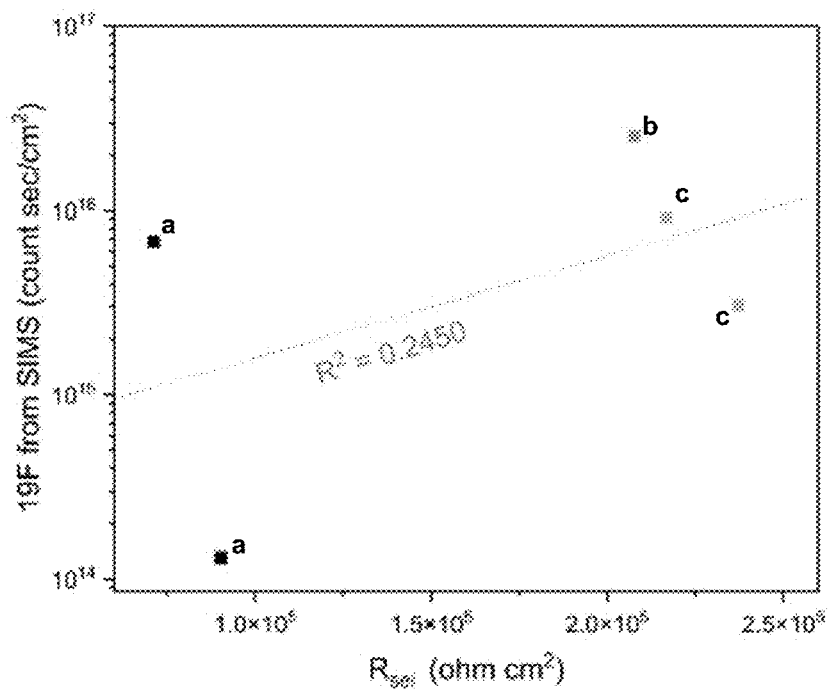
Figure 15C:
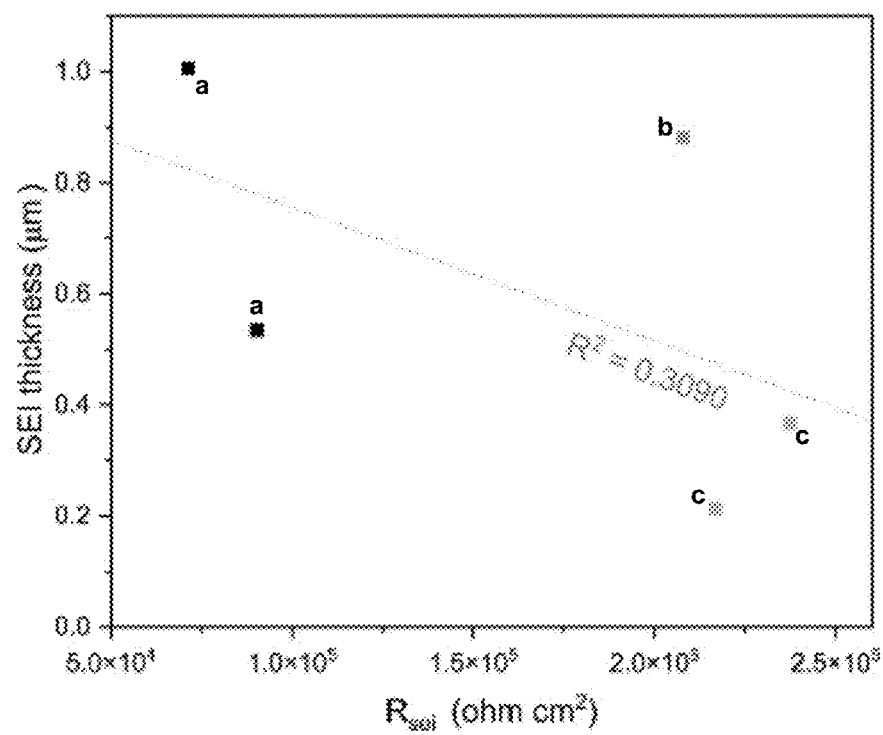

To understand the structure and property relationship of SEI, we compared the SEI thickness, the amount of Li, and the amount of F in SEI with SEI resistance in FIGS. 15A-15C. We chose the amount of F for comparison because F intensities may represent the amount of LiF, which is a major component in SEI [39] and may limit Li-ion transport in SEI because LiF is an ionic insulator as its intrinsic property (~$10^{-13}$ to $10^{-14}$ S cm$^{-1}$) [15,16]. A strong correlation was not observed in all comparisons. Resistance of SEI shows weak negative correlation with thickness and positive correlation with F amount and negligible correlation with Li amount. The complexity of SEI in compositions and geometrical structures such as porous outer layer and compact inner layer [40] may be responsible for the observed weak or negligible correlations between resistance and structure "averaged" over through the complex SEI structure.

We calculated the conductivity of SEI from the results of EIS and SIMS, which ranged between $9.8 \times 10^{-11}$ and $1.4 \times 10^{-9}$ S cm$^{-1}$. The accurate conductivity measurement or thickness measurement of SEI is challenging, especially for porous electrodes, because SEI is air-sensitive thin film [19] and forms/grows heterogeneously [17]. Still, the reported conductivity of SEI formed in a cell using liquid electrolyte is within the order of $10^{-7}$ to $10^{-10}$ S cm$^{-1}$ [2,13,16], which is consistent with this study.

Figure 16A:
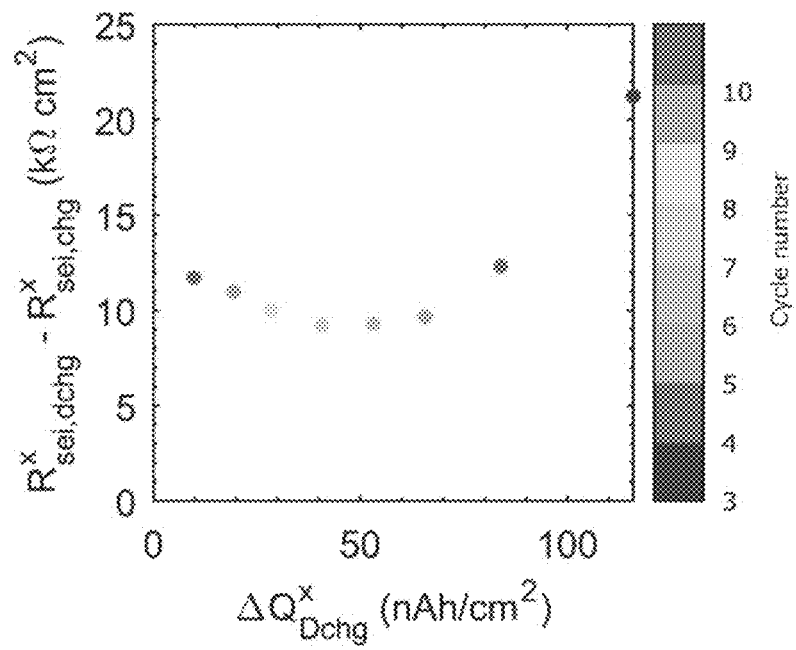
FIGS. 16A-16B: SEI resistance evolutions vs ΔQ for each cycle.

To investigate SEI formation, structure, and resistance in more depth, we compared $\Delta Q$ and the change of the SEI resistance at each cycle. FIG. 16A plots SEI resistance change obtained by the DCS technique and $\Delta Q$ from 3 to 10 cycles. The SEI resistance change linearly decreased with $\Delta Q$ up to 4th cycle, close to the cycle number showing the charge transfer resistance become stable (FIG. 11). From the 8th cycle, the SEI resistance started increasing despite a decrease of $\Delta Q$. The linear correlation between $\Delta Q$ and the SEI resistance change indicates that SEI grows with consistent conductivity (S cm$^{-1}$), which is often assumed in various battery models, especially the Multiphysics model that aims at simulating overall battery cycling (e.g. Newman's model) [26-28]. Differing from the positive linear relation suggests that SEI growth mechanism or SEI structure changes. This "multi-layer" SEI structure or "multi-mechanism" of transport through SEI has been suggested by modeling [32,41] and demonstrated by experiments, especially for the SEI growth at the first cycle [13,14].

Figure 16B:
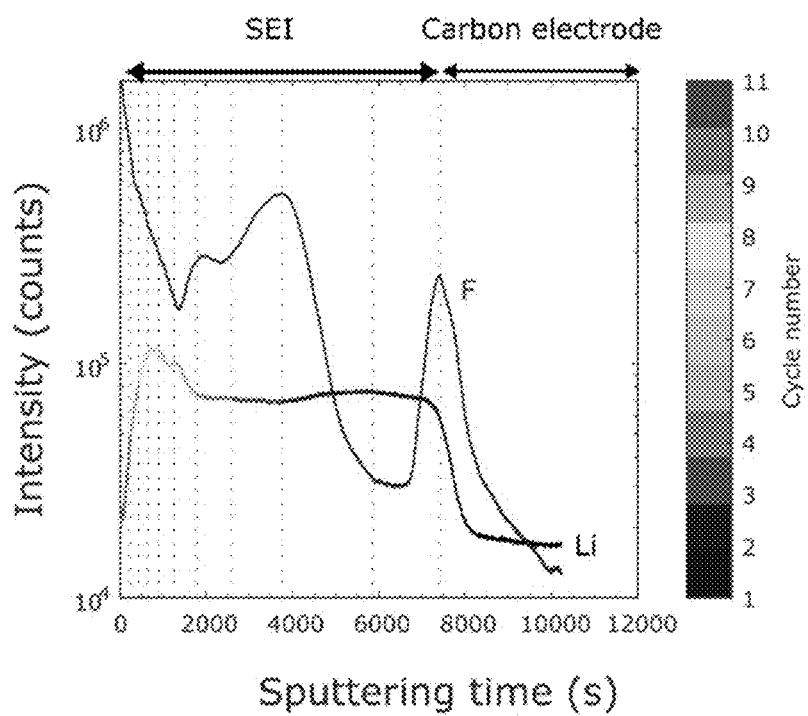
Figure 17:
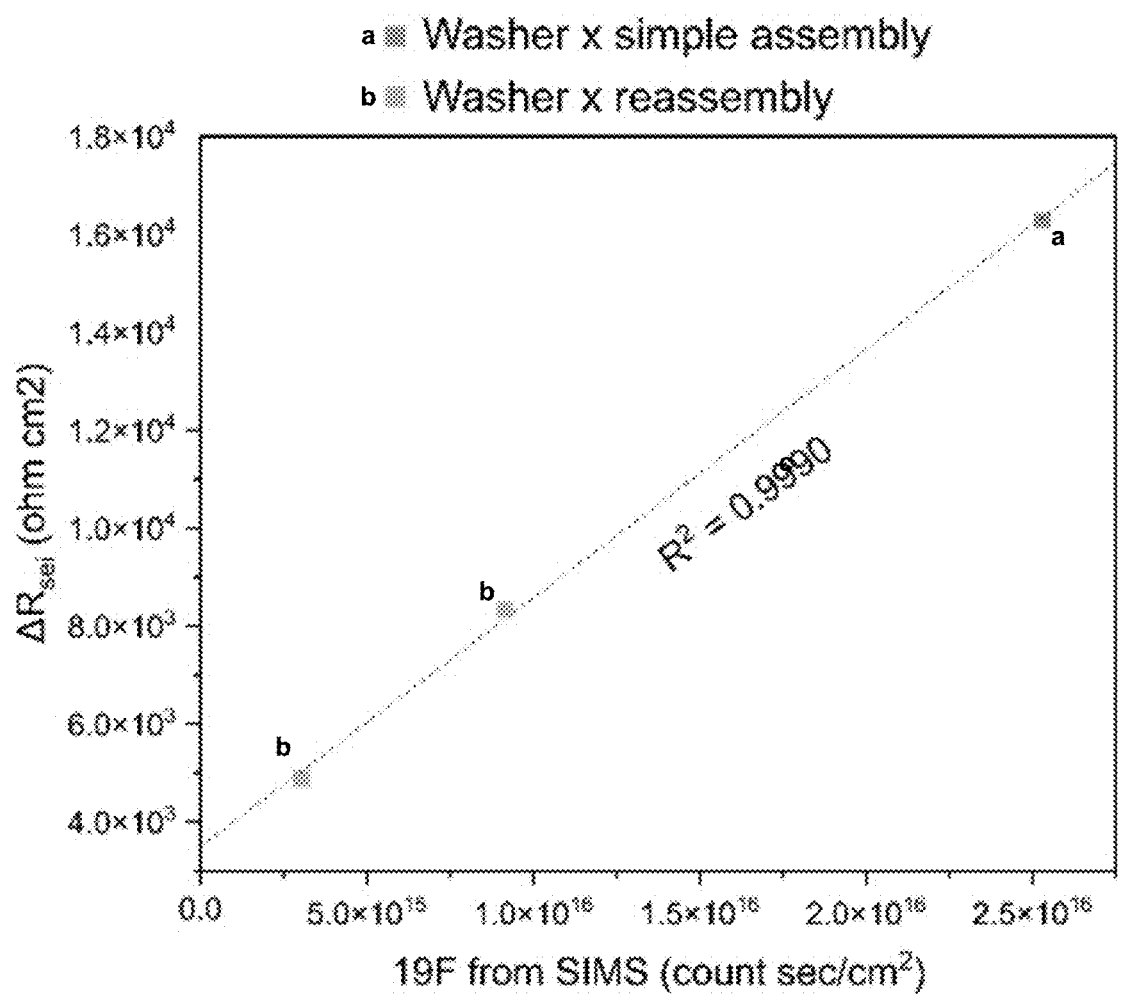
FIG. 17: Correlation of the total counts of 19F in SEI from SIMS and resistance increase of SEI after charge transfer resistance is stabilized.

To elucidate potential causes of the accelerated SEI resistance increase after the eighth cycle, we distinguished an integral of the Li depth profile by $\Delta Q^x/\Sigma \Delta Q$ at each cycle from the interface between SEI and the carbon electrode. For x=1, we used $Q_{irr}^1/\Sigma \Delta Q$. We assumed that SEI grows from the topmost surface (i.e. interface between SEI and electrolyte), and $\Delta Q$ represents the amount of Li (or electron) used for SEI growth. FIG. 16B shows that the Li depth profile is distinguished by each cycle growth. The F depth profile is plotted as well. The F intensity showed a peak and decreased for the growth at the first cycle. Then, the F intensity rapidly increased, which corresponds to the second cycle, followed by intensity fluctuation, which distinctly divided by the $\Delta Q^x/\Sigma \Delta Q$ for its local maximum and minimum. The last rapid increase of the intensity appeared on the eighth cycle, which agrees with the cycle that started showing accelerated SEI resistance increase despite a decrease of $\Delta Q$ (FIG. 16A).

The F depth profile distinguished by cycle number and the SEI resistance evolutions may be explained by the current understanding of SEI formation. LiF is formed as a component of SEI on carbon electrodes for the first cycle [10,18,42]. Simultaneously, lithium ethylene dicarbonate (LEDC) and $Li_2CO_3$ are formed [10,17,18], which agrees with high intensities in the O depth profile (FIG. 12). The LEDC is decomposed into various components such as $Li_2CO_3$ and lithium alkoxide, which may correspond to the low F region. Then, further decomposition of electrolyte happens to form LiF, which is observed as the increase of F in the SIMS depth profile at the growth of the eighth cycle. This suggests that the accelerated SEI resistance increase may be due to LiF formation, which is an intrinsic ionic insulator.

Figure 18A:
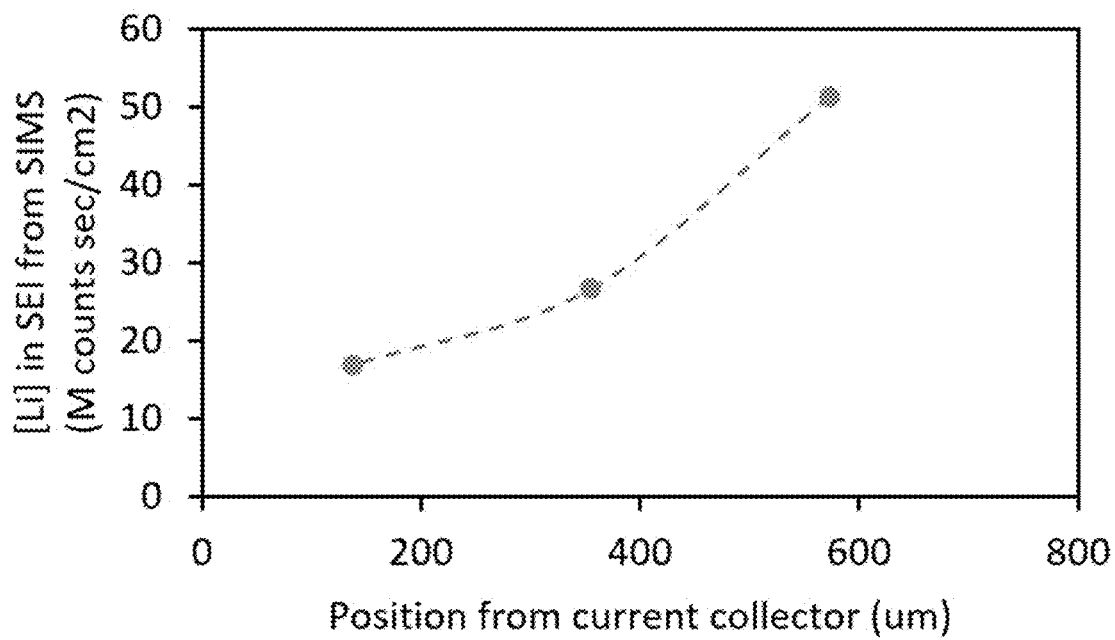
FIGS. 18A-18B: Position-dependent SEI growth with the compositions of Li and F. The integrals of intensities of (FIG. 18A) Li and (FIG. 18B) F in SEI, at different positions on the cross-section of 3D architected carbon electrode. The dot lines are for visual guidance. The sample was made by a single assembly with a washer.
Figure 18B:
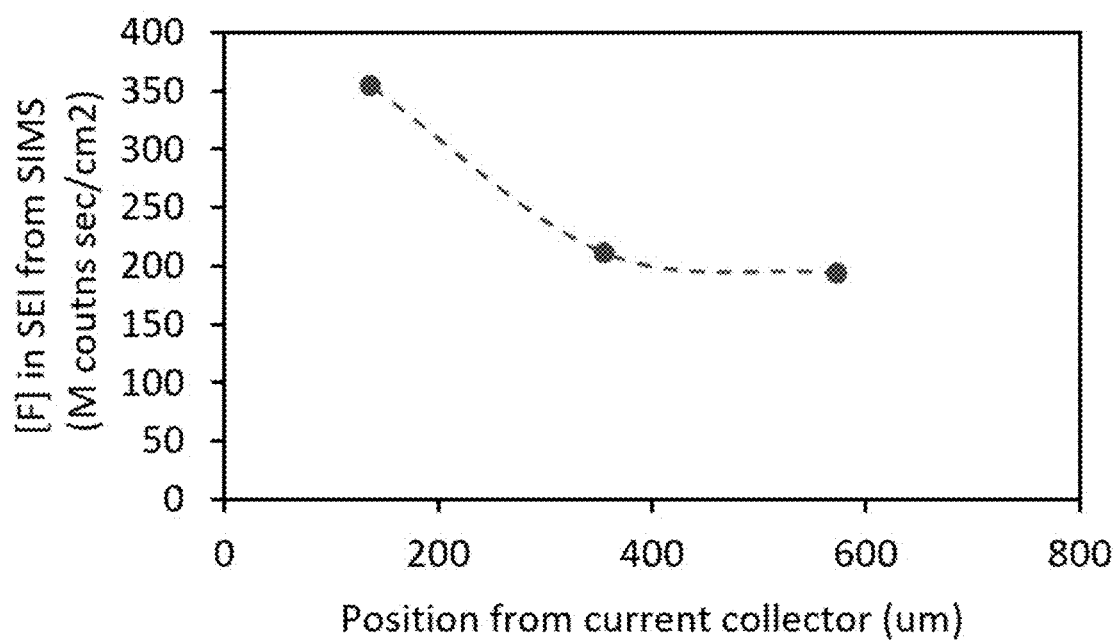

To test the hypothesis that LiF formation during SEI growth has a significant influence on SEI resistance, we compared F concentration in SEI and the SEI resistance increase from the cycle when charge transfer resistance is stabilized to the last cycle (11th cycle). FIGS. 18A-18B show that the correlation between an integral of the F depth profile in the SEI region and SEI resistance increase from the cycle that showed stable charge transfer resistance. We averaged the integrals of F intensities obtained at 3 or 5 different positions throughout porous electrodes. The total intensities of F and SEI resistance increase showed a strong linear correlation with $R^2=0.999$. In addition, the two samples with washer and reassembly did not show the F plateau in the depth profile (FIGS. 13A-13E). These results agree with our hypothesis, which is LiF formation during SEI growth after achieving stable charge transfer resistance has a significant influence on SEI resistance. Although we found a strong correlation between F intensities and SEI resistance increase, an additional study should be conducted to verify this hypothesis, such as depth analysis by X-ray photoelectron spectroscopy (XPS) to confirm the presence of LiF. Another possibility of the SEI resistance increase is that tortuous porous SEI structure formation is associated with $LiPF_6$ reduction [21], limiting transport in an electrolyte penetrated in porous SEI.

Position-Dependent SEI Growth

FIGS. 18A-18B show the integral of intensities of Li and F in SEI at three sites along the electrode thickness direction from a current collector to a separator. Comparison of these integrals of intensities represents the amount of Li and F in SEI at different positions. The amount of Li in SEI becomes higher toward the separator side, whereas the amount of F in SEI increased toward the current collector side.

Position-dependent SEI growth in porous electrodes has been proposed by numerical simulations using modified Newman's model [26-28]. Previous studies in literature employed the Butler-Volmer equation for a reaction to form SEI with concentrations of solvent (e.g. EC) and Li-ions in an electrolyte, and linear resistance increase of SEI with increasing the thickness [26-28]. The common outcome is that the SEI growth rate is higher toward the separator side because of the concentration gradient in an electrolyte, which leads to uneven resistance increase. In this study, we experimentally confirmed that the amount of Li in SEI, representing the outcome of SEI growth rate, increased toward the separator side, which agreed with the numerical simulation results. In addition, this study shows the opposite tendency of the F amount, which was higher toward the current collector side. As we discussed in the previous section, the amount of F in SEI may significantly influence SEI resistance, which implies that position-dependent SEI resistance may increase toward the current collector side. This implication contradicts the numerical model results about position-dependent SEI growth and influence [26-28] because these models do not take into account the structure-property relationship of multi-layer SEI (i.e. assuming consistent conductivity of SEI.) Overall, this study suggests that position-dependent SEI growth and influence may not be estimated precisely or even estimated in a mistaken way if it does not consider the structure-property relationship of multi-layer SEI.

Summary

The thick 3D architected carbon electrodes were used to study the formation and growth, structure-property relationship, and position-dependent growth of SEI through porous electrode with in operando DCS technique to evaluate resistance evolutions and Nano-SIMS to acquire depth profiles. We discovered that Li consumption estimation using $\Delta Q$ showed a stronger linear correlation than $Q_{irr}$ with the Li amount in SEI obtained by SIMS. $\Delta Q$ shows similar values between discharge and charge because the remained Li in the carbon electrode due to polarization in the electrolyte may result in maintaining local potentials low enough to cause electrolyte reduction during charge. The sum of $\Delta Q$ showed a good correlation with the SEI resistance. Distinguishing Li depth profiles by SIMS by $\Delta Q^x/\Sigma \Delta Q$ SEI to estimate SEI growth at each cycle showed a good agreement of the accelerated SEI resistance and F intensity rapid increase. The total F intensities in SEI and the resistance increase from the cycle that showed stable charge transfer resistance showed a strong linear correlation. These results indicate that F increase, which may be attributed to LiF, an intrinsic Li-ion insulator, significantly influences SEI resistance increase. The position-dependent SEI growth, higher Li amount toward the separator side was confirmed in this study. In addition, the total counts of F in SEI showed the opposite trend to the Li intensities, which implies that local SEI resistance may be higher toward the current collector side, with the consideration of the strong correlation of F intensity and SEI resistance. This implication contradicts the estimation of SEI resistance distribution by Newman's model if the multi-layer SEI model is not considered for the concentration.

This study provides a couple of arguments: the concept of $\Delta Q$, LiF influence on SEI resistance increase, and position-dependent SEI resistance with the consideration of LiF formation. Each argument must be tested with rigorous experiments. The difference in SEI growth, structure, and resistance on 3D architected carbon samples manufactured under the same conditions in this study was attributed to coin cell assembly methods: the presence/absence of a washer and the single assembly/reassembling process. The washer may release adsorbed water in a coin cell, potentially resulting in more F intensities than other types of samples [21]. Similar observations of the suggested aging mechanism in this study may emerge more often when thick electrodes with high currents are investigated for their cycle life—current investigations on SEI and aging are focused on commercial thin slurry electrodes and thin film electrodes.

Detailed Experimental Procedures

Electrode preparation and galvanostatic cycling

Disk-shaped structures composed of cubic unit cells with a diameter of 37 mm and porosity of 70% are printed. The printing direction was parallel to the diameter of the disk, which allows characterizing a flat surface of cross-section without wave features attributed to printing layers. The pyrolyzed 3D carbon and Li metal half cells with 1M LiPF$_6$ in 1:1 (v/v) ratio of EC:DEC were assembled using a 2032 coin cell. Galvanostatic cycling tests were conducted using the assembled coin cells by a battery cycling system (BCS-805, Biologic) at room temperature. Open-circuit voltage was applied for more than four hours before starting cycling tests to obtain equilibrium. The first galvanostatic cycling was conducted at 50 mA g$^{-1}$ with a 10-second open-circuit voltage interval, followed by a 12-hour open-circuit voltage. Then, potentiostatic electrochemical impedance spectroscopy was conducted with 5 mV of potential perturbation from 10 kHz to 3 mHz. After another 12-hour open-circuit voltage, galvanostatic cycling was conducted for ten cycles at 200 mA g$^{-1}$ with a 10-second open-circuit voltage interval before switching current directions. Another 12-hour open-circuit voltage is then applied, and PEIS was conducted with the same conditions described before. For all galvanostatic cycling tests, cut-off voltages were set at 2 V and 0.005 V. The potential was recorded with a geometric time resolution starting from 2 ms unless otherwise noted. The overpotential was measured as the voltage change from the open-circuit potential right before the cycle. To investigate overpotential change, we set the time when an applied current was first recorded as t=0.

One 3D architected carbon electrode underwent a half discharge cycle at 20 mA g$^{-1}$ after all the cycling and EIS processes to fully lithiate the carbon electrode for estimating Li-ion concentrations in carbon.

Figure 19A:
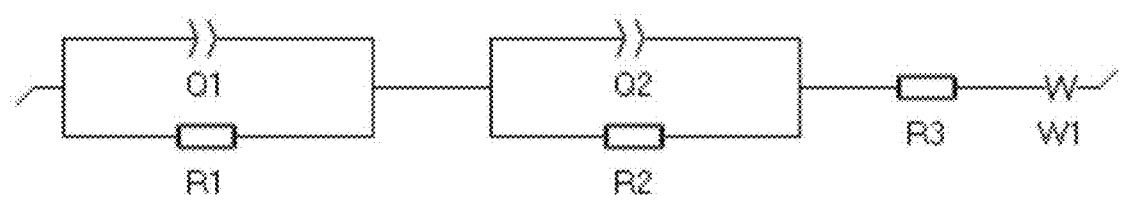
FIGS. 19A-19B: Equivalent circuits models used for half-cell of 3D carbon and Li, used for (FIG. 19A) the Nyquist plot without high-frequency semi-circle, and (FIG. 19B) the Nyquist plot with a high-frequency semi-circle.
Figure 19B:
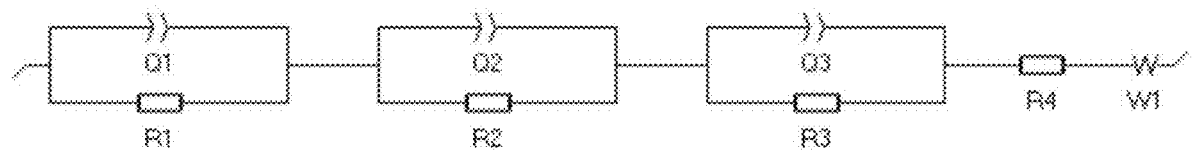

Equivalent circuit models as illustrated in FIGS. 19A-19B were used to fit Nyquist plots and extract resistance and capacitance values. The fitting was conducted with Simplex algorithm using EC-Lab Software (Biologic). The model of FIG. 19B is used for some samples that showed the small semi-circle at high-frequency in the Nyquist plot. To normalize resistance, capacitance, and capacity, we used a total surface area calculated by the BET specific surface area (15 m$^2$ g$^{-1}$) and a measured mass of 3D architected carbon.

Sample Preparation for SIMS Analysis

After the galvanostatic cycling, we disassembled a coin cell in the Ar-filled glovebox with the caution not to deform the 3D architected carbon electrodes. The cycled 3D architected carbon was rinsed in 200 mL of dimethyl carbonate (DMC) for less than 10 s to remove residual electrolyte [43], and then dried at room temperature inside the glovebox overnight. The dried sample was cut into a semi-circle shape by a razor blade. The cross-section was coated with gold using a sputter coater (108Auto, Cressington) using a gold target to prevent direct air exposure during transferring from the glovebox to a SIMS instrument (NanoSIMS 50L, CAMECA). The Au-coated samples were mounted on a custom-holder that allows facing the cross-section of the semi-circle sample top, the orientation to an ion detector in SIMS. The transferring time from an air-tight container (SampleSaver, South Bay Technology) to the SIMS instrument was minimized up to 10 seconds.

SIMS Analysis and EDS

The depth profiles were acquired with a Cameca Nano-SIMS 50 L ion microprobe. An 8 keV Cs$^+$ primary beam of ~100-200 nm was used to sputter the sample in a rastering mode. The primary beam current and rastered area were 15 pA in 5×5 mm or 4 pA in 3×mm. Secondary ions (7Li, 12C, 16O1H, 19F, 31P, and 197Au) of −8 keV were simultaneously collected with electron multipliers (EMs). To avoid the edge effect during the sputtering, secondary signals were only collected from the center 2.3×2.3 mm of the 5×5 mm or 1.4×1.4 mm of the 3×3 mm crater with electronic gating. The total data acquisition time on each profile lasted from about 1 to 3 hours. The mass spectrometer was set at high mass resolution conditions to remove possible interferences for the masses of interest.

Depth analysis was conducted for the Au-coated 3D architected carbon without cycling to investigate Au-mixing effects during sputtering and estimate the sputtering rate in carbon. After the SIMS analysis, the sputtered regions were analyzed by SEM (Versa 3D Dual Beam, FEI) equipped with energy-dispersive spectroscopy (Quantax EDS, Bruker). Line analysis was conducted on the cross-section of sputtered regions to measure the depth of sputtered SEI and a carbon electrode.

References Corresponding to Example 6

1. Edge, J. S.; O'Kane, S.; Prosser, R.; Kirkaldy, N. D.; Patel, A. N.; Hales, A.; Ghosh, A.; Ai, W.; Chen, J.; Yang, J.; et al. Lithium ion battery degradation: What you need to know. *Phys. Chem. Chem. Phys.* 2021, doi:10.1039/D1CP00359C.
2. Peled, E.; Menkin, S. Review—SEI: Past, present and future. *J. Electrochem. Soc.* 2017, 164, A1703-A1719, doi:10.1149/2.1441707jes.
3. Guo, J.; Sun, A.; Chen, X.; Wang, C.; Manivannan, A. Cyclability study of silicon-carbon composite anodes for lithium-ion batteries using electrochemical impedance spectroscopy. *Electrochim. Acta* 2011, 56, 3981-3987, doi:10.1016/j.electacta.2011.02.014.
4. Xu, J.; Deshpande, R. D.; Pan, J.; Cheng, Y.-T.; Battaglia, V. S. Electrode side reactions, capacity loss and mechanical degradation in lithium-ion batteries. *J. Electrochem. Soc.* 2015, 162, A2026-A2035, doi: 10.1149/2.0291510jes.
5. Vetter, J.; Novák, P.; Wagner, M. R.; Veit, C.; Möller, K. C.; Besenhard, J. O.; Winter, M.; Wohlfahrt-Mehrens, M.; Vogler, C.; Hammouche, A. Ageing mechanisms in lithium-ion batteries. *J. Power Sources* 2005, 147, 269-281, doi: 10.1016/j.jpowsour.2005.01.006.
6. Keil, P.; Jossen, A. Calendar aging of NCA lithium-ion batteries investigated by differential voltage analysis and Coulomb tracking. *J. Electrochem. Soc.* 2017, 164, A6066-A6074, doi:10.1149/2.0091701jes.
7. Waldmann, T.; Wilka, M.; Kasper, M.; Fleischhammer, M.; Wohlfahrt-Mehrens, M. Temperature dependent ageing mechanisms in Lithium-ion batteries—A Post-Mortem study. *J. Power Sources* 2014, 262, 129-135, doi:10.1016/j.jpowsour.2014.03.112.
8. Atalay, S.; Sheikh, M.; Mariani, A.; Merla, Y.; Bower, E.; Widanage, W. D. Theory of battery ageing in a lithium-ion battery: Capacity fade, nonlinear ageing and lifetime prediction. *J. Power Sources* 2020, 478, 229026, doi:10.1016/j.jpowsour.2020.229026.
9. Placke, T.; Siozios, V.; Rothermel, S.; Meister, P.; Colle, C.; Winter, M. Assessment of surface heterogeneity: A route to correlate and quantify the 1st cycle irreversible capacity caused by sei formation to the various surfaces of graphite anodes for lithium ion cells. *Zeitschrift fur Phys. Chemie* 2015, 229, 1451-1469, doi:10.1515/zpch-2015-0584.
10. Naoi, K.; Ogihara, N.; Igarashi, Y.; Kamakura, A.; Kusachi, Y.; Utsugi, K. Disordered carbon anode for lithium-ion battery I. An interfacial reversible redox action and anomalous topology changes. *J. Electrochem. Soc.* 2005, 152, A1047, doi:10.1149/1.1896531.
11. Smith, A. J.; Burns, J. C.; Zhao, X.; Xiong, D.; Dahn, J. R. A high precision coulometry study of the sei growth in Li/graphite cells. *J. Electrochem. Soc.* 2011, 158, A447, doi:10.1149/1.3557892.
12. Attia, P. M.; Chueh, W. C.; Harris, S. J. Revisiting the t0.5 dependence of SEI growth. *J. Electrochem. Soc.* 2020, 167, 090535, doi:10.1149/1945-7111/ab8ce4.
13. Lu, P.; Li, C.; Schneider, E. W.; Harris, S. J. Chemistry, impedance, and morphology evolution in solid electrolyte interphase films during formation in lithium ion batteries. *J. Phys. Chem. C* 2014, 118, 896-903, doi:10.1021/jp4111019.
14. Shi, S.; Lu, P.; Liu, Z.; Qi, Y.; Hector, L. G.; Li, H.; Harris, S. J. Direct calculation of Li-ion transport in the solid electrolyte interphase. *J. Am. Chem. Soc.* 2012, 134, 15476-15487, doi:10.1021/ja305366r.
15. He, M.; Guo, R.; Hobold, G. M.; Gao, H.; Gallant, B. M. The intrinsic behavior of lithium fluoride in solid electrolyte interphases on lithium. *Proc. Natl. Acad. Sci. U. S. A.* 2020, 117, 73-79, doi:10.1073/pnas.1911017116.
16. Guo, R.; Gallant, B. M. Li2O Solid electrolyte interphase: Probing transport properties at the chemical potential of lithium. *Chem. Mater.* 2020, 32, 5525-5533, doi:10.1021/acs.chemmater.0c00333.
17. Huang, W.; Attia, P. M.; Wang, H.; Renfrew, S. E.; Jin, N.; Das, S.; Zhang, Z.; Boyle, D. T.; Li, Y.; Bazant, M. Z.; et al. Evolution of the solid-electrolyte interphase on carbonaceous anodes visualized by atomic-resolution cryogenic electron microscopy. *Nano Lett.* 2019, 19, 5140-5148, doi:10.1021/acs.nanolett.9b01515.
18. Heiskanen, S. K.; Kim, J.; Lucht, B. L. Generation and evolution of the solid electrolyte interphase of lithium-ion batteries. *Joule* 2019, 3, 2322-2333, doi:10.1016/j.joule.2019.08.018.
19. Oswald, S.; Hoffmann, M.; Zier, M. Peak position differences observed during XPS sputter depth profiling of the SEI on lithiated and delithiated carbon-based anode material for Li-ion batteries. *Appl. Surf. Sci.* 2017, 401, 408-413, doi:10.1016/j.apsusc.2016.12.223.
20. Horstmann, B.; Single, F.; Latz, A. Review on multiscale models of solid-electrolyte interphase formation. *Curr. Opin. Electrochem.* 2019, 13, 61-69, doi:10.1016/j.coelec.2018.10.013.
21. An, S. J.; Li, J.; Daniel, C.; Mohanty, D.; Nagpure, S.; Wood, D. L. The state of understanding of the lithium-ion-battery graphite solid electrolyte interphase (SEI) and its relationship to formation cycling. *Carbon N. Y.* 2016, 105, 52-76, doi:10.1016/j.carbon.2016.04.008.
22. Ogihara, N.; Igarashi, Y.; Kamakura, A.; Naoi, K.; Kusachi, Y.; Utsugi, K. Disordered carbon negative electrode for electrochemical capacitors and high-rate batteries. *Electrochim. Acta* 2006, 52, 1713-1720, doi:10.1016/j.electacta.2006.01.082.
23. Du Pasquier, A.; Disma, F.; Bowmer, T.; Gozdz, A. S.; Amatucci, G.; Tarascon, J. -M. Erratum: "Differential scanning calorimetry study of the reactivity of carbon anodes in plastic Li-ion batteries" *J. Electrochem. Soc.* 1998, 145, 1413-1413, doi:10.1149/1.1838474.
24. Spotnitz, R.; Franklin, J. Abuse behavior of high-power, lithium-ion cells. *J. Power Sources* 2003, 113, 81-100, doi:10.1016/S0378-7753(02)00488-3.
25. Harris, O. C.; Tang, M. H. Molecular probes reveal chemical selectivity of the solid-electrolyte interphase. *J. Phys. Chem. C* 2018, 122, 20632-20641, doi:10.1021/acs.jpcc.8b06564.
26. Pinsona, M. B.; Bazant, M. Z. Theory of SEI formation in rechargeable batteries: Capacity fade, accelerated aging and lifetime prediction. *J. Electrochem. Soc.* 2013, 160, doi:10.1149/2.044302jes.
27. Liu, L.; Park, J.; Lin, X.; Sastry, A. M.; Lu, W. A thermal-electrochemical model that gives spatial-dependent growth of solid electrolyte interphase in a Li-ion battery. *J. Power Sources* 2014, 268, 482-490, doi:10.1016/j.jpowsour.2014.06.050.
28. Kindermann, F. M.; Keil, J.; Frank, A.; Jossen, A. A SEI modeling approach distinguishing between capacity and power fade. *J. Electrochem. Soc.* 2017, 164, E287-E294, doi:10.1149/2.0321712jes.
29. Alvin, S.; Cahyadi, H. S.; Hwang, J.; Chang, W.; Kwak, S. K.; Kim, J. Revealing the intercalation mechanisms of lithium, sodium, and potassium in hard carbon. *Adv. Energy Mater.* 2020, 10, 1-16, doi:10.1002/aenm.202000283.
30. Dahn, J. R.; Zheng, T.; Liu, Y.; Xue, J. S. Mechanisms for lithium insertion in carbonaceous materials. *Science* 1995, 270, 590-593, doi:10.1126/science.270.5236.590.
31. Attia, P. M.; Das, S.; Harris, S. J.; Bazant, M. Z.; Chueh, W. C. Electrochemical kinetics of SEI growth on Carbon Black: Part I. Experiments. *J. Electrochem. Soc.* 2019, 166, E97-E106, doi:10.1149/2.0231904jes.
32. Single, F.; Horstmann, B.; Latz, A. Revealing SEI morphology: In-depth analysis of a modeling approach. *J. Electrochem. Soc.* 2017, 164, E3132-E3145, doi:10.1149/2.0121711jes.
33. Steinhauer, M.; Risse, S.; Wagner, N.; Friedrich, K. A. Investigation of the solid electrolyte interphase formation at graphite anodes in lithium-ion batteries with electrochemical impedance spectroscopy. *Electrochim. Acta* 2017, 228, 652-658, doi:10.1016/j.electacta.2017.01.128.
34. Noël, C.; Houssiau, L. Hybrid organic/inorganic materials depth profiling using low energy cesium ions. *J. Am. Soc. Mass Spectrom.* 2016, 27, 908-916, doi:10.1007/s13361-016-1353-9.
35. Das, S.; Attia, P M.; Chueh, W. C.; Bazant, M. Z. Electrochemical kinetics of sei growth on carbon black: Part II. Modeling. *J. Electrochem. Soc.* 2019, 166, E107-E118, doi:10.1149/2.0241904jes.
36. Danner, T.; Singh, M.; Hein, S.; Kaiser, J.; Hahn, H.; Latz, A. Thick electrodes for Li-ion batteries: A model based analysis. *J. Power Sources* 2016, 334, 191-201, doi:10.1016/j.jpowsour.2016.09.143.
37. Colclasure, A. M.; Smith, K. A.; Kee, R. J. Modeling detailed chemistry and transport for solid-electrolyte-interface (SEI) films in Li-ion batteries. *Electrochim. Acta* 2011, 58, 33-43, doi:10.1016/j.electacta.2011.08.067.
38. Safari, M.; Delacourt, C. Aging of a commercial graphite/LiFePO4 cell. *J. Electrochem. Soc.* 2011, 158, A1123, doi:10.1149/1.3614529.

39. Tan, J.; Matz, J.; Dong, P.; Shen, J.; Ye, M. A Growing appreciation for the role of lif in the solid electrolyte interphase. *Adv. Energy Mater.* 2021, doi:10.1002/aenm.202100046.
40. Guan, P.; Liu, L.; Lin, X. Simulation and experiment on solid electrolyte interphase (SEI) morphology evolution and lithium-ion diffusion. *J. Electrochem. Soc.* 2015, 162, A1798-A1808, doi:10.1149/2.0521509jes.
41. Wang, A.; Kadam, S.; Li, H.; Shi, S.; Qi, Y. Review on modeling of the anode solid electrolyte interphase (SEI) for lithium-ion batteries. *npj Comput. Mater.* 2018, 4, doi:10.1038/s41524-018-0064-0.
42. Chattopadhyay, S.; Lipson, A. L.; Karmel, H. J.; Emery, J. D.; Fister, T. T.; Fenter, P. A.; Hersam, M. C.; Bedzyk, M. J. In situ X-ray study of the solid electrolyte interphase (SEI) formation on graphene as a model Li-ion battery anode. *Chem. Mater.* 2012, 24, 3038-3043, doi:10.1021/cm301584r.
43. Hasa, I.; Haregewoin, A. M.; Zhang, L.; Tsai, W. Y.; Guo, J.; Veith, G. M.; Ross, P. N.; Kostecki, R. Electrochemical reactivity and passivation of silicon thin-film electrodes in organic carbonate electrolytes. *ACS Appl. Mater. Interfaces* 2020, 12, 40879-40890, doi:10.1021/acsam i.0c09384.

EXAMPLE 7: DIRECT CURRENT SPECTROSCOPY (DCS) TECHNIQUE FOR IN-OPERANDO CELL DIAGNOSTICS AND ANISOTROPIC RESISTANCE MONITORING

We demonstrate a new direct current (DC)-based technique that can measure resistance attributed to the dynamic response at different time constants. This technique, which we coin as DCS (direct current spectroscopy), is capable of detecting the resistance anisotropy that emerges when the direction of applied current is reversed, distinguishing between the forward and reverse applied currents. Neither the EIS techniques nor other electrochemical techniques that use DC are capable of detecting these details. In this technique, a positive/negative direct current (DC) is applied to an electrochemical cell, and voltage evolution is measured and analyzed until the time constant of the dynamic process of interest is reached. The resistance evolution is obtained by dividing the overpotential at each given time by the applied current, analogous to the impedance evolution obtained by EIS. This DCS technique acquires data up to the time constant of the dynamic process of interest, which renders it significantly more efficient compared with, for example, EIS, which requires measurements at different frequencies separately. The DCS can be implemented by using a conventional DC supply/detector and can be easily integrated in other electrochemical tests such as galvanostatic cycling.

Figures 20A, 20B:
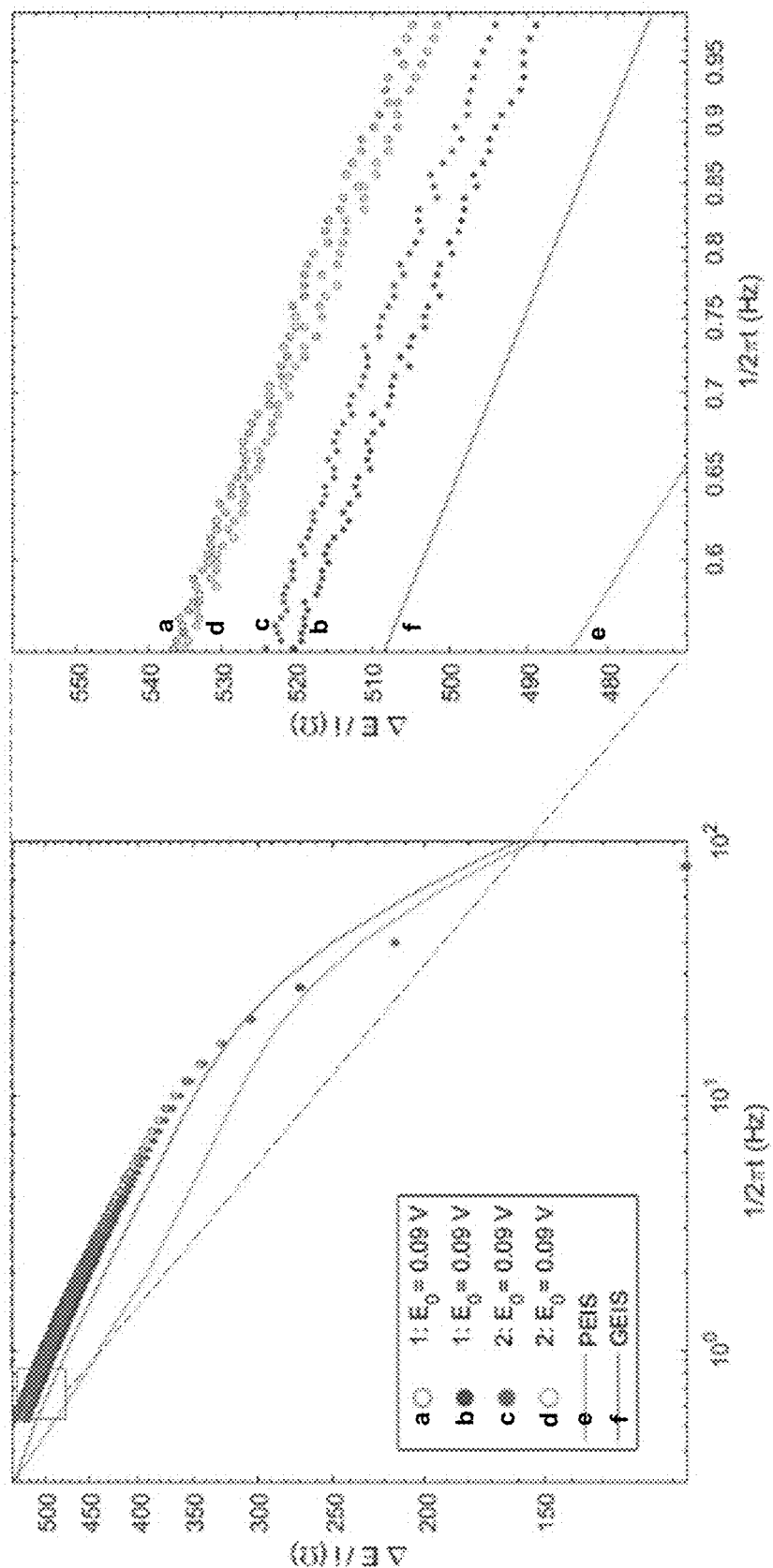
FIGS. 20A-20B: Comparison of the DCS method, PEIS and GEIS for Bode magnitude plots, (FIG. 20A) in the range of 3×10$^{-1}$ to 10$^2$ Hz, and (FIG. 20B) a close look of the square region in FIG. 20A. DCS methods were conducted first with the order of positive ("a" open circles) and negative ("b" filled circles) currents, and then the order was switched in the second measurement to the order of negative ("c" filled circles) and positive ("d" open circles) currents.

We investigated potential causes of the resistance difference that could emerge as a result of the opposite current directions in the DCS. We used a graphite-Li half cell discharged up to 0.09 V as the initial voltage, $E_0$. We first applied a positive pulse current over 0.3 s, relaxed the cell for 5 s, then applied the negative pulse current. The second DCS measurement was conducted in the opposite order of current directions; we first applied a negative current for 0.3 s, relaxed the cell for 5 s, and then applied the positive currents. The magnitude of the applied pulse currents was 100 mA. FIGS. 20A-20B show Bode magnitude plots obtained by DCS conducted at different current directions and in sequence steps. The voltages measured after each cell relaxation were self-consistent, indicating no observable SoC change due to the pulse currents. The difference in resistance caused by the reversal in the current direction was >10 ohm (FIG. 20B), which is 2× larger than the <5 ohms difference in resistance caused by switching the sequential order of the applied current directions. These results suggest that the observed difference of resistances with opposite current directions is attributed not to the history of applied currents, but to the directionality of resistances in the probed system.

We conducted the GEIS and PEIS measurements after the DCS techniques, with 100 mA of the magnitude of current perturbation in GEIS and 5 mV of the magnitude of potential perturbation in PEIS. FIGS. 20A-20B include Bode magnitude plots obtained by the DCS method, PEIS, and GEIS. The DCS method and GEIS measurement, both of which use currents as inputs and voltages as outputs, showed similar frequency-dependent resistances (or impedances). At lower frequencies than 30 Hz, GEIS showed close resistances within <35 ohm difference to the ones obtained by the DCS method, whereas at the highest frequency of 80 Hz, the difference of resistances was ~60 ohms between the DCS method and EIS methods.

EXAMPLE 8: COMPARISON OF DATA BASED ON APPLIED POSITIVE AND NEGATIVE CURRENT

Useful parameters of an electrochemical cell, such as but not limited to State of Charge and/or State of Health, may optionally be determined based on data corresponding to application of just the positive direct current (e.g., positive current square wave) or just the negative direct current (e.g., negative current square wave). It is useful, in embodiments, however, to apply positive direct current and to apply negative direct current and to analyze cell resistance data based on, or in response to, both applied positive and applied negative current for various reasons. For example, both positive and negative current data may be useful as a self-check/self-evaluation of the robustness of a measurement, such as in the case of an artifact. For example, cell resistance data and/or the determined parameter (e.g., SoC and/or SoH) based on, or in response to, applied positive direct current may be compared to cell resistance data and/or the determined parameter (e.g., SoC and/or SoH) based on, or in response to, applied negative direct current. Optionally, if the cell resistance data and/or the determined parameter based on the applied positive current (e.g., corresponding to a single applied positive square wave, an average of multiple applied positive square waves or cycles, an integral of cell resistance data and/or the determined parameter based on multiple applied positive square waves, or some other function based on applied positive square waves) differs by a predetermined tolerance value or range from the corresponding/respective cell resistance data and/or the determined parameter (determined similarly/identically) based on the applied negative current then a decision or determination is made. Optionally, if the cell resistance data and/or the determined parameter based on the applied negative current (e.g., corresponding to a single applied negative square wave, an average of multiple applied negative square waves or cycles, an integral of cell resistance data and/or the determined parameter based on multiple applied negative square waves, or some other function based on applied negative square waves) differs by a predetermined tolerance value or range from the corresponding/respective cell resistance data and/or the determined parameter (determined similarly/identically) based on the applied positive current then a decision or determination is made. For example, said decision may be to toss or disregard the corresponding cell resistance data or cell parameter (e.g., SoC and/or SoH). For example, a cell parameter (e.g., SoC and/or SoH) may be determined, recorded, or reported only if the corresponding cell resistance data and/or determined parameter based on both applied positive current and applied negative current (e.g., of the same cycle or consecutive application; e.g., wherein one cycle includes one positive current application and one negative current application) are within a predetermined tolerance value or range.

EXAMPLE 9: RESISTANCE ANISOTROPY

Resistance anisotropy and cell parameters determined based on resistance anisotropy may be determined from the combination of cell resistance data based on the applied positive direct current (e.g., first cell resistance data) and cell resistance data based on the applied negative direct current (e.g., second cell resistance data), optionally where the first and second cell resistance data are of the same direct current application cycle or consecutive application of positive and negative direct current (e.g., wherein one cycle includes one positive direct current application step and one direct negative current application step, optionally in any order).

Resistance anisotropy may be useful for characterizing formation of the SEI, which may have internal polarization due to a space charge layer effect, which may be significant in cells having a thin solid electrolyte, such as in layered solid state batteries. Resistance anisotropy may be useful for characterizing aging of the electrochemical cell, such as based on the characterization of the SEI, which may change over the life of the electrochemical cell. The internal polarization effect or the charge transfer effect may arise over the cell's lifetime as the battery or cell is cycled due to the change of contact, aging of material, and newly formed SEI, wherein measuring or determining the anisotropic resistance may be useful to detect these effects and evaluate SOH accordingly. Resistance anisotropy may thus be a factor in determining SOH, of batteries or cells such as Li-metal batteries, solid state batteries, or Li-metal solid-state batteries.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

When a group of substituents is disclosed herein, it is understood that all individual members of that group and all subgroups are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Every device, system, combination of components, and method described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method of interrogating an electrochemical cell comprising:
    applying a positive direct current to the electrochemical cell for a first time period, wherein the positive direct current is characterized by a first magnitude;
    applying a negative direct current to the electrochemical cell for a second time period, wherein the negative direct current is characterized by a second magnitude;
    wherein the first and second time periods have a combined duration of less than 2 seconds;
    wherein the second magnitude is equal to or within 50% of the first magnitude;
    recording cell resistance data of the electrochemical cell during each time period; and
    analyzing the cell resistance data to determine at least one cell parameter selected from the group consisting of:
        (i) state of charge of the electrochemical cell;
        (ii) state of health of the electrochemical cell; and
        (iii) the resistance anisotropy of the cell;
    wherein analyzing the state of health of the battery comprises correlating resistance measured at a first measurement time step to at least one of: SEI (solid electrolyte interphase) resistance, charge transfer resistance, contact resistance, grain boundary resistance of solid electrolyte, bulk resistance of solid electrolyte, interfacial resistance, activation resistance, Ohmic resistance, diffusion resistance, polarization resistance, and any combination of these;
    wherein each of the first measurement time step and the second measurement time step is individually determined by the formula FX3a:

$$f = \tfrac{1}{2} * \pi * t \qquad \text{(FX3a)};$$

wherein t is the first measurement time step or the second measurement time step; and
    wherein f is a frequency determined by an AC impedance spectroscopy corresponding to the respective t; and
    wherein the first measurement time step is equal to or within 20% of the SEI time constant of the electrochemical cell; and wherein the second measurement time step is equal to or within 20% of the charge transfer time constant of the electrochemical cell.

2. The method of claim 1, wherein each of the first magnitude and the second magnitude is less than or equal to C/2 of the electrochemical cell.

3. The method of claim 1, wherein the duration of the first time period is a function of the rate limiting process of the electrochemical cell.

4. The method of claim 1 wherein the second time period has a duration equal to or within 50% of a duration of the first time period.

5. The method of claim 1 wherein the steps of application of the positive and negative direct currents comprises applying a square wave direct current profile.

6. The method of claim 1, wherein the cell resistance data includes cell overpotential data, and wherein the analyzing step comprises dividing overpotential at each datapoint by the applied current, and wherein the overpotential is defined as the difference between the equilibrium potential of the net redox reaction in the cell just prior to the time period and the evolved voltage.

7. The method of claim 1, wherein the steps of applying and the step of recording data collectively occur in 1 second or less.

8. The method of claim 1, wherein the analyzing step comprises:
    determining the state of charge of the electrochemical cell by correlating cell resistance data to state of charge via a predetermined relationship; or
    determining the state of health of the electrochemical cell by correlating resistance anisotropy to state of health via a predetermined relationship.

9. The method of claim 1, wherein the steps of applying the positive current and applying the negative current are performed sequentially in any order.

10. The method of claim 9, wherein the constant positive direct current is applied prior to applying the constant negative direct current.

11. The method of claim 9, wherein the constant negative direct current is applied prior to applying the constant positive direct current.

12. The method of claim 9, comprising resting the electrochemical cell for a third time period between the steps of applying.

13. The method of claim 12, wherein the third time period has a duration that is equal to or within 50% to the duration of the first time period and/or the second time period.

14. The method of claim 12, wherein the duration of the third time period is sufficient to allow the cell to reach a stationary state.

15. The method of claim 12, wherein the third time period is greater than a time constant of the electrochemical cell's response to the negative direct current and/or to the positive direct current.

16. The method of claim 1, wherein analyzing the state of health of the battery further comprises correlating resistance measured at a second measurement time step to a second source of resistance of the electrochemical cell.

17. The method of claim 1 comprising determining an SEI resistance, $R_{SEI}$.

18. The method of claim 17, wherein the SEI resistance, $R_{SEI}$, is determined using formula FX1a:

$$R_{SEI} = \frac{|V_1 - V_0|}{I}; \quad \text{(FX1a)}$$

wherein I is the first magnitude or the second magnitude, $V_0$ is cell voltage immediately prior to application of the respective positive or negative direct current, and $V_1$ is cell voltage in response to the respective applied positive or negative direct current at a first measurement time step being equal to the time constant of the SEI of the electrochemical cell.

19. The method of claim 1 comprising determining a charge transfer resistance, $R_{CT}$.

20. The method of claim 19, wherein the charge transfer resistance, $R_{CT}$, is determined using formula FX2a:

$$R_{CT} = \frac{|V_2 - V_1|}{I}; \quad \text{(FX2a)}$$

and
wherein I is the first magnitude or the second magnitude, $V_1$ is cell voltage in response to the respective applied positive or negative direct current at a first measurement time step being equal to the time constant of the SEI of the electrochemical cell, $V_2$ is cell voltage in response to the respective applied positive or negative direct current at a second measurement time step being equal to the time constant of the charge transfer resistance of the electrochemical cell.

21. The method of claim 1, wherein the step of analyzing comprises determining at least the resistance anisotropy of the cell.

22. The method of claim 1, wherein the cell resistance data comprises a first cell resistance data and a second cell resistance data; and wherein the method further comprises determining the first cell resistance data based on the applied positive direct current and determining the second cell resistance data based on the applied negative direct current.

23. The method of claim 22, wherein the step of analyzing further comprises:
comparing the first cell resistance data to the second cell resistance data; and/or
comparing the first state of charge and/or a first state of health to the second state of charge and/or a second state of health.

24. The method of claim 1, wherein the electrochemical cell is actively charging or discharging while said method is performed.

25. The method of claim 1, wherein the electrochemical cell is part of a moving vehicle or component while said method is performed.

* * * * *